US012062681B2

(12) United States Patent
Kurose et al.

(10) Patent No.: US 12,062,681 B2
(45) Date of Patent: Aug. 13, 2024

(54) SOLID-STATE IMAGING APPARATUS

(71) Applicant: SONY SEMICONDUCTOR SOLUTIONS CORPORATION, Kanagawa (JP)

(72) Inventors: Tomoki Kurose, Kanagawa (JP); Tomoyuki Arai, Kanagawa (JP); Hiromasa Saito, Kanagawa (JP); Shinji Nakagawa, Kanagawa (JP); Junji Hayafuji, Kanagawa (JP); Hirofumi Yamada, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 478 days.

(21) Appl. No.: 17/594,085

(22) PCT Filed: Mar. 30, 2020

(86) PCT No.: PCT/JP2020/014567
§ 371 (c)(1),
(2) Date: Oct. 1, 2021

(87) PCT Pub. No.: WO2020/209126
PCT Pub. Date: Oct. 15, 2020

(65) Prior Publication Data

US 2022/0173150 A1 Jun. 2, 2022

(30) Foreign Application Priority Data

Apr. 12, 2019 (JP) ................................ 2019-076307

(51) Int. Cl.
*H01L 27/146* (2006.01)

(52) U.S. Cl.
CPC .. *H01L 27/14632* (2013.01); *H01L 27/14621* (2013.01); *H01L 27/14627* (2013.01); *H01L 27/14645* (2013.01)

(58) Field of Classification Search
CPC ......... H01L 27/14621; H01L 27/14645; H01L 27/14627; H01L 27/146
See application file for complete search history.

(56) References Cited

U.S. PATENT DOCUMENTS

| | | | | |
|---|---|---|---|---|
| 10,044,918 B2 * | 8/2018 | Masuda | ............... | H04N 25/702 |
| 2014/0071684 A1 * | 3/2014 | Ralli | ...................... | G03B 21/60 359/361 |

(Continued)

FOREIGN PATENT DOCUMENTS

| | | |
|---|---|---|
| CN | 105229790 A | 1/2016 |
| CN | 106463518 A | 2/2017 |

(Continued)

OTHER PUBLICATIONS

International Search Report and Written Opinion of PCT Application No. PCT/JP2020/014567, issued on Jun. 30, 2020, 11 pages of ISRWO.

*Primary Examiner* — Jaehwan Oh
(74) *Attorney, Agent, or Firm* — CHIP LAW GROUP

(57) ABSTRACT

The present technology relates to a solid-state imaging apparatus designed to improve sensitivity while preventing worsening of color mixing. A substrate, a plurality of photoelectric conversion regions provided in the substrate, a color filter provided on the upper side of the photoelectric conversion regions, a trench provided through the substrate and provided between the photoelectric conversion regions, and a recessed region including a plurality of recesses provided on the light-receiving surface side of the substrate above the photoelectric conversion regions are included. The color filter over adjacent two of the photoelectric (Continued)

conversion regions is of the same color. The number of the recesses of the recessed region is larger at a high image height than at an image height center. The present technology can be applied to, for example, a back-illuminated solid-state imaging apparatus etc.

20 Claims, 61 Drawing Sheets

(56) References Cited

U.S. PATENT DOCUMENTS

| | | | | |
|---|---|---|---|---|
| 2015/0236066 | A1* | 8/2015 | Tayanaka | H01L 27/14623 438/69 |
| 2016/0112614 | A1* | 4/2016 | Masuda | H04N 25/70 348/374 |
| 2017/0062770 | A1* | 3/2017 | Jang | H10K 50/868 |
| 2017/0110493 | A1* | 4/2017 | Yokogawa | H01L 31/03762 |
| 2018/0292578 | A1* | 10/2018 | Kageyama | H01L 27/14 |
| 2020/0075661 | A1* | 3/2020 | Cheng | H01L 27/14643 |
| 2020/0219936 | A1* | 7/2020 | Han | G02F 1/133617 |
| 2021/0288192 | A1* | 9/2021 | Yokogawa | H01L 27/14641 |
| 2021/0375971 | A1* | 12/2021 | Tayanaka | H01L 27/14629 |
| 2022/0199668 | A1* | 6/2022 | Ootani | H01L 27/146 |

FOREIGN PATENT DOCUMENTS

| | | | |
|---|---|---|---|
| JP | 2001-250931 | A | 9/2001 |
| JP | 2010-272612 | A | 12/2010 |
| JP | 2011-003860 | A | 1/2011 |
| JP | 2013-033864 | A | 2/2013 |
| JP | 2015-029054 | A | 2/2015 |
| JP | 2015-153975 | A | 8/2015 |
| JP | 2016-001633 | A | 1/2016 |
| JP | 2019-046960 | A | 3/2019 |
| KR | 10-2016-0029735 | A | 3/2016 |
| TW | 201921661 | A | 6/2019 |
| WO | 2015/001987 | A1 | 1/2015 |
| WO | 2015/190318 | A1 | 12/2015 |
| WO | 2019/044213 | A1 | 3/2019 |

* cited by examiner 12
46
41
42
61
48

SOLID-STATE IMAGING APPARATUS

CROSS REFERENCE TO RELATED APPLICATIONS

This application is a U.S. National Phase of International Patent Application No. PCT/JP2020/014567 filed on Mar. 30, 2020, which claims priority benefit of Japanese Patent Application No. JP 2019-076307 filed in the Japan Patent Office on Apr. 12, 2019. Each of the above-referenced applications is hereby incorporated herein by reference in its entirety.

TECHNICAL FIELD

The present technology relates to a solid-state imaging apparatus, and for example, relates to a solid-state imaging apparatus designed to improve sensitivity while preventing worsening of color mixing.

BACKGROUND ART

It has been proposed to provide, as a structure for preventing the reflection of incident light in a solid-state imaging apparatus, a minute recessed-and-protruded structure at an interface on the light-receiving surface side of a silicon layer in which photodiodes are formed (see, for example, Patent Documents 1 and 2).

CITATION LIST

Patent Documents

Patent Document 1: Japanese Patent Application Laid-Open No. 2010-272612

Patent Document 2: Japanese Patent Application Laid-Open No. 2013-33864

SUMMARY OF THE INVENTION

Problems to be Solved by the Invention

However, the minute recessed-and-protruded structure, which can prevent the reflection of incident light to improve sensitivity, increases scattering and increases the amount of light leaking into adjacent pixels, and thus can worsen color mixing.

The present disclosure has been made in view of such circumstances, and is intended to improve sensitivity while preventing worsening of color mixing.

Solutions to Problems

A first solid-state imaging apparatus according to an aspect of the present technology includes a substrate, a plurality of photoelectric conversion regions provided in the substrate, a color filter provided on an upper side of the photoelectric conversion regions, a trench provided through the substrate and provided between the photoelectric conversion regions, and a recessed region including a plurality of recesses provided on a light-receiving surface side of the substrate above the photoelectric conversion regions, in which the color filter over adjacent two of the photoelectric conversion regions is of the same color.

A second solid-state imaging apparatus according to an aspect of the present technology includes a substrate, a plurality of photoelectric conversion regions provided in the substrate, a color filter provided on an upper side of the photoelectric conversion regions, an on-chip lens provided on an upper side of the color filter, a trench provided through the substrate, the trench surrounding four of the photoelectric conversion regions, and a recessed region including a plurality of recesses provided on a light-receiving surface side of the substrate above the photoelectric conversion regions, in which the color filter over the four of the photoelectric conversion regions is of the same color, and the on-chip lens is provided over the four of the photoelectric conversion regions.

A third solid-state imaging apparatus according to an aspect of the present technology includes a substrate, a plurality of photoelectric conversion regions provided in the substrate, a color filter provided on an upper side of the photoelectric conversion regions, an on-chip lens provided on an upper side of the color filter, a trench provided through the substrate, the trench surrounding adjacent two of the photoelectric conversion regions, and a recessed region including a plurality of recesses provided on a light-receiving surface side of the substrate above the photoelectric conversion regions, in which the color filter over the two of the photoelectric conversion regions is of the same color, and the on-chip lens is provided over the two of the photoelectric conversion regions.

A fourth solid-state imaging apparatus according to an aspect of the present technology includes a substrate, a plurality of photoelectric conversion regions provided in the substrate, a color filter provided on an upper side of the photoelectric conversion regions, a trench provided through the substrate and provided between the photoelectric conversion regions, a metal film covering almost a half region of the photoelectric conversion regions on an upper side of the photoelectric conversion regions, and a recessed region including a plurality of recesses provided on a light-receiving surface side of the substrate above the photoelectric conversion regions.

A first solid-state imaging apparatus according to an aspect of the present technology includes a substrate, a plurality of photoelectric conversion regions provided in the substrate, a color filter provided on an upper side of the photoelectric conversion regions, a trench provided through the substrate and provided between the photoelectric conversion regions, and a recessed region including a plurality of recesses provided on a light-receiving surface side of the substrate above the photoelectric conversion regions. In addition, the color filter over adjacent two of the photoelectric conversion regions is of the same color.

A second solid-state imaging apparatus according to an aspect of the present technology includes a substrate, a plurality of photoelectric conversion regions provided in the substrate, a color filter provided on an upper side of the photoelectric conversion regions, an on-chip lens provided on an upper side of the color filter, a trench provided through the substrate, the trench surrounding four of the photoelectric conversion regions, and a recessed region including a plurality of recesses provided on a light-receiving surface side of the substrate above the photoelectric conversion regions. In addition, the color filter over the four of the photoelectric conversion regions is of the same color, and the on-chip lens is provided over the four of the photoelectric conversion regions.

A third solid-state imaging apparatus according to an aspect of the present technology includes a substrate, a plurality of photoelectric conversion regions provided in the substrate, a color filter provided on an upper side of the photoelectric conversion regions, an on-chip lens provided on an upper side of the color filter, a trench provided through the substrate, the trench surrounding adjacent two of the photoelectric conversion regions, and a recessed region including a plurality of recesses provided on a light-receiving surface side of the substrate above the photoelectric conversion regions. In addition, the color filter over the two of the photoelectric conversion regions is of the same color, and the on-chip lens is provided over the two of the photoelectric conversion regions.

A fourth solid-state imaging apparatus according to an aspect of the present technology includes a substrate, a plurality of photoelectric conversion regions provided in the substrate, a color filter provided on an upper side of the photoelectric conversion regions, a trench provided through the substrate and provided between the photoelectric conversion regions, a metal film covering almost a half region of the photoelectric conversion regions on an upper side of the photoelectric conversion regions, and a recessed region including a plurality of recesses provided on a light-receiving surface side of the substrate above the photoelectric conversion regions.

MODE FOR CARRYING OUT THE INVENTION

Hereinafter, a mode for carrying out the present technology (hereinafter referred to as an embodiment) will be described.

<Schematic Configuration Example of Solid-State Imaging Apparatus>

Figure 1:
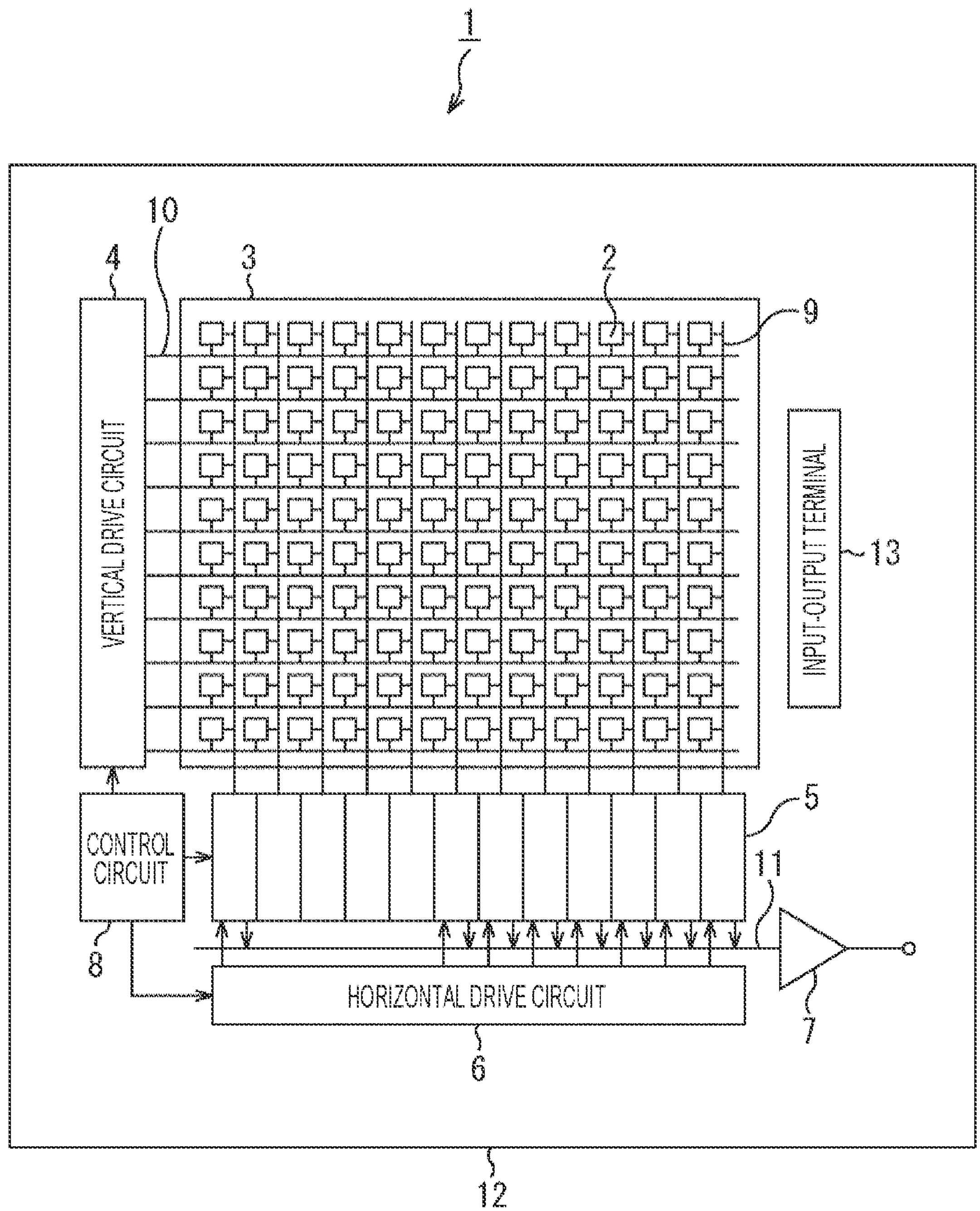
FIG. 1 is a diagram illustrating a schematic configuration of a solid-state imaging apparatus according to the present disclosure.

FIG. 1 illustrates a schematic configuration of a solid-state imaging apparatus according to the present disclosure.

A solid-state imaging apparatus 1 in FIG. 1 includes a pixel array 3 with pixels 2 arranged in a two-dimensional array and peripheral circuitry around it in a semiconductor substrate 12 using, for example, silicon (Si) as a semiconductor. The peripheral circuitry includes a vertical drive circuit 4, column signal processing circuits 5, a horizontal drive circuit 6, an output circuit 7, a control circuit 8, etc.

The pixels 2 each include a photodiode as a photoelectric conversion element and a plurality of pixel transistors. The plurality of pixel transistors includes, for example, four MOS transistors, a transfer transistor, a select transistor, a reset transistor, and an amplification transistor.

Alternatively, the pixels 2 may have a sharing pixel structure. This pixel sharing structure includes a plurality of photodiodes, a plurality of transfer transistors, a shared floating diffusion (floating diffusion region), and other individually shared pixel transistors. That is, in sharing pixels, photodiodes and transfer transistors constituting a plurality of unit pixels share other individual pixel transistors.

The control circuit 8 receives an input clock and data instructing an operation mode etc., and outputs data such as internal information of the solid-state imaging apparatus 1. Specifically, on the basis of a vertical synchronization signal, a horizontal synchronization signal, and a master clock, the control circuit 8 generates a clock signal and a control signal on the basis of which the vertical drive circuit 4, the column signal processing circuits 5, the horizontal drive circuit 6, etc. operate. Then, the control circuit 8 outputs the generated clock signal and control signal to the vertical drive circuit 4, the column signal processing circuits 5, the horizontal drive circuit 6, etc.

The vertical drive circuit 4 is formed by, for example, a shift register, and selects a pixel drive wire 10, provides a pulse for driving the pixels 2 to the selected pixel drive wire 10, and drives the pixels 2 row by row. That is, the vertical drive circuit 4 selectively scans the pixels 2 of the pixel array 3 in the vertical direction sequentially row by row, and provides pixel signals based on signal charges generated in photoelectric conversion parts of the pixels 2 depending on the amount of received light, through vertical signal lines 9 to the column signal processing circuits 5.

The column signal processing circuits 5 are disposed for the corresponding columns of the pixels 2, and perform signal processing such as noise removal on signals output from the pixels 2 in one row for the corresponding pixel columns. For example, the column signal processing circuits 5 perform signal processing such as correlated double sampling (CDS) for removing fixed pattern noise peculiar to the pixels and AD conversion.

The horizontal drive circuit 6 is formed by, for example, a shift register, selects each of the column signal processing circuits 5 in order by sequentially outputting a horizontal scanning pulse, and causes each of the column signal processing circuits 5 to output a pixel signal to a horizontal signal line 11.

The output circuit 7 performs signal processing on a signal successively provided from each of the column signal processing circuits 5 through the horizontal signal line 11, for output.

For example, the output circuit 7 may perform only buffering, or may perform black level adjustment, column variation correction, various types of digital signal processing, etc. An input-output terminal 13 exchanges signals with the outside.

The solid-state imaging apparatus 1 formed as described above is a CMOS image sensor called a column AD system in which the column signal processing circuits 5 that perform CDS processing and AD conversion processing are disposed for the corresponding pixel columns.

Furthermore, the solid-state imaging apparatus 1 is a back-illuminated MOS solid-state imaging apparatus in which light enters from the back side opposite to the front side of the semiconductor substrate 12 on which the pixel transistors are formed.

First Embodiment

Figure 2:
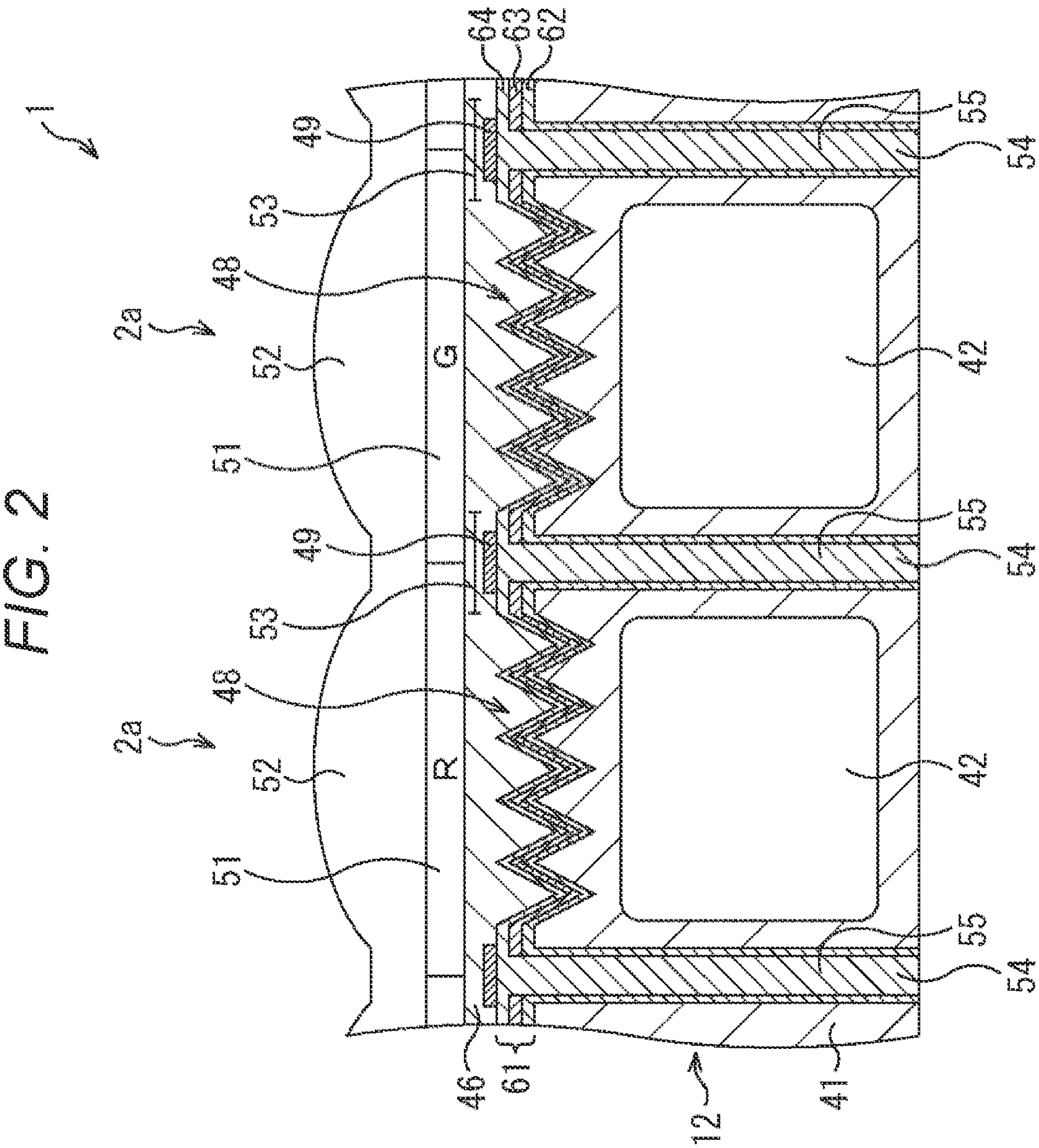
FIG. 2 is a diagram illustrating a cross-sectional configuration example of pixels according to a first embodiment.

FIG. 2 is a diagram illustrating a cross-sectional configuration example of pixels 2*a* according to a first embodiment.

The solid-state imaging apparatus 1 includes the semiconductor substrate 12 and a multilayer wiring layer and a support substrate (both not illustrated) formed on the front side thereof.

The semiconductor substrate 12 includes, for example, silicon (Si) and has a thickness of, for example, 1 to 6 μm. In the semiconductor substrate 12, for example, an N-type (second conductivity type) semiconductor region 42 is formed in a P-type (first conductivity type) semiconductor region 41 in each pixel 2*a*, to form a photodiode PD in each pixel. The P-type semiconductor region 41 provided in both the front and back surfaces of the semiconductor substrate 12 also serves as a hole and charge accumulation region for reducing dark current.

As illustrated in FIG. 2, the solid-state imaging apparatus 1 includes an antireflection film 61, a transparent insulating film 46, color filter layers 51, and on-chip lenses 52 stacked on the semiconductor substrate 12 in which the N-type semiconductor region 42 constituting the photodiode PD is formed in each pixel 2*a*.

At an interface of the P-type semiconductor region 41 (light-receiving-surface-side interface) on the upper side of the N-type semiconductor regions 42 serving as charge accumulation regions, the antireflection film 61 is formed which prevents the reflection of incident light by recessed regions 48 formed with a fine recessed-and-protruded structure.

The antireflection film 61 has, for example, a laminated structure with a fixed charge film and an oxide film stacked in layers. For example, high-dielectric constant (high-k) insulating thin films produced by an atomic layer deposition (ALD) method may be used. Specifically, hafnium oxide (HfO2), aluminum oxide (Al2O3), titanium oxide (TiO2), strontium titanium oxide (STO), etc. may be used. In the example of FIG. 2, the antireflection film 61 includes a hafnium oxide film 62, an aluminum oxide film 63, and a silicon oxide film 64 stacked in layers.

Furthermore, a light-shielding film 49 is stacked on the antireflection film 61 to be formed between the pixels 2*a*. As the light-shielding film 49, a single-layer metal film of titanium (Ti), titanium nitride (TiN), tungsten (W), aluminum (Al), tungsten nitride (WN), or the like is used. Alternatively, a laminated film of these metals (for example, a laminated film of titanium and tungsten, a laminated film of titanium nitride and tungsten, or the like) may be used as the light-shielding film 49.

The transparent insulating film 46 is formed on the entire back-side (light-incidence-plane-side) surface of the P-type semiconductor region 41. The transparent insulating film 46 is of a material that transmits light and has insulation properties, and has a refractive index n1 smaller than the refractive index n2 of the semiconductor regions 41 and 42 ($n1<n2$). As the material of the transparent insulating film 46, silicon oxide (SiO2), silicon nitride (SiN), silicon oxynitride (SiON), hafnium oxide (HfO2), aluminum oxide (Al2O3), zirconium oxide (ZrO2), tantalum oxide (Ta2O5), titanium oxide (TiO2), lanthanum oxide (La2O3), praseodymium oxide (Pr2O3), cerium oxide (CeO2), neodymium oxide (Nd2O3), promethium oxide (Pm2O3), samarium oxide (Sm2O3), europium oxide (Eu2O3), gadolinium oxide (Gd2O3), terbium oxide (Tb2O3), dysprosium oxide (Dy2O3), holmium oxide (Ho2O3), thulium oxide (Tm2O3), ytterbium oxide (Yb2O3), lutetium oxide (Lu2O3), yttrium oxide (Y2O3), a resin, etc. may be used alone or in combination.

The color filter layers 51 are formed on the upper side of the transparent insulating film 46 including the light-shielding film 49. A red, green, or blue color filter layer 51 is formed in each pixel. The color filter layers 51 are formed by spin-coating photosensitive resin containing coloring matter such as pigment or dye. Red, green, and blue colors are arranged on the basis of, for example, a Bayer array, but may be arranged by another arrangement method. In the example of FIG. 2, a green (G) color filter layer 51 is formed in the pixel 2*a* on the right side, and a red (R) color filter layer 51 is formed in the pixel 2*a* on the left side.

On the upper side of the color filter layers 51, on-chip lenses 52 are formed for the corresponding pixels 2*a*. The on-chip lenses 52 include, for example, a resin material such as a styrene resin, an acrylic resin, a styrene-acryl copolymer resin, or a siloxane resin. Incident light is concentrated by the on-chip lenses 52. The concentrated light efficiently enters the photodiodes PD through the color filter layers 51.

For the pixels 2*a* illustrated in FIG. 2, inter-pixel separation portions 54 that separate the pixels 2*a* from each other are formed in the semiconductor substrate 12. Each inter-pixel separation portion 54 is formed by forming a trench through the semiconductor substrate 12 between the N-type semiconductor regions 42 constituting the photodiodes PD, forming the aluminum oxide film 63 on the inner surface of the trench, and further filling the trench with an insulator 55 when the silicon oxide film 64 is formed.

Note that a portion of the inter-pixel separation portion 54 filled with the silicon oxide film 64 may be filled with polysilicon. FIG. 2 illustrates a case where the silicon oxide film 64 is formed integrally with the insulator 55.

By the formation of this inter-pixel separation portion 54, the adjacent pixels 2*a* are completely electrically separated from each other by the insulator 55 filling the trench. This can prevent charge generated inside the semiconductor substrate 12 from leaking to the adjacent pixels 2*a*.

Furthermore, in the pixels 2*a* in the first embodiment, a flat portion 53 is provided by providing a region of a predetermined width in which no recessed region 48 is formed between the pixels 2*a* at the light-receiving-surface-side interface of the semiconductor substrate 12. Each recessed region 48 is provided by forming a fine recessed structure. The structure is not formed in the region between the pixels 2*a*, leaving a flat surface. Thus, the flat portion 53 is provided. This pixel structure provided with the flat portion 53 can reduce the occurrence of diffracted light in the region of the predetermined width (pixel separation region) in the vicinity of another adjacent pixel 2*a*, to prevent the occurrence of color mixing.

Specifically, it is known that in a case where the recessed regions 48 are formed in the semiconductor substrate 12, diffraction of vertical incident light occurs, and, for example, as the intervals (pitch) of recesses increase, diffracted light components increase, resulting in an increased proportion of light entering other adjacent pixels 2.

Against this, in the solid-state imaging apparatus 1, the flat portion 53 is provided in the region of the predetermined width between the pixels 2*a* where diffracted light is likely to leak to another adjacent pixel 2*a*. At the flat portion 53, the diffraction of vertical incident light does not occur, and thus the occurrence of color mixing can be prevented.

Each pixel 2*a* in the pixel array 3 of the solid-state imaging apparatus 1 is configured as described above.

Here, the recessed regions 48 will be additionally described with reference to FIGS. 3A, 3B, and 3C. The recessed regions 48 are each a region where fine recesses and protrusions are formed. The recesses and protrusions vary depending on where a plane used as a reference (hereinafter described as a reference plane) is set.

Furthermore, each recessed region 48 is a region having a fine recessed-and-protruded structure formed at the interface (light-receiving-surface-side interface) of the P-type semiconductor region 41 on the upper side of the N-type semiconductor region 42 serving as the charge accumulation region. The recessed-and-protruded structure is formed on the light-receiving-surface side of the semiconductor region 42, in other words, the semiconductor substrate 12. Thus, the reference plane can be a predetermined plane of the semiconductor substrate 12. Here, the description will be continued with a case where a part of the semiconductor substrate 12 is set as the reference plane as an example.

Figures 3A, 3B, 3C:
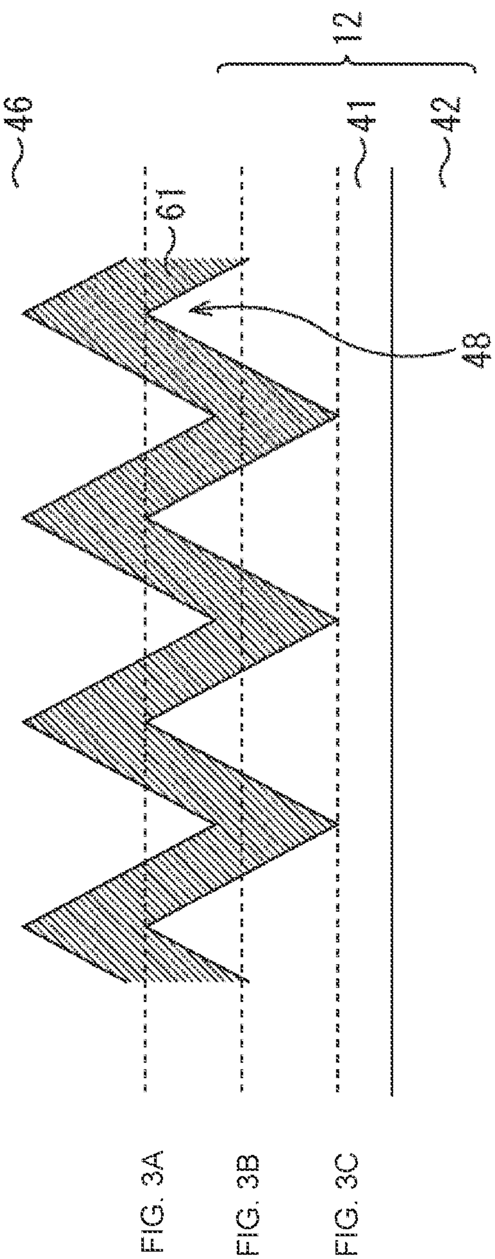
FIGS. 3A, 3B, and 3C are diagrams for explaining a recessed region.

The recessed region 48 illustrated in FIGS. 3A, 3B, and 3C are formed in a triangular shape in a cross-sectional view. Since the recessed region 48 illustrated in FIGS. 3A, 3B, and 3C are formed in the triangular shape in the cross-sectional view, as an example of the reference plane, a plane connecting the vertexes is set as the reference plane.

In the cross-sectional view, a plane including a line connecting, of the vertexes of the triangular shape of the recessed region 48, the vertexes located on the transparent insulating film 46 side is set as a reference plane A. A plane including a line connecting, of the vertexes of the triangular shape of the recessed region 48, the vertexes on the base side, in other words, the vertexes located on the semiconductor region 42 side is set as a reference plane C. A reference plane B is a plane located between the reference plane A and the reference plane C.

When the reference plane A is set as a reference, the shape of the recessed region 48 is a shape having triangular (valley-shaped) recesses facing downward with respect to the reference plane A. That is, when the reference plane A is set as a reference, valley regions are located below the reference plane A, and the valley regions correspond to the recesses. Thus, the recessed region 48 is a region where fine recesses are formed. In other words, when the reference plane A is set as a reference, the recessed region 48 can be said to be a region where a recess is formed between the vertex of a triangle and the vertex of an adjacent triangle, and fine recesses are formed.

When the reference plane C is set as a reference, the shape of the recessed region 48 is a shape having triangular (peak-shaped) protrusions facing upward with respect to the reference plane C. That is, when the reference plane C is set as a reference, regions forming peaks are located above the reference plane C, and the regions forming the peaks correspond to the protrusions. Thus, the recessed region 48 is a region where fine protrusions are formed. In other words, when the reference plane C is set as a reference, the recessed region 48 can be said to be a region where a protrusion is formed between the vertexes at the base of a triangular shape, and fine tops are formed.

When the reference plane B is set as a reference, the shape of the recessed region 48 is a shape having recesses and protrusions (valleys and peaks) with respect to the reference plane B. That is, in a case where the reference plane B is set as a reference, there are recesses forming valleys below the reference plane B, and protrusions forming peaks above, and thus it can be said to be a region including fine recesses and protrusions.

Thus, the recessed region 48, whose shape is even a zigzag shape with peaks and valleys as illustrated in FIGS. 3A, 3B, and 3C, can be defined as a region that can be expressed as a region formed with fine recesses, a region formed with fine protrusions, or a region formed with fine recesses and protrusions, depending on where the reference plane is set in the cross-sectional view of the pixel 2.

Furthermore, in a case where the reference plane is set as, for example, an interface between the transparent insulating film 46 and the color filter layer 51, the recessed region 48 illustrated in FIGS. 3A, 3B, and 3C are of a shape having depressed regions (valleys), and thus the recessed region 48 can be said to be a region formed with fine recesses.

Furthermore, in a case where the reference plane is set as a boundary plane between the P-type semiconductor region 41 and the N-type semiconductor region 42, the recessed region 48 is of a shape having protruding regions (peaks), and thus can be said to be a region formed with fine protrusions.

Thus, in the cross-sectional view of each pixel 2, with a predetermined flat plane as the reference plane, the shape of the recessed region 48 can also be expressed, depending on whether it is formed in a valley shape or in a peak shape with respect to the reference plane.

Furthermore, in a case where the flat portion 53 is formed between the pixels 2, the flat portion 53 is a region provided by providing the region of the predetermined width where no recessed region 48 is formed between the pixels 2 at the light-receiving-surface-side interface of the semiconductor substrate 12. A plane including the flat portion 53 may be set as the reference plane.

Referring to FIG. 2, in a case where the plane including the flat portion 53 is set as the reference plane, the recessed regions 48 can be said to have a shape having portions depressed below the reference plane, in other words, having valley-shaped portions, and thus can be said to be regions where fine recesses are formed.

Thus, each recessed region 48 is a region that can be expressed as a region formed with fine recesses, a region formed with fine protrusions, or a region formed with fine recesses and protrusions, depending on where the reference plane is set in the cross-sectional view of the pixel 2.

In the following description, the description will be continued assuming that each recessed region 48 is a region formed with fine recesses, which is, as described above, an expression including a region such as a region formed with fine protrusions or a region formed with fine recesses and protrusions.

Second Embodiment

Figure 4:
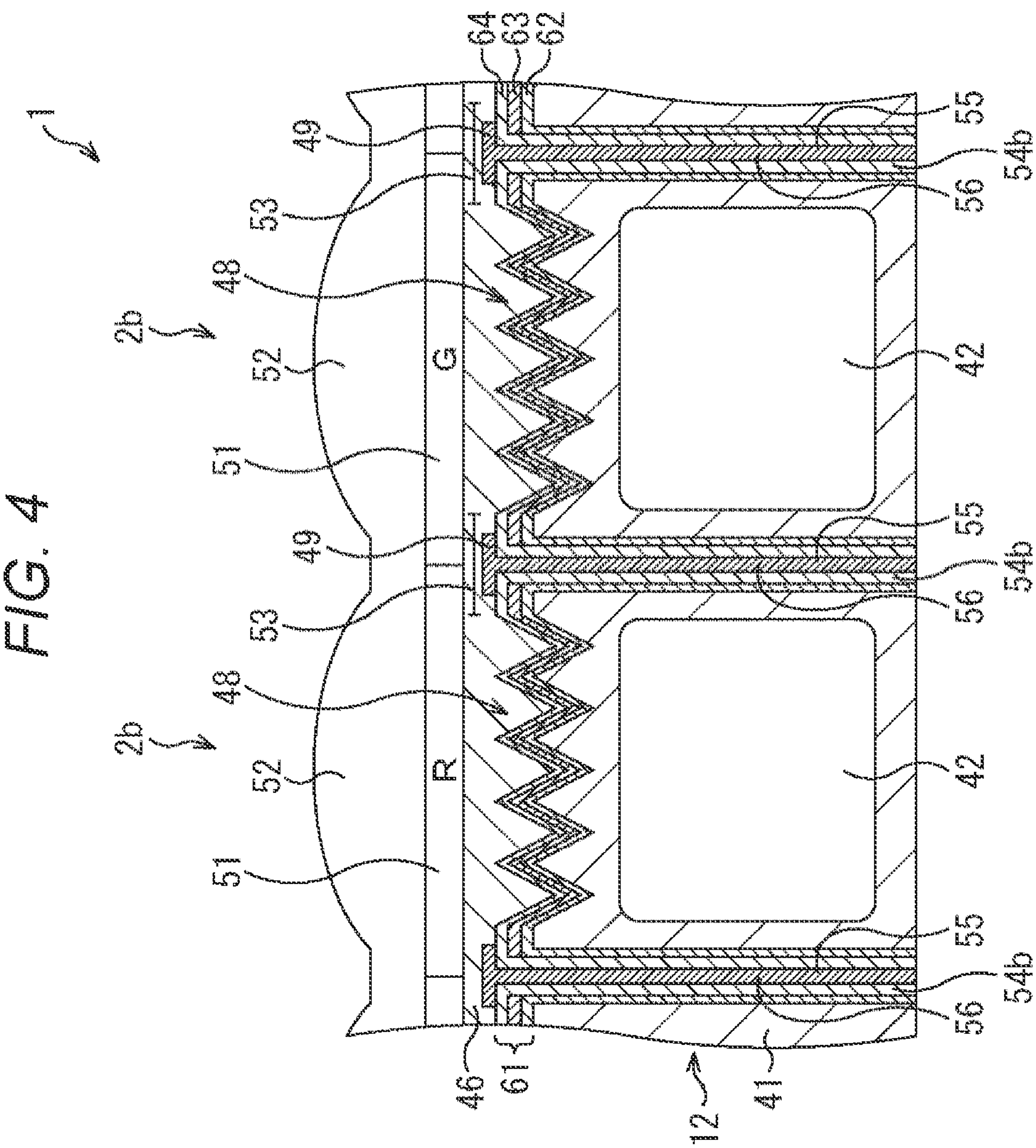
FIG. 4 is a diagram illustrating a cross-sectional configuration example of pixels according to a second embodiment.

FIG. 4 is a diagram illustrating a cross-sectional configuration example of pixels 2*b* according to a second embodiment.

In FIG. 4, the basic configuration of the solid-state imaging apparatus 1 is the same as the configuration illustrated in FIG. 2. In the pixels 2*b* according to the second embodiment, inter-pixel separation portions 54*b* that completely separate the pixels 2*b* from each other are formed in the semiconductor substrate 12.

Each inter-pixel separation portion 54*b* is formed by digging a trench through the semiconductor substrate 12 between the N-type semiconductor regions 42 constituting photodiodes PD, filling the trench with the insulator 55 (in FIG. 4, the silicon oxide film 64) on the inner surface of the trench, and further filling the inside of the insulator 55 with a light-shielding object 56 when the light-shielding film 49 is formed. The light-shielding object 56 is formed integrally with the light-shielding film 49 using metal having light-shielding properties.

By the formation of this inter-pixel separation portion 54*b*, the adjacent pixels 2*b* are electrically separated from each other by the insulator 55 filling the trench and optically separated from each other by the light-shielding object 56. This can prevent charge generated inside the semiconductor substrate 12 from leaking to the adjacent pixel 2*b*, and can prevent light from an oblique direction from leaking to the adjacent pixel 2*b*.

Then, the pixels 2*b* according to the second embodiment also have a pixel structure in which the flat portion 53 is provided, to be able to reduce the occurrence of diffracted light in the pixel separation region to prevent the occurrence of color mixing.

Third Embodiment

Figure 5:
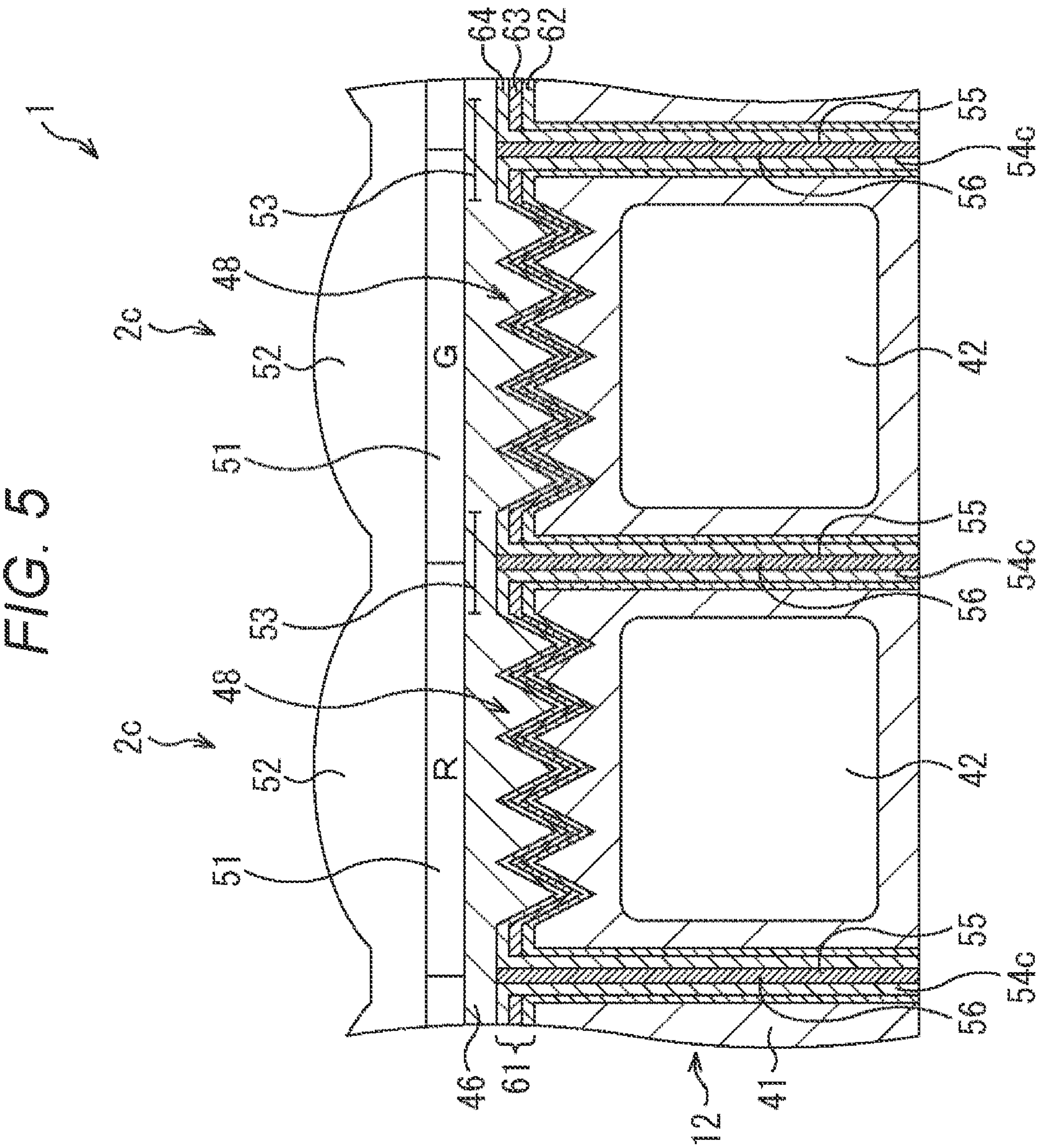
FIG. 5 is a diagram illustrating a cross-sectional configuration example of pixels according to a third embodiment.

FIG. 5 is a diagram illustrating a cross-sectional configuration example of pixels 2*c* according to a third embodiment.

In FIG. 5, the basic configuration of the solid-state imaging apparatus 1 is the same as the configuration illustrated in FIG. 2. In the pixels 2*c* according to the third embodiment, inter-pixel separation portions 54*c* that completely separate the pixels 2*c* from each other are formed in the semiconductor substrate 12.

At each inter-pixel separation portion 54*c* between the pixels 2*c* according to the third embodiment, no light-shielding film 49 is provided at the flat portion 53, which is a difference from the pixels 2*b* according to the second embodiment.

By the formation of this inter-pixel separation portion 54*c*, the adjacent pixels 2*c* are electrically separated from each other by the insulator 55 filling the trench and optically separated from each other by the light-shielding object 56. This can prevent charge generated inside the semiconductor substrate 12 from leaking to the adjacent pixel 2*c*, and can prevent light from an oblique direction from leaking to the adjacent pixel 2*c*.

Then, the pixels 2*c* according to the third embodiment also have a pixel structure in which the flat portion 53 is provided, to be able to reduce the occurrence of diffracted light in the pixel separation region to prevent the occurrence of color mixing.

<Effects of Providing Recessed Region>

Figure 6B:
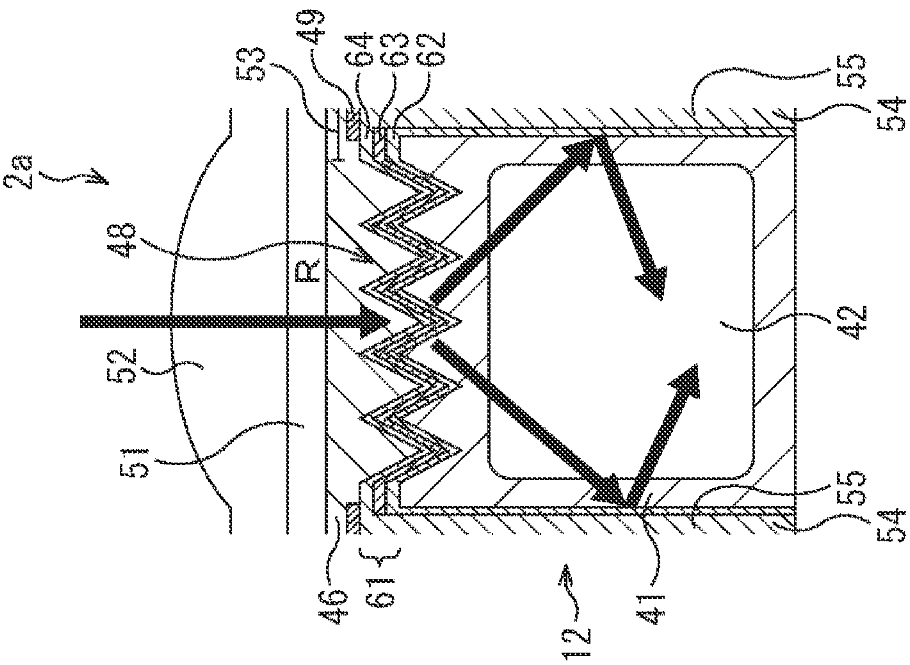
FIGS. 6A and 6B are diagrams illustrating the effects of a pixel structure of the present disclosure.
Figure 6A:
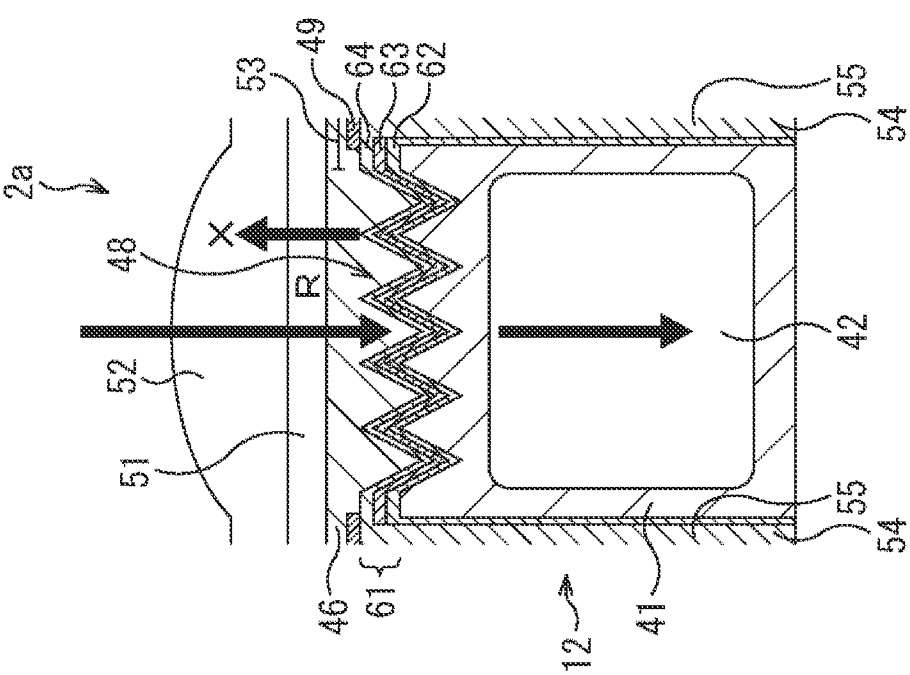

Effects in the pixels 2 having the recessed regions 48 in the pixels 2 will be described with reference to FIGS. 6A and 6B. FIGS. 6A and 6B are diagrams illustrating the effects of the pixel structure of the pixel 2*a* illustrated in FIG. 2.

FIG. 6A is a diagram illustrating the effects of the antireflection film 61 having the recessed region 48. Since the antireflection film 61 has the recessed-and-protruded structure, the reflection of incident light is prevented. Consequently, the sensitivity of the solid-state imaging apparatus 1 can be improved.

FIG. 6B is a diagram illustrating the effects of the inter-pixel separation portions 54 of the trench structure. Without the provision of the inter-pixel separation portions 54, there have been cases where incident light scattered by the antireflection film 61 passes through the photoelectric conversion region (semiconductor regions 41 and 42). The inter-pixel separation portions 54 have the effect of reflecting incident light scattered by the antireflection film 61 to confine the incident light within the photoelectric conversion region. Consequently, the optical distance for silicon absorption can be extended, improving sensitivity.

Letting the refractive index of the inter-pixel separation portions 54 be n1=1.5 (corresponding to that of SiO2) and the refractive index of the semiconductor region 41 forming the photoelectric conversion region be n2=4.0, the refractive index difference (n1<n2) produces a waveguide effect (the photoelectric conversion region: a core, the inter-pixel separation portions 54: a clad), and thus incident light is confined within the photoelectric conversion region. The recessed region 48, which has a disadvantage of worsening color mixing by light scattering, can be combined with the inter-pixel separation portions 54 to cancel the worsening of color mixing, and further increases the angle of incidence traveling through the photoelectric conversion region, thereby creating an advantage of improving photoelectric conversion efficiency.

In addition, since the optical distance for silicon absorption can be extended, the structure can increase the optical path length, allowing even incident light with a long wavelength to be efficiently concentrated into the photodiode PD, and allowing improved sensitivity even to incident light with a long wavelength. The increased optical path length thus allows improved sensitivity even to infrared light (IR) with a long wavelength without increasing the thickness of the pixel 2, in other words, the thickness of the semiconductor substrate 12.

Fourth Embodiment

Figure 7:
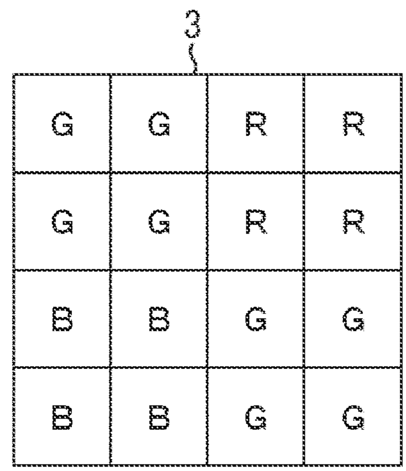
FIG. 7 is a diagram for explaining a pixel arrangement of a pixel array in a fourth embodiment.

The pixels 2*a* to 2*c* in the first to third embodiments can be applied as pixels arranged in the pixel array 3 having a pixel arrangement as illustrated in FIG. 7.

FIG. 7 is a diagram illustrating an example of a pixel arrangement of the pixel array 3. FIG. 7 illustrates sixteen pixels of 4×4 in the pixel array 3. In the array illustrated in FIG. 7, color filters of three colors, red (R), green (G), and blue (B), are arranged in units of 2×2 pixels. One on-chip lens 52 is formed for each pixel.

In the array illustrated in FIG. 7, the color filters of 4×4 pixels are set as a basic unit, in which a G filter of 2×2 pixels is placed at the upper left, a B filter of 2×2 pixels at the lower left, an R filter of 2×2 pixels at the upper right, and a G filter of 2×2 pixels at the lower right.

Figure 8:
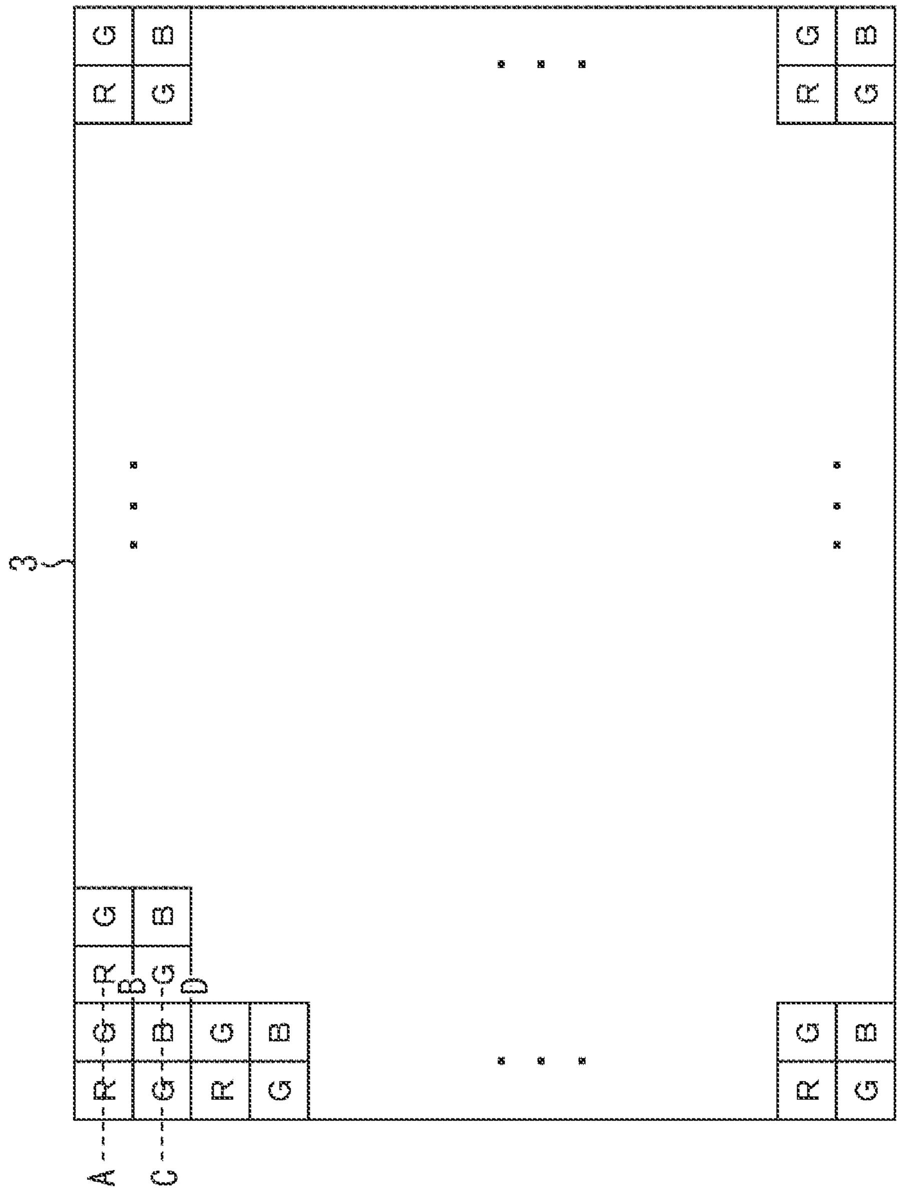
FIG. 8 is a diagram for explaining a pixel arrangement of the pixel array.

In the pixel array 3, as illustrated in FIG. 8, pixels are arranged in both a vertical direction and a horizontal direction with color filters of 4×4 pixels as a basic unit. In FIG. 8, one quadrangle represents 2×2 pixels placed at a color filter of the same color.

Any of the pixels 2*a* to 2*c* according to the first to third embodiments can be applied to all the pixels arranged in the pixel array 3 in which the pixels are arranged as above, to make them pixels in which the recessed regions 48 are formed. Here, a case where the pixels 2*a* in the first embodiment are applied to pixels 2*d* in a fourth embodiment will be described as an example.

Figure 9:
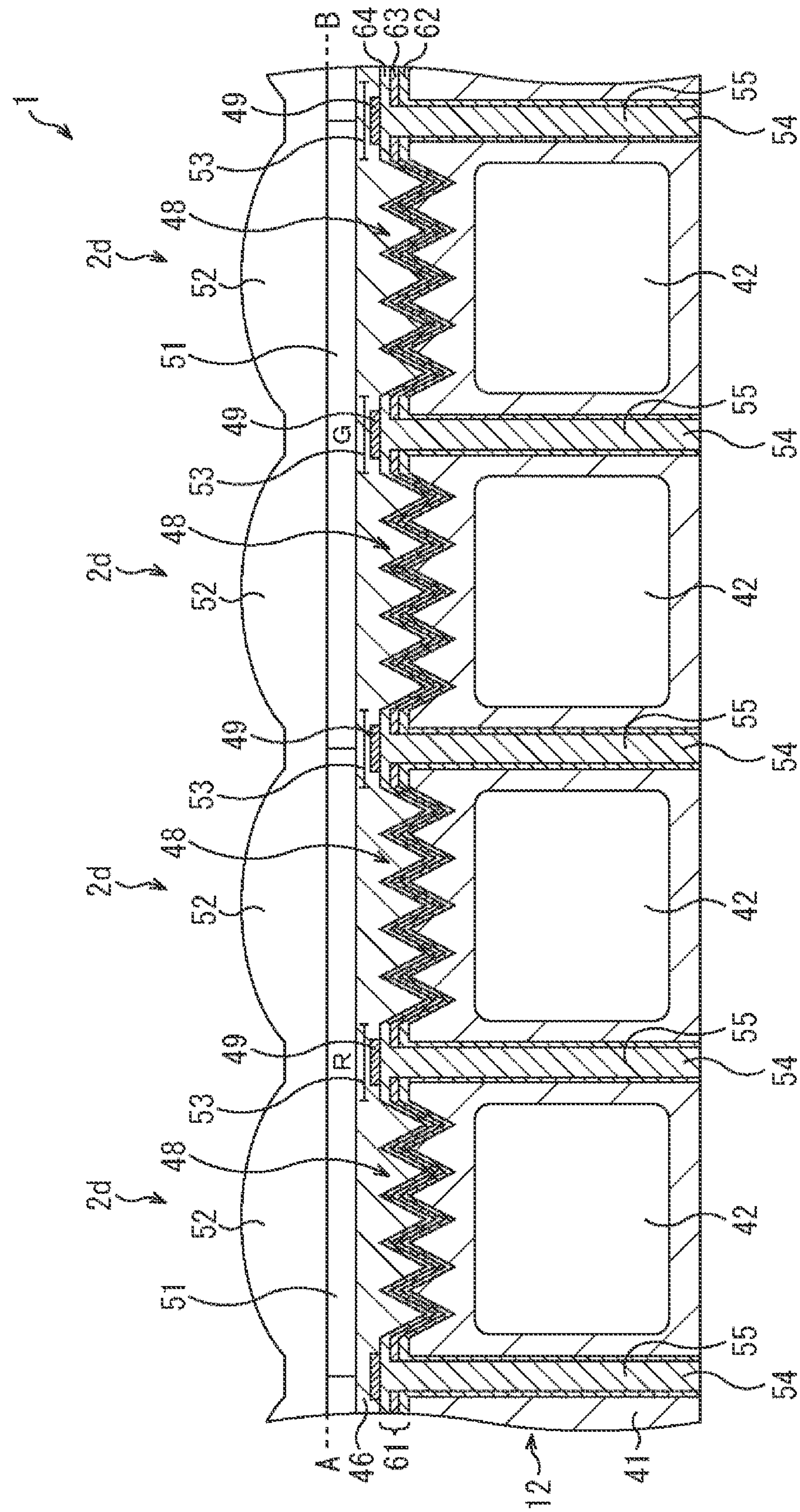
FIG. 9 is a diagram illustrating a cross-sectional configuration example of pixels according to the fourth embodiment.
Figure 10:
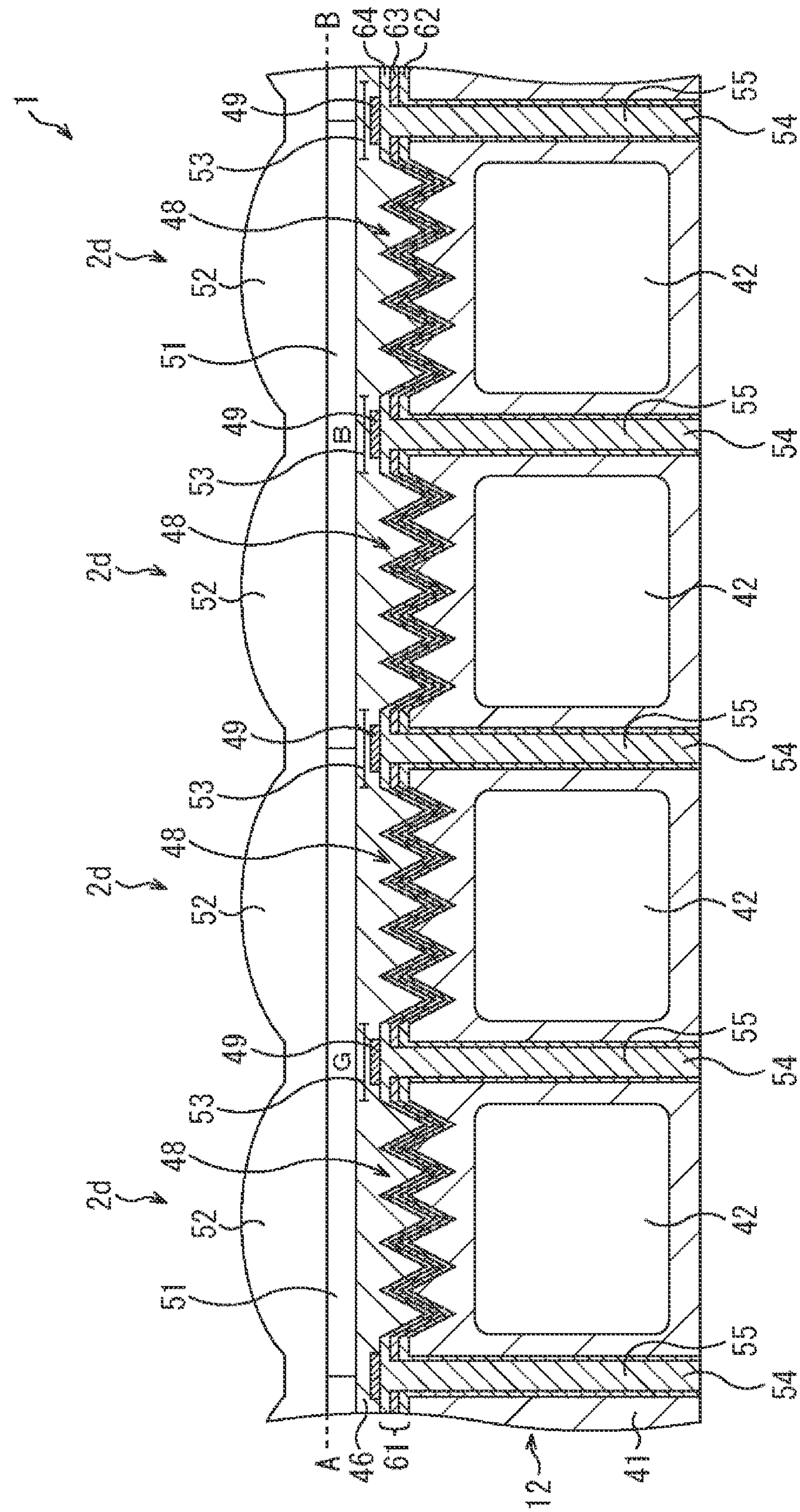
FIG. 10 is a diagram illustrating another cross-sectional configuration example of pixels according to the fourth embodiment.

FIG. 9 is a cross-sectional view taken along line A-B in the pixel array 3 illustrated in FIG. 8, and FIG. 10 is a cross-sectional view taken along line C-D.

As illustrated in FIG. 9, in the cross-sectional view taken along line A-B, a color filter on the left side in the figure in the color filter layer 51 is red (R), and a color filter on the right side in the figure is green (G). Two pixels 2*d* are placed at the red color filter. Likewise, two pixels 2*d* are placed at the green color filter.

The configuration of the pixels 2*d* illustrated in FIG. 9 has the same structure as that of the pixels 2*a* in the first embodiment illustrated in FIG. 2 except that a color filter over two pixels is of the same color.

As illustrated in FIG. 10, in the cross-sectional view taken along line C-D, a color filter on the left side in the figure in the color filter layer 51 is green (G), and a color filter on the right side in the figure is blue (B). Two pixels 2*d* are placed at the green color filter. Likewise, two pixels 2*d* are placed at the blue color filter.

The configuration of the pixels 2*d* illustrated in FIG. 10 has the same structure as that of the pixels 2*a* in the first embodiment illustrated in FIG. 2 except that a color filter over two pixels is of the same color.

As above, the pixels 2*d* provided with the recessed regions 48 can be applied to the configuration in which a color filter of the same color is placed at four pixels of 2×2. The arrangement of the pixels 2*d* provided with the recessed regions 48 in the pixel array 3 can improve sensitivity.

Fifth Embodiment

In the fourth embodiment, the case where the recessed region 48 is provided in each pixel arranged in the pixel array 3 has been described as an example. As a fifth embodiment, a case where the recessed regions 48 are provided to reduce the influence of vignetting will be described.

Reference is again made to FIGS. 9 and 10. For example, as illustrated in FIG. 9, a pixel adjacent to an R pixel is a G pixel. Furthermore, as illustrated in FIG. 10, a pixel adjacent to a B pixel is a G pixel. Vignetting caused by a G pixel (vignetting caused by a green color filter (G filter)) can occur in an R pixel or a B pixel adjacent to the G pixel. Further, there is a sensitivity difference between a G pixel and an R pixel, and a G pixel generally tends to have a higher sensitivity than an R pixel. Likewise, there is a sensitivity difference between a G pixel and a B pixel, and a G pixel generally tends to have a higher sensitivity than a B pixel.

Furthermore, the influence of vignetting caused by a G filter is strong on the high image height side and weak in the central portion. That is, the influence of vignetting varies depending on the image height. In order to absorb such a difference in influence, the shape of the recessed regions 48 is varied depending on the image height. Specifically, the number of peaks or valleys of the recessed regions 48 is varied depending on the image height.

The provision of the recessed regions 48 can improve photoelectric conversion capability. The adjustment of the number of recesses and protrusions of the recessed regions 48 allows adjustment of sensitivity. Here, in a case where portions of each recessed region 48 located far from the color filter layer 51 are described as valley portions, sensitivity can be adjusted by the number of valley portions. It is considered that a large number of valley portions facilitate scattering, improving sensitivity. Thus, by varying the number of valleys of the recessed regions 48, the difference in sensitivity depending on the image height is absorbed to reduce the influence of vignetting.

Figure 11:
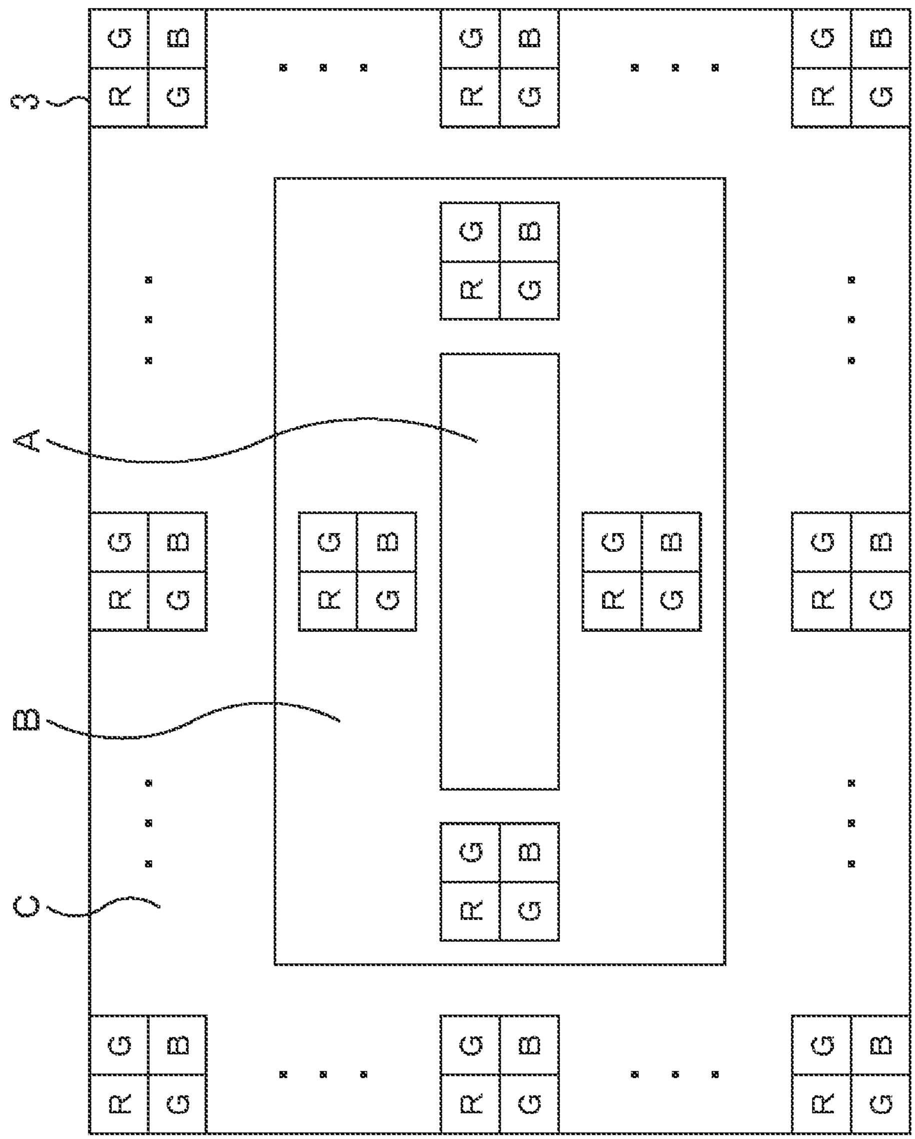
FIG. 11 is a diagram for explaining the image height of the pixel array.

As illustrated in FIG. 11, the pixel array 3 is divided into three regions. A region A is the image height center of the pixel array 3. A region C is a high-image-height region of the pixel array 3. A region B is a region between the region A and the region C and is a medium-image-height region.

Figure 12:
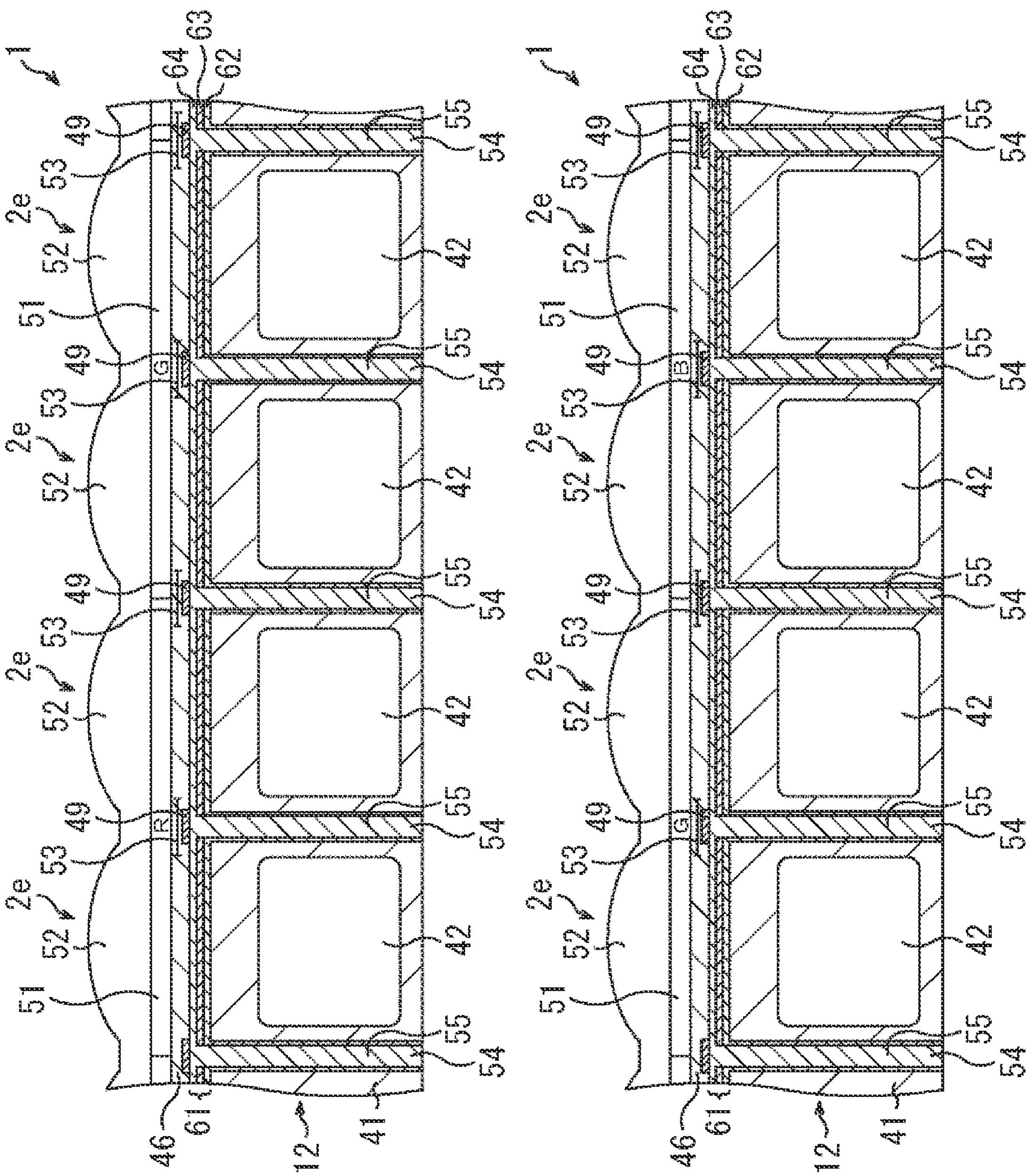
FIG. 12 is a diagram illustrating another cross-sectional configuration example of pixels according to a fifth embodiment.

FIG. 12 is a cross-sectional view of pixels 2*e* placed in the region A. As illustrated in FIG. 12, no recessed regions 48 are formed in the pixels 2*e* placed in the region A.

Figure 13:
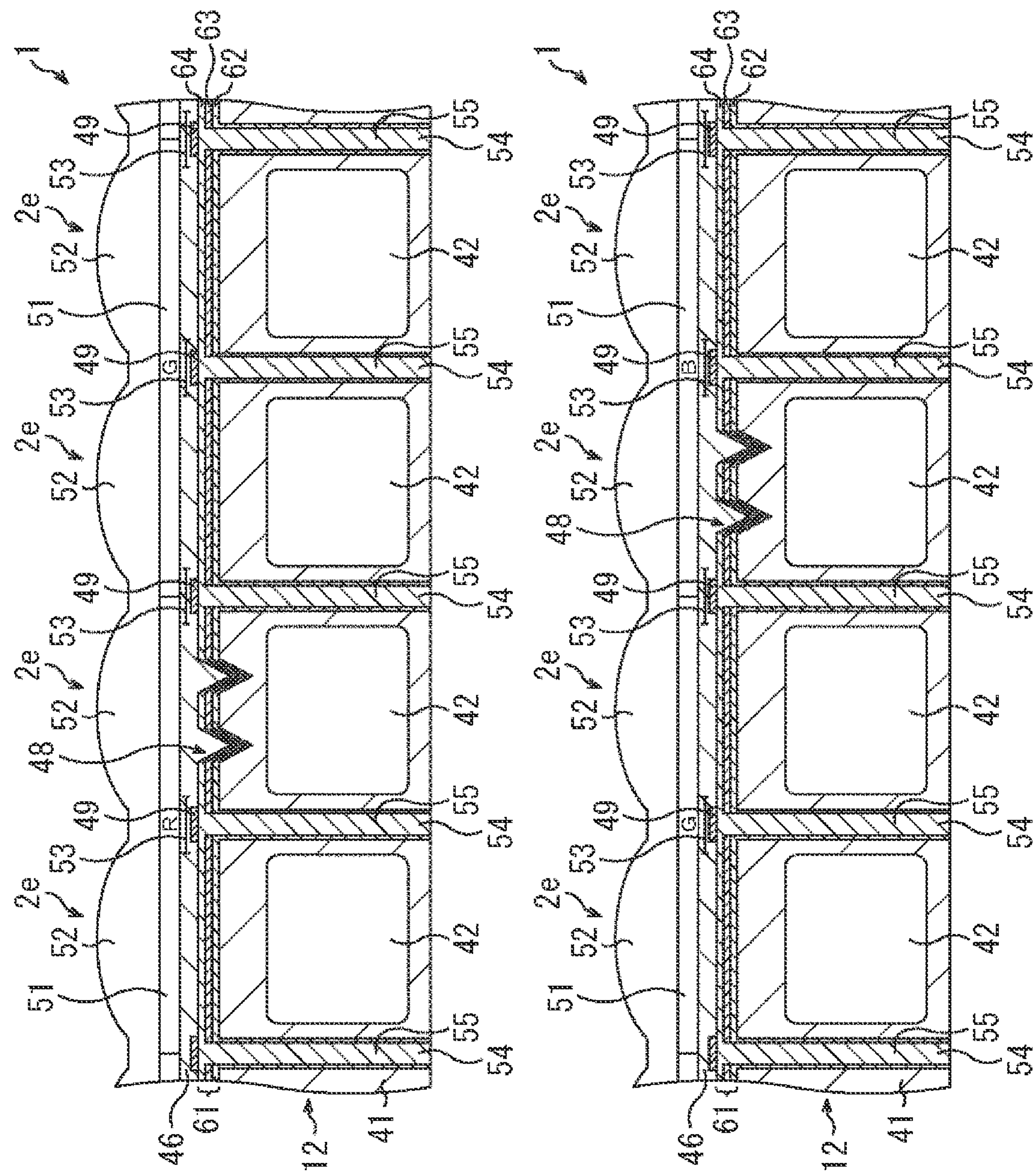
FIG. 13 is a diagram illustrating another cross-sectional configuration example of pixels according to the fifth embodiment.

FIG. 13 is a cross-sectional view of pixels 2*e* placed in the region B. As illustrated in FIG. 13, of the pixels 2*e* placed in the region B, recessed regions 48 are formed in an R pixel and a B pixel placed on the adjacent sides of G pixels.

Figure 14:
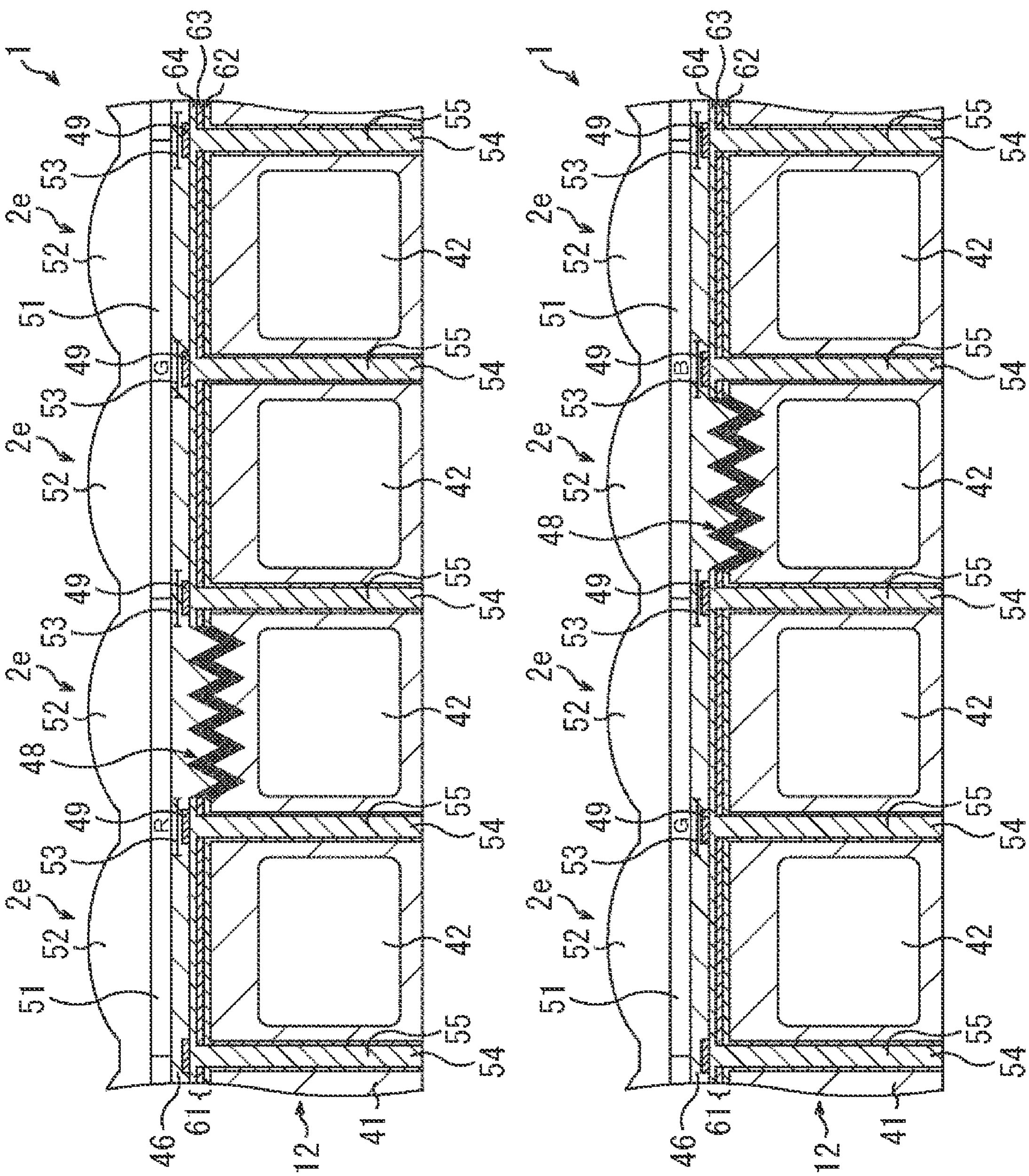
FIG. 14 is a diagram illustrating another cross-sectional configuration example of pixels according to the fifth embodiment.

FIG. 14 is a cross-sectional view of pixels 2*e* placed in the region C. As illustrated in FIG. 14, of the pixels 2*e* placed in the region B, recessed regions 48 are formed in an R pixel and a B pixel placed on the adjacent sides of G pixels.

Comparing the R pixels illustrated in FIGS. 13 and 14, the number of valleys of the recessed region 48 in the R pixel placed in the region B illustrated in FIG. 13 is different from the number of valleys of the recessed region 48 in the R pixel placed in the region C illustrated in FIG. 14. The number of the valleys of the recessed region 48 in the R pixel placed in the region B illustrated in FIG. 13 is two. The number of the valleys of the recessed region 48 in the R pixel placed in the region C illustrated in FIG. 14 is five.

Comparing the B pixels illustrated in FIGS. 13 and 14, the number of valleys of the recessed region 48 in the B pixel placed in the region B illustrated in FIG. 13 is different from the number of valleys of the recessed region 48 in the B pixel placed in the region C illustrated in FIG. 14. The number of the valleys of the recessed region 48 in the B pixel placed in the region B illustrated in FIG. 13 is two. The number of the valleys of the recessed region 48 in the B pixel placed in the region C illustrated in FIG. 14 is five.

In general, sensitivity tends to decrease with increasing image height. Therefore, to increase the sensitivity of pixels 2*e* placed at the high image height where sensitivity becomes lower, the number of valleys of the recessed regions 48 is made larger than that of pixels located at places other than those at the high image height.

Here, the pixel array 3 is divided into the three regions, the region where no recessed regions 48 are formed, the region where the number of valleys of the recessed regions 48 is small, and the region where the number of valleys of the recessed regions 48 is large. The number of valleys of the recessed regions 48 may be discrete like this or may be continuous. In a case where the number of valleys of the recessed regions 48 is set continuously, it is gradually increased with increasing image height.

Such adjustment of the number of valleys of the recessed regions 48 allows adjustment in sensitivity. Thus, the sensitivity of the pixels arranged in the pixel array 3 can be adjusted uniformly by adjusting the shape of the recessed regions 48.

Sixth Embodiment

Figure 15:
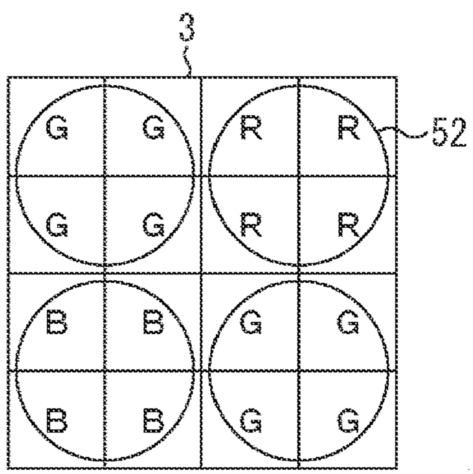
FIG. 15 is a diagram for explaining a pixel arrangement of the pixel array in a sixth embodiment.

The pixels 2*a* to 2*c* in the first to third embodiments can also be applied to the pixel array 3 having a pixel arrangement as illustrated in FIG. 15.

FIG. 15 is a diagram illustrating an example of a pixel arrangement of the pixel array 3. FIG. 15 illustrates sixteen pixels of 4×4 in the pixel array 3. In the pixel arrangement illustrated in FIG. 15, as in the pixel arrangement illustrated in FIG. 7, color filters of three colors, red (R), green (G), and blue (B), are arranged in units of 2×2 pixels. In the pixel arrangement illustrated in FIG. 15, unlike in the pixel arrangement illustrated in FIG. 7, one on-chip lens 52 is formed for four pixels of 2×2 pixels.

In the array illustrated in FIG. 15, the color filters of 4×4 pixels are set as a basic unit, in which a G filter of 2×2 pixels is placed at the upper left, a B filter of 2×2 pixels at the lower left, an R filter of 2×2 pixels at the upper right, and a G filter of 2×2 pixels at the lower right. Each on-chip lens 52 is formed for four pixels of 2×2 in the basic unit.

In the pixel array 3, pixels are arranged in both a vertical direction and a horizontal direction with color filters of 4×4 pixels as a basic unit. Any of the pixels 2*a* to 2*c* according to the first to third embodiments can be applied to all the pixels arranged in the pixel array 3 in which the pixels are arranged as above, to make them pixels in which the recessed regions 48 are formed. Alternatively, any of the pixels 2*a* to 2*c* in the first to third embodiments can be applied to some pixels, depending on the image height and the colors of the color filters.

Here, a sensitivity difference that can occur in a case where one on-chip lens 52 is provided for four pixels of the same color as in FIG. 15, and no recessed region 48 is formed will be described with reference to FIGS. 16A and 16B.

In the following description, the photoelectric conversion region including the P-type semiconductor region 41 and the N-type semiconductor region 42 will be described as a photodiode (PD) 42, and the reference numeral given in the figure is shown to indicate the portion of the semiconductor region 42 to continue description.

Figure 16A:
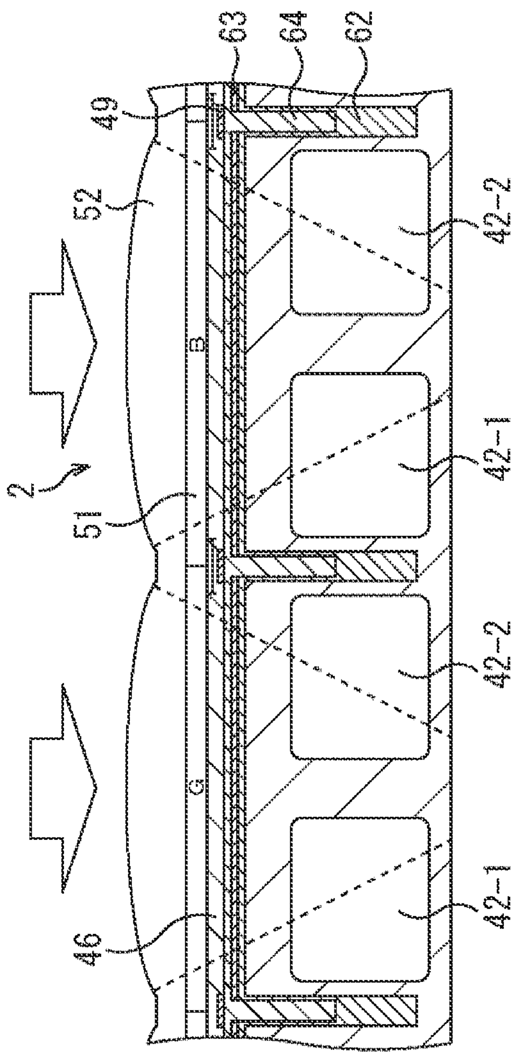
FIGS. 16A and 16B are diagrams for explaining difference in sensitivity depending on image height.

FIG. 16A is a cross-sectional view of pixels placed near the center of the pixel array 3 (at the image height center). FIG. 16B is a cross-sectional view of pixels placed near an edge of the pixel array 3 (at the high image height). Furthermore, the pixels illustrated in FIGS. 16A and 16B correspond to pixels of a conventional configuration in which one on-chip lens 52 is provided for four pixels of the same color.

Referring to FIG. 16A, for example, a PD 42-1 and a PD 42-2 are placed under a G filter illustrated on the left side in the figure. One on-chip lens 52 is formed over the PD 42-1 and the PD 42-2. No inter-pixel separation portion 54 is formed between the PD 42-1 and the PD 42-2. Furthermore, no light-shielding film 49 is formed between the PD 42-1 and the PD 42-2.

An inter-pixel separation portion 54 is formed in a portion corresponding to a space between the G filter and the B filter, but has a configuration in which, instead of a penetrating trench, a non-penetrating trench is filled with the hafnium oxide film 62 and the silicon oxide film 64.

Thus, no inter-pixel separation portion 54 and no light-shielding film 49 are formed within four pixels of 2×2 at which a color filter of the same color is placed. This configuration prevents a reduction in the sensitivity of the four pixels.

The pixels 2 placed on the high image height side basically have a configuration similar to that of the pixels 2 placed at the image height center, but are formed, for pupil correction, such that the on-chip lenses 52 and the color filter layers 51 are located closer to the image height center. Referring to FIG. 16B, the on-chip lenses 52, the color filter layers 51, and the light-shielding film 49 are placed at positions shifted to the left in the figure.

Pupil correction is performed on the pixels 2 placed on the high image height side so that light equally enters the PD 42-1 and the PD 42-2. However, the amount of pupil correction for this pupil correction is set to, for example, an amount to allow light to equally enter the PD 42-1 and the PD 42-2 in the G pixels. In a case where the amount of pupil correction optimal for the G pixels is set, it may not be optimal for the R pixels and the B pixels in terms of chromatic aberration.

Figure 16B:
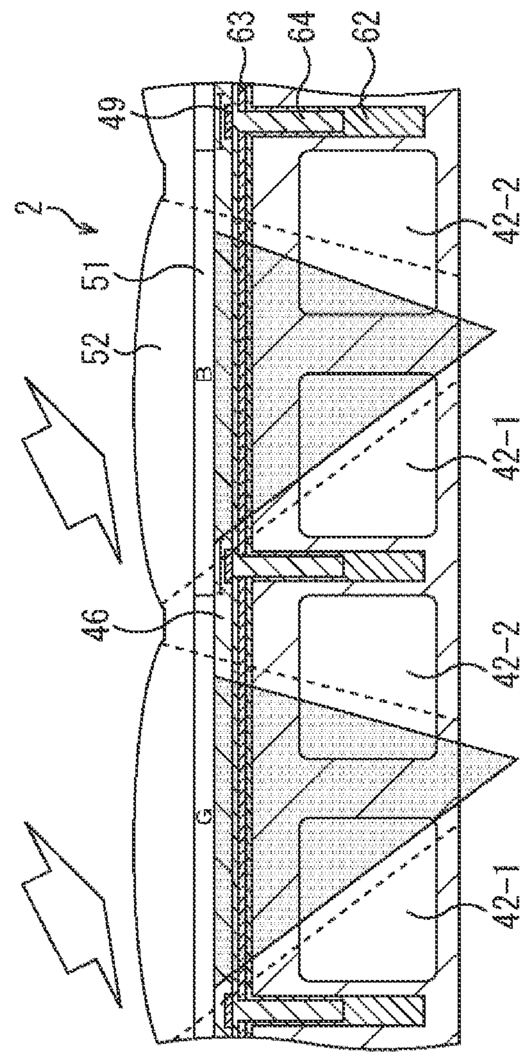

Taking the G pixel and the B pixel illustrated in FIG. 16B as an example, light equally enters the PD 42-1 and the PD 42-2 placed under the G filter. On the other hand, light does not equally enter the PD 42-1 and the PD 42-2 placed under the B filter. In the conditions illustrated in FIG. 16B, more light enters the PD 42-1 than the PD 42-2. In other words, the sensitivity of the PD 42-1 can be different from the sensitivity of the PD 42-2.

Furthermore, as described in the fifth embodiment, there is a sensitivity difference between the G pixels and the B pixels. Likewise, there is a sensitivity difference between the G pixels and the R pixels. In order to absorb such a sensitivity difference, the recessed regions 48 can be provided in pixels having a lower sensitivity.

Figure 17:
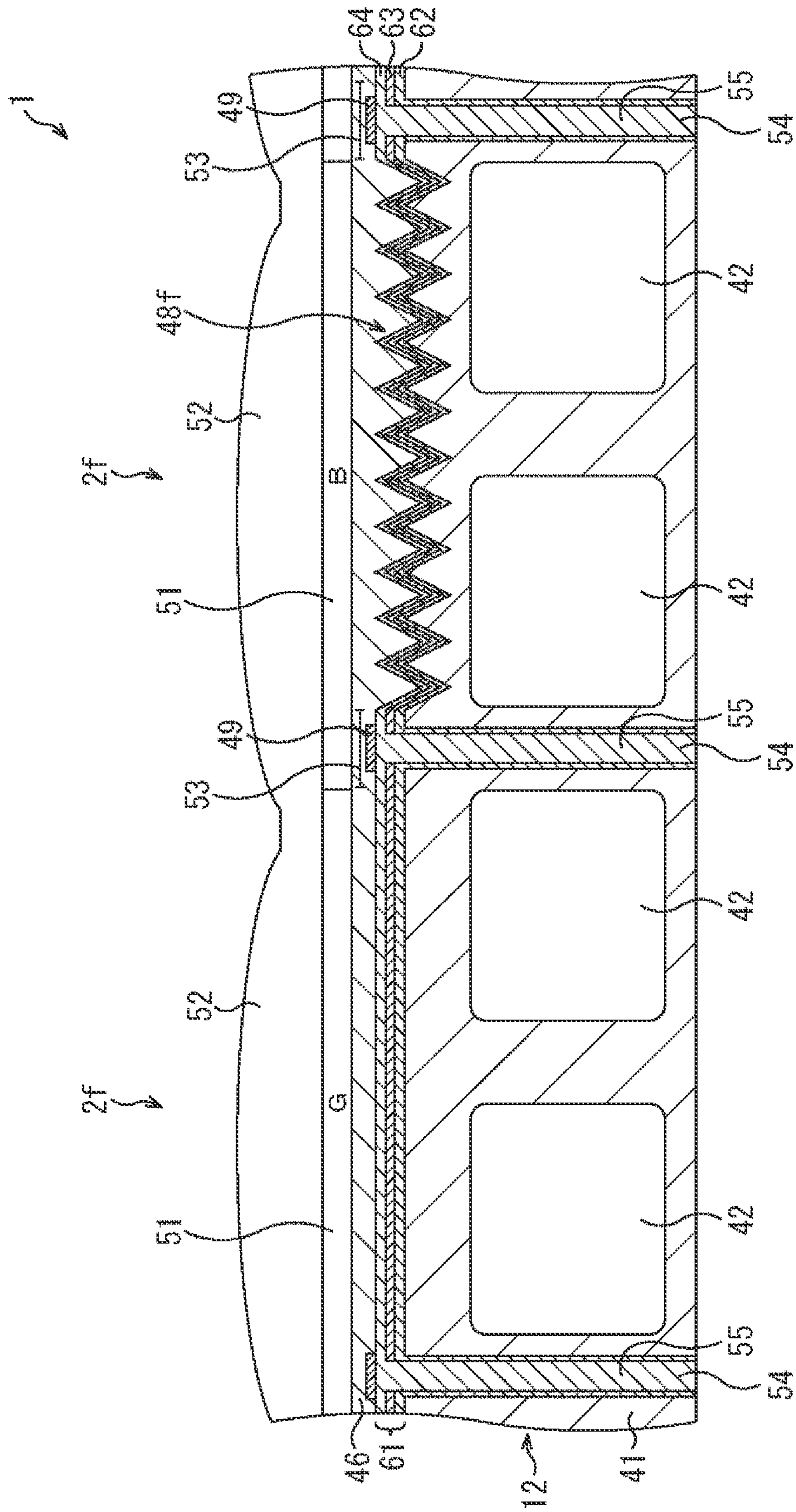
FIG. 17 is a diagram illustrating a cross-sectional configuration example of pixels according to the sixth embodiment.

FIG. 17 illustrates a cross-sectional configuration example of pixels 2*f* in a sixth embodiment. Like FIG. 16B, FIG. 17 illustrates a G pixel and a B pixel placed on the high image height side. An inter-pixel separation portion 54 between the pixels 2*f* illustrated in FIG. 17 has a configuration in which a penetrating trench is filled with the hafnium oxide film 62 and the silicon oxide film 64.

The formation of the inter-pixel separation portions 54 penetrating like this can prevent leakage of light between pixels at which filters of different colors are placed, to reduce color mixing. Furthermore, the inter-pixel separation portions 54 reflect light, providing the effect of confining the light within the pixels 2*fs*

Of the G pixel and the B pixel illustrated in FIG. 17, no recessed region 48*f* is formed in the G pixel, but a recessed region 48*f* is formed in the B pixel. As described above, when the G pixel and the B pixel are compared, the sensitivity of the B pixel is more likely to decrease than that of the G pixel. Thus, the recessed region 48*f* is formed in the B pixel to improve the sensitivity of the B pixel.

Figure 18:
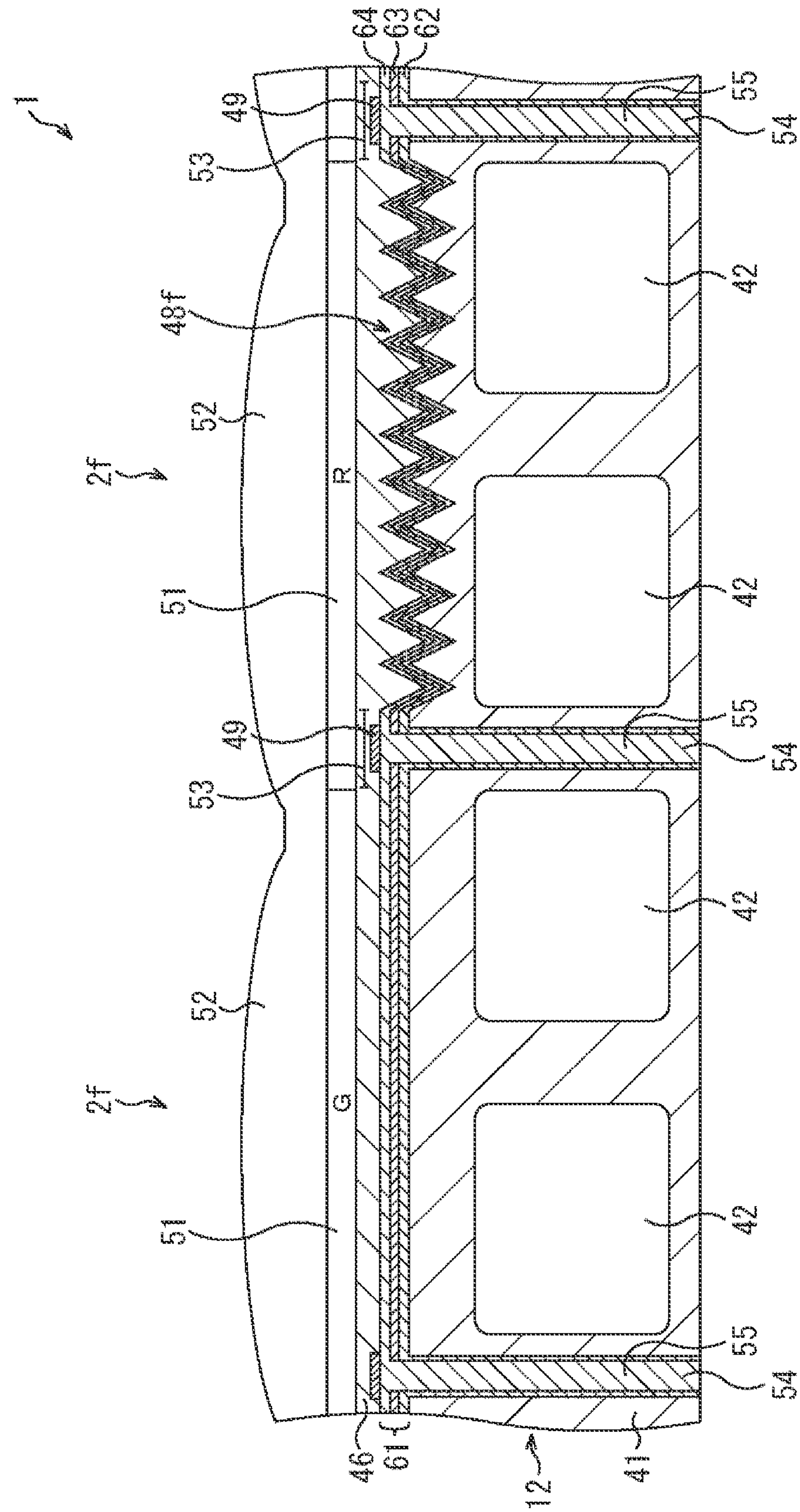
FIG. 18 is a diagram illustrating another cross-sectional configuration example of pixels according to the sixth embodiment.

FIG. 18 illustrates a G pixel and an R pixel placed on the high image height side. Of the G pixel and the R pixel illustrated in FIG. 18, no recessed region 48*f* is formed in the G pixel, but a recessed region 48*f* is formed in the R pixel. As described above, when the G pixel and the R pixel are compared, the sensitivity of the R pixel is more likely to decrease than that of the G pixel. Thus, the recessed region 48*f* is formed in the R pixel to improve the sensitivity of the R pixel.

As illustrated in FIGS. 17 and 18, no recessed region 48*f* is formed in the G pixel, and the recessed region 48*f* is formed in the B pixel or/and the R pixel. The recessed region 48*f* may be formed in both the B pixel and the R pixel placed at the high image height, or may be formed in only one of the B pixel and the R pixel.

Furthermore, in a case where the recessed region 48*f* is formed in the B pixel or/and the R pixel, the shape of the recessed region 48*f* may be optimized for each wavelength of incident light to adjust sensitivity uniformly. An example is shown in FIGS. 19A and 19B.

Figure 19A:
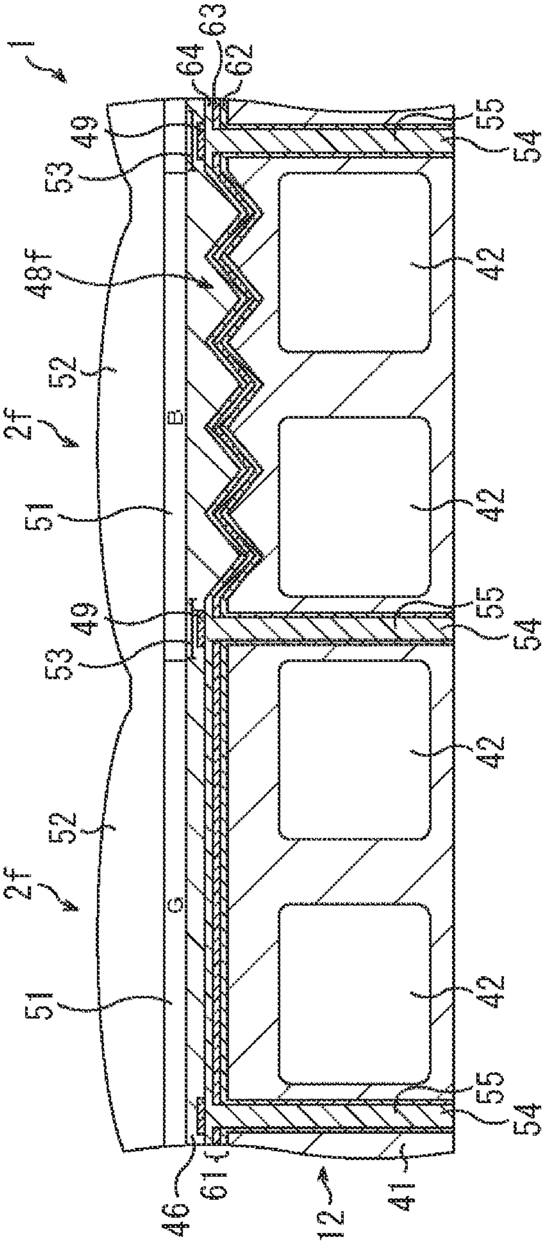
FIGS. 19A and 19B are diagrams illustrating another cross-sectional configuration example of pixels according to the sixth embodiment.
Figure 19B:
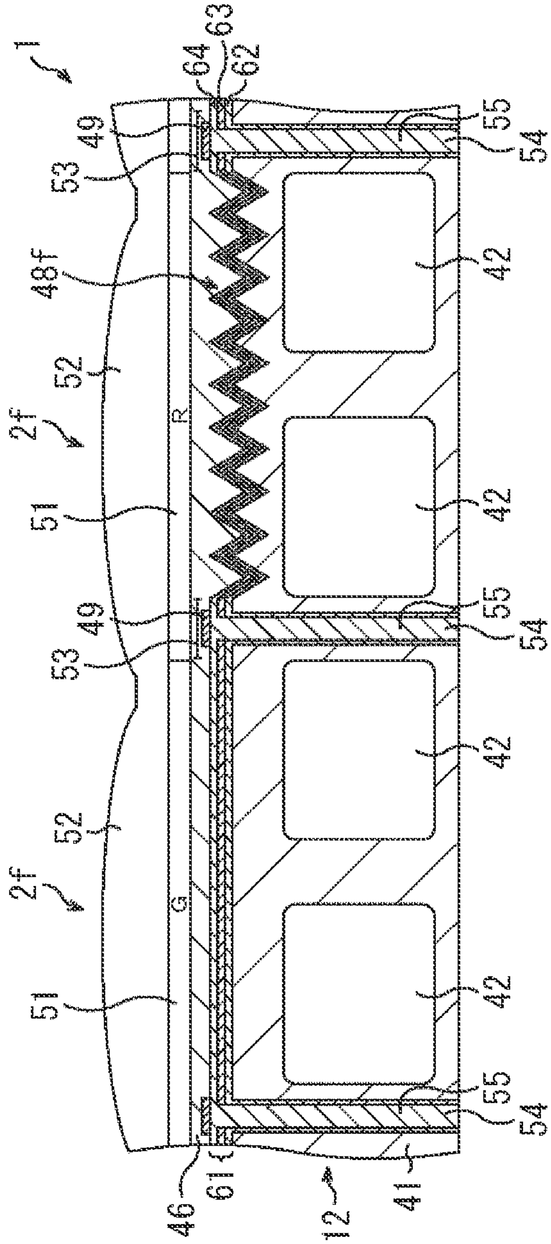

Comparing a B pixel illustrated in FIG. 19A and an R pixel illustrated in FIG. 19B, the number of valleys of a recessed region 48 in the B pixel illustrated in FIG. 19A is different from the number of valleys of a recessed region 48 in the R pixel illustrated in FIG. 19B. The number of the valleys of the recessed region 48 in the B pixel illustrated in FIG. 19A is five. The number of the valleys of the recessed region 48 in the R pixel illustrated in FIG. 19B is ten.

In this case, when the B pixel and the R pixel are compared, the sensitivity of the R pixel tends to be lower than that of the B pixel. Thus, the number of the valleys of the recessed region 48 in the R pixel is made larger than the number of the valleys of the recessed region 48 in the B pixel.

Further, the shape of the recessed regions **48*f* may be varied (the number of valleys may be varied) depending on the image height. As described with reference to FIG. 11, the pixel array 3 is divided into the three regions. The region A is the image height center of the pixel array 3. The region B is the middle-image-height region of the pixel array 3. The region C is the high-image-height region of the pixel array 3**.

Figure 20:
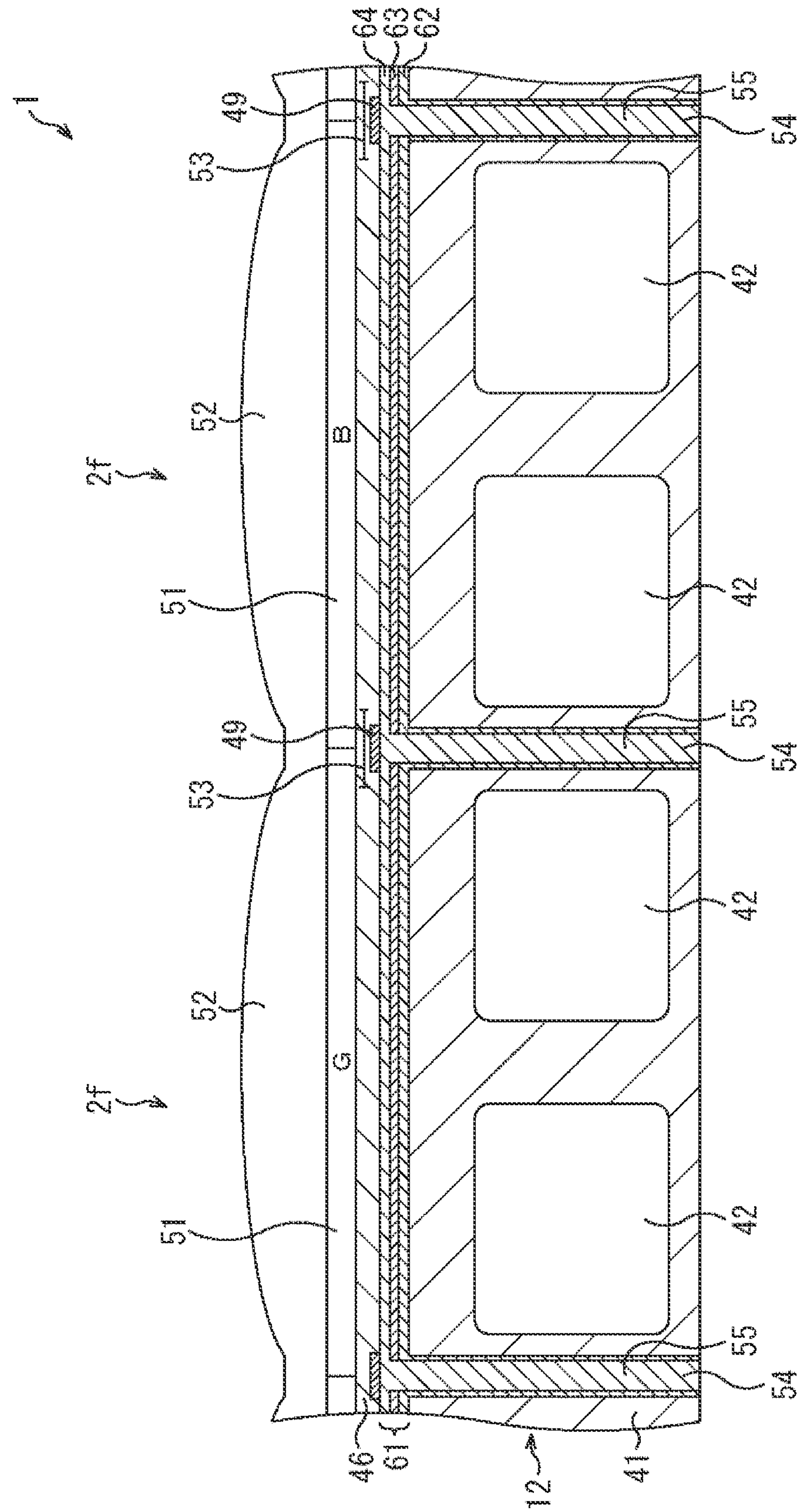
FIG. 20 is a diagram illustrating another cross-sectional configuration example of pixels according to the sixth embodiment.

FIG. 20 is a cross-sectional view of pixels **2*f* placed in the region A. As illustrated in FIG. 20, no recessed regions 48*f* are formed in the pixels 2*f*** placed in the region A.

Figure 21:
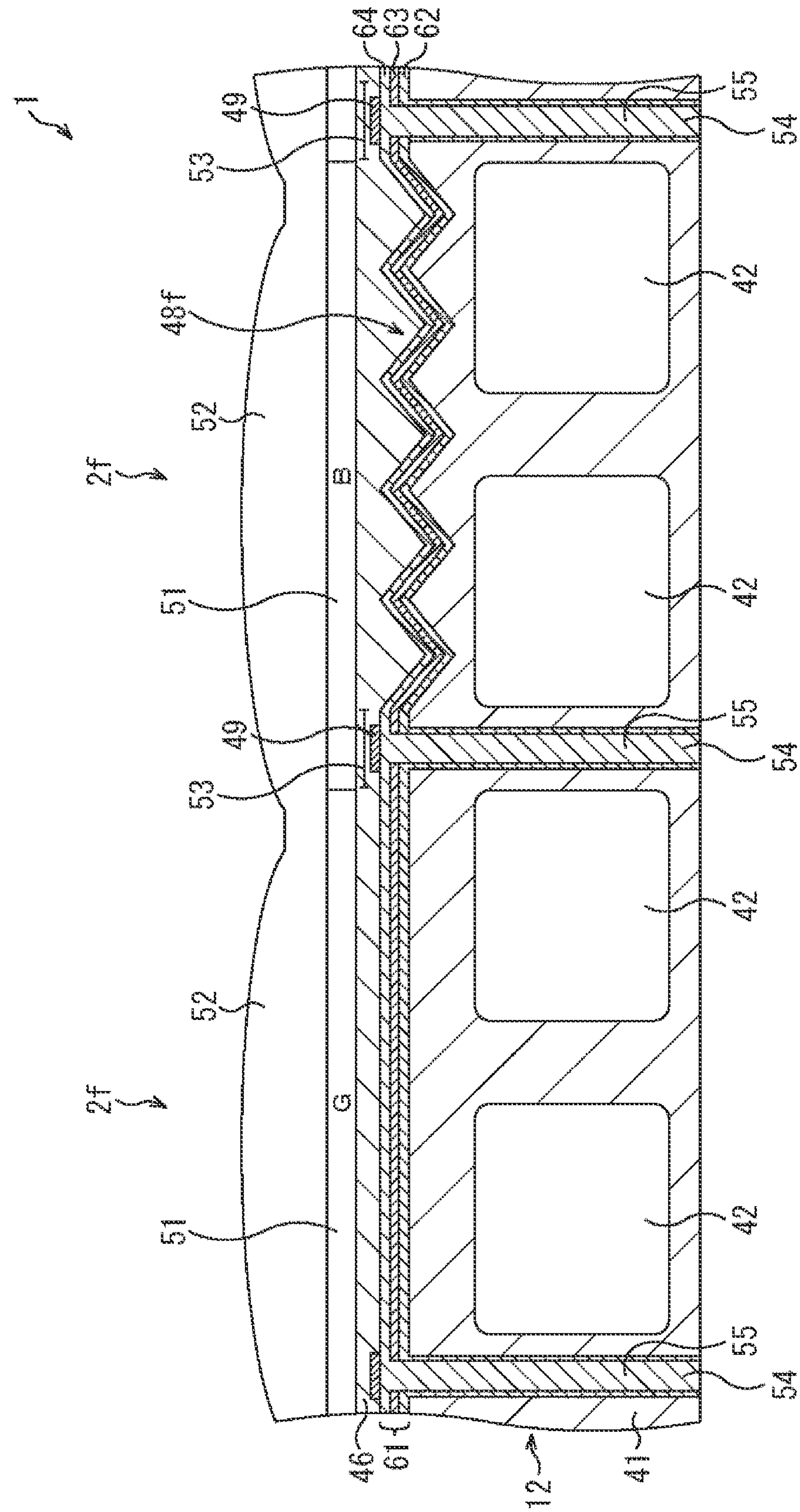
FIG. 21 is a diagram illustrating another cross-sectional configuration example of pixels according to the sixth embodiment.

FIG. 21 is a cross-sectional view of pixels **2*f* placed in the region B. As illustrated in FIG. 21, a recessed region 48*f* is formed in a B pixel of the pixels 2*f*** placed in the region B.

Figure 22:
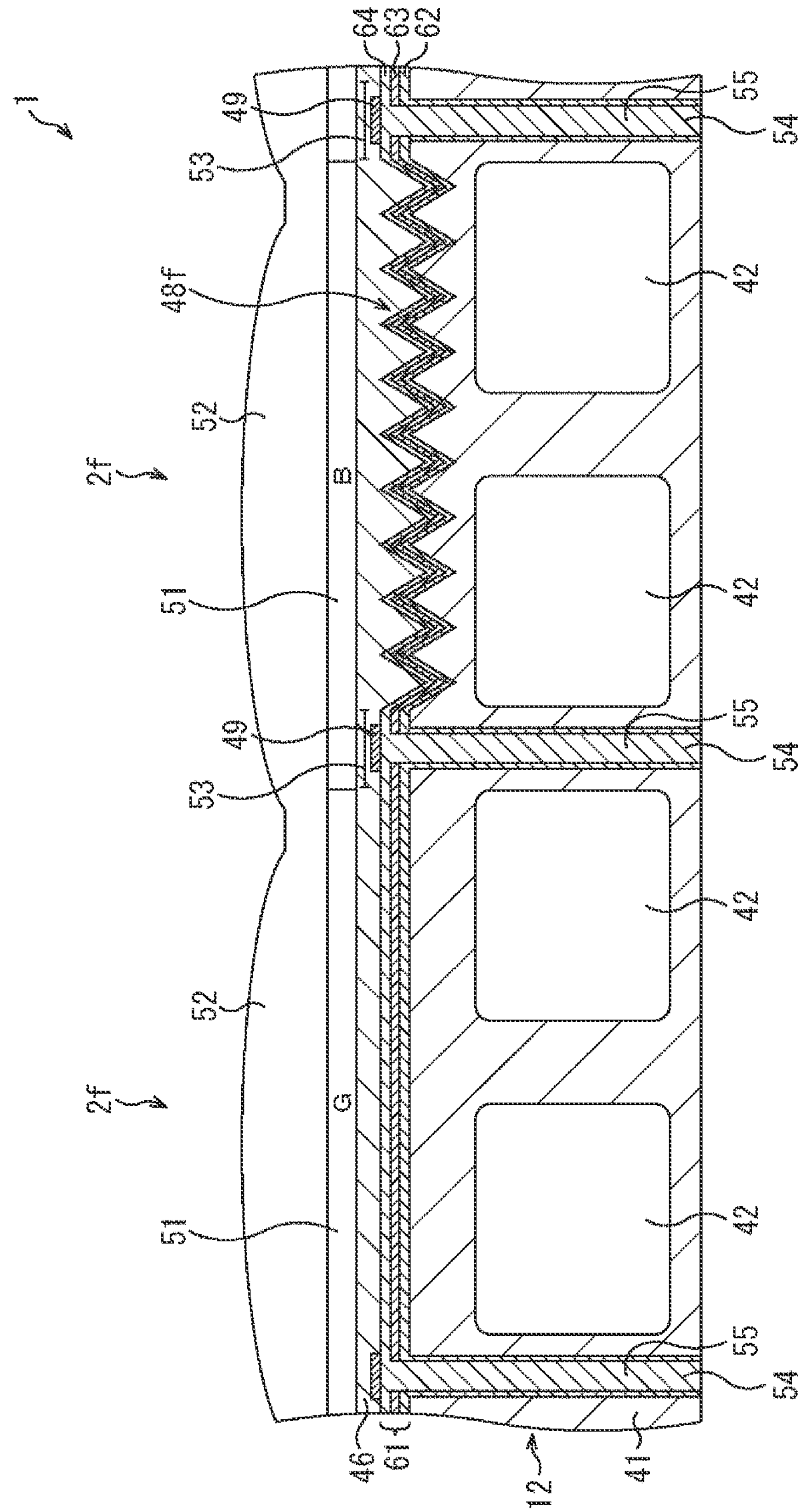
FIG. 22 is a diagram illustrating another cross-sectional configuration example of pixels according to the sixth embodiment.

FIG. 22 is a cross-sectional view of pixels **2*f* placed in the region C. As illustrated in FIG. 21, a recessed region 48*f* is formed in a B pixel of the pixels 2*f*** placed in the region C.

Comparing the B pixels illustrated in FIGS. 21 and 22, the number of valleys of the recessed region **48*f* in the B pixel placed in the region B illustrated in FIG. 21 is different from the number of valleys of the recessed region 48*f* in the B pixel placed in the region C illustrated in FIG. 22. The number of the valleys of the recessed region 48*f* in the B pixel placed in the region B illustrated in FIG. 21 is five. The number of the valleys of the recessed region 48 in the B pixel placed in the region C illustrated in FIG. 22** is ten.

In general, sensitivity tends to decrease with increasing image height. Therefore, to increase the sensitivity of pixels **2*f* placed on the high-image-height side where sensitivity becomes lower, the number of valleys of the recessed regions 48** is made larger than that of pixels located at places other than those at the high image height.

Although R pixels are not illustrated, recessed regions **48*f* are formed in R pixels placed at the middle image height and the high image height. Furthermore, the number of valleys of the recessed region 48*f* in the R pixel placed at the high image height is made larger than the number of valleys of the recessed region 48*f*** in the R pixel placed at the medium image height.

Here, the pixel array 3 is divided into the three regions, the region where no recessed regions **48*f* are formed, the region where the number of valleys of the recessed regions 48*f* is small, and the region where the number of valleys of the recessed regions 48*f* is large. The number of valleys of the recessed regions 48*f* may be discrete like this or may be continuous. In a case where the number of valleys of the recessed regions 48*f*** is set continuously, it is gradually increased with increasing image height.

Such adjustment of the number of valleys of the recessed regions **48*f* allows adjustment in sensitivity. Thus, the sensitivity of the pixels arranged in the pixel array 3 can be adjusted uniformly by adjusting the shape of the recessed regions 48*f***.

Further, a configuration in which the shape of the recessed regions **48*f*** varies (the number of valleys varies) depending on the image height will be additionally described.

As described with reference to FIGS. 16A and 16B, at a higher image height, a sensitivity difference can occur even among four pixels (four PDs 42) of the same color. Referring again to FIG. 16B, in the B pixel, the PD 42-1 and the PD 42-2 placed under the B filter can cause a sensitivity difference and can be nonuniform in sensitivity.

Therefore, of the four PDs 42 of the same color, a recessed region **48*f* is formed over a PD 42 whose sensitivity tends to be lower, so as to reduce the sensitivity difference among the four PDs 42** of the same color.

In the region A (at the image height center), there is not much sensitivity difference, and thus the pixels **2*f* in which no recessed regions 48*f* are formed are placed as illustrated in FIG. 20**.

Figure 23:
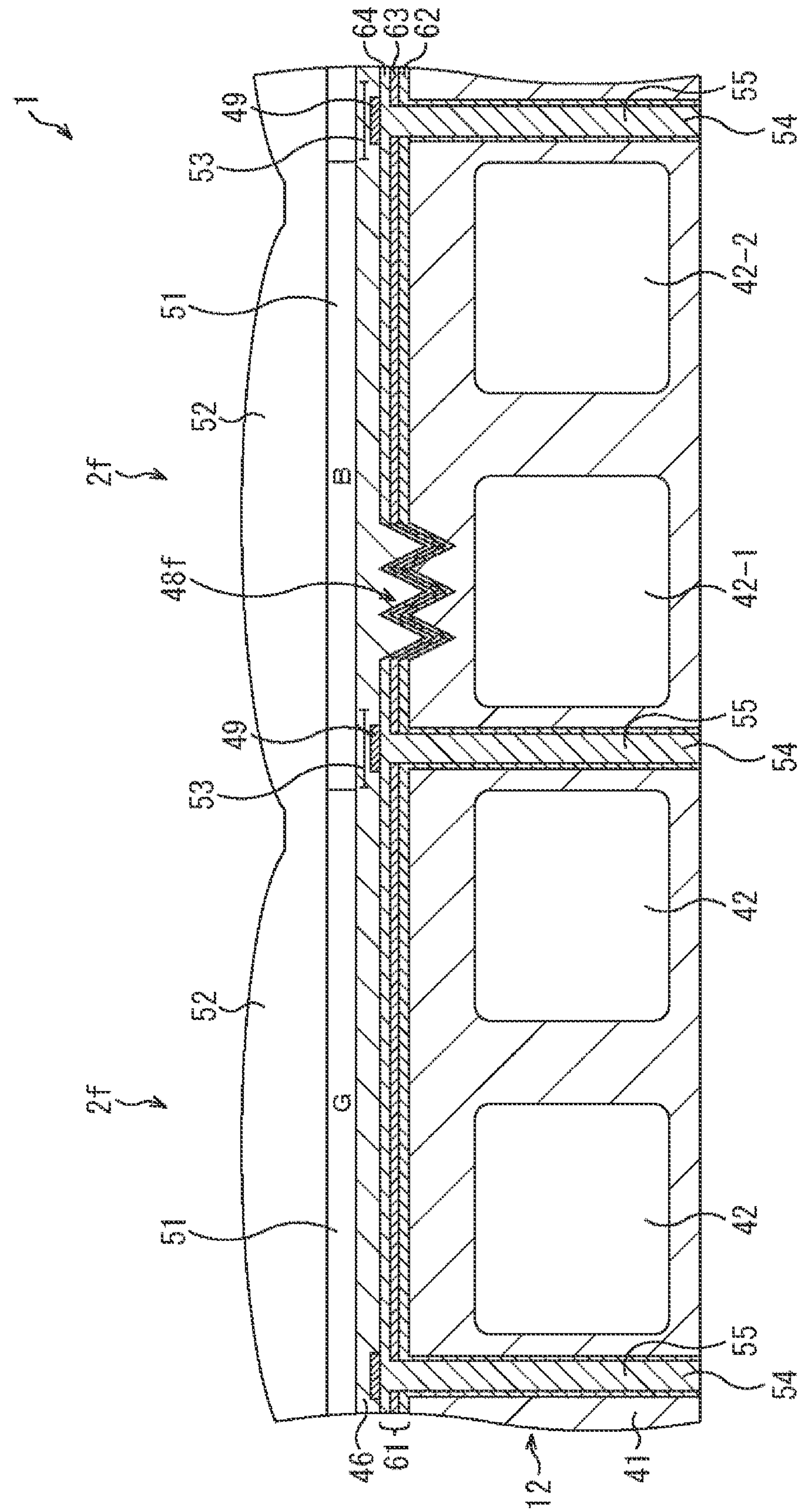
FIG. 23 is a diagram illustrating another cross-sectional configuration example of pixels according to the sixth embodiment.

FIG. 23 is a cross-sectional view of pixels **2*f* placed in the region B (at the medium image height). As illustrated in FIG. 23, a recessed region 48*f* is formed in a B pixel of the pixels 2*f* placed in the region B. Furthermore, in order to absorb a sensitivity difference within the B pixel, the recessed region 48*f* is formed on the PD 42-1 side, and no recessed region 48*f* is formed on the PD 42-2** side.

Figure 24:
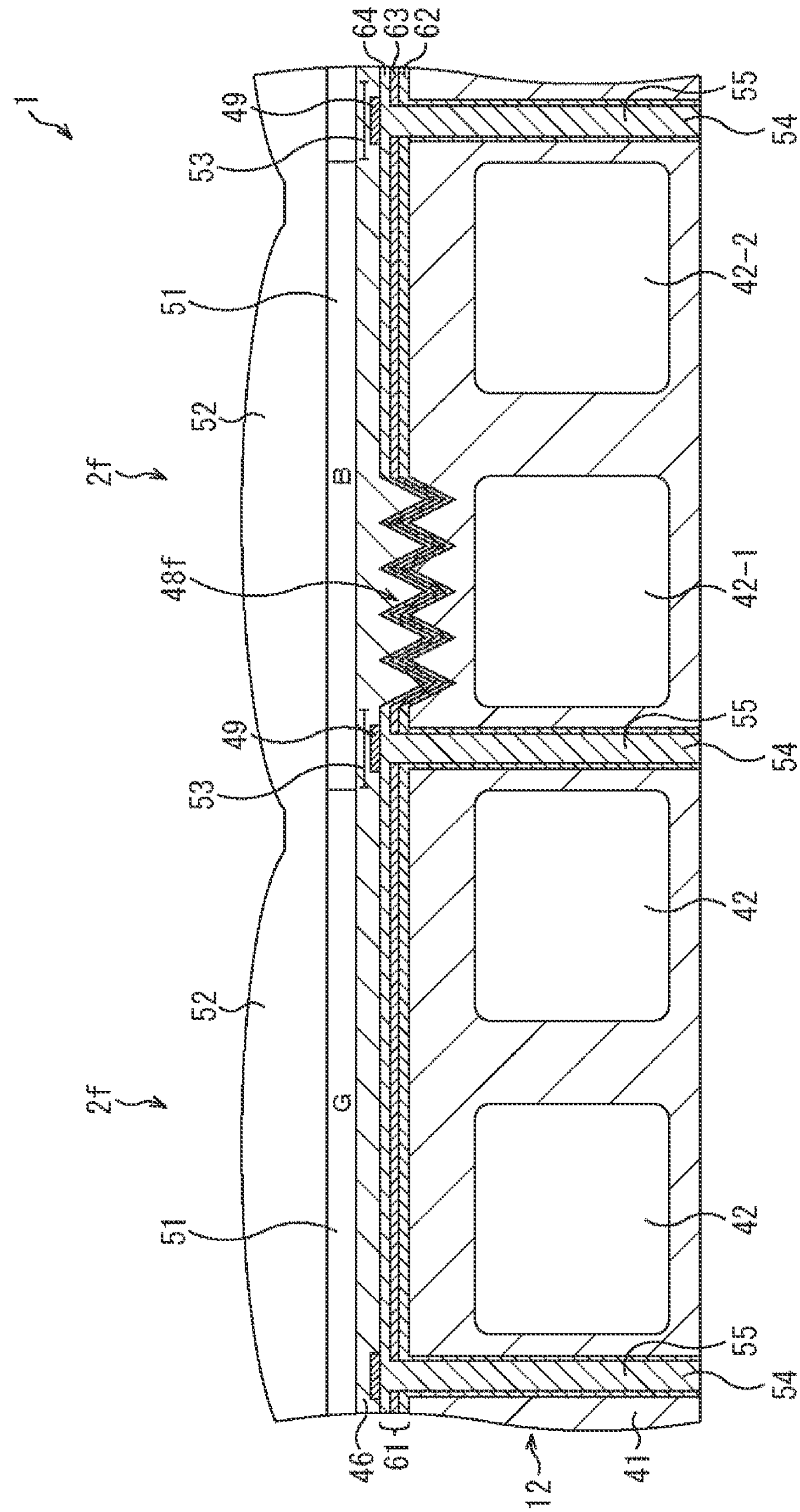
FIG. 24 is a diagram illustrating another cross-sectional configuration example of pixels according to the sixth embodiment.

FIG. 24 is a cross-sectional view of pixels **2*f* placed in the region C (at the high image height). As illustrated in FIG. 24, a recessed region 48*f* is formed in a B pixel of the pixels 2*f* placed in the region C. Furthermore, in order to absorb a sensitivity difference within the B pixel, the recessed region 48*f* is formed on the PD 42-1 side, and no recessed region 48*f* is formed on the PD 42-2** side.

In this case, the B pixel is placed at a position where the PD 42-1 becomes lower in sensitivity than the PD 42-2. Thus, the recessed region **48*f* is formed at the PC 42-1, on the PD 42-1 side, and no recessed region 48*f* is formed on the PD 42-2 side. As described with reference to FIG. 15, the B pixel includes four PDs 42 sharing a B filter. Of the four PDs 42, a recessed region 48*f* is formed over one, two, or three PDs 42 having a lower sensitivity than the other PD(s) 42**.

Comparing the B pixels illustrated in FIGS. 23 and 24, the number of valleys of the recessed region **48*f* in the B pixel placed in the region B illustrated in FIG. 23 is different from the number of valleys of the recessed region 48*f* in the B pixel placed in the region C illustrated in FIG. 24. The number of the valleys of the recessed region 48*f* in the B pixel placed in the region B illustrated in FIG. 23 is three. The number of the valleys of the recessed region 48 in the B pixel placed in the region C illustrated in FIG. 22** is five.

As in the case described above, sensitivity tends to decrease with increasing image height. Therefore, to increase the sensitivity of pixels **2*f* placed at the high image height where sensitivity becomes lower, the number of valleys of the recessed regions 48** is made larger than that of pixels located at places other than those at the high image height.

Although R pixels are not illustrated, recessed regions **48*f* are formed in R pixels placed at the middle image height and the high image height. Furthermore, of four PDs 42 included in each R pixel, a recessed region 48*f* is formed over one, two, or three PDs 42 on the side where sensitivity is considered to be lower. Furthermore, the number of valleys of the recessed region 48*f* in the R pixel placed at the high image height is made larger than the number of valleys of the recessed region 48*f*** in the R pixel placed at the medium image height.

Here, the pixel array 3 is divided into the three regions, the region where no recessed regions **48*f* are formed, the region where the number of valleys of the recessed regions 48*f* is small, and the region where the number of valleys of the recessed regions 48*f* is large. The number of valleys of the recessed regions 48*f* may be discrete like this or may be continuous. In a case where the number of valleys of the recessed regions 48*f*** is set continuously, it is gradually increased with increasing image height.

Note that the sixth embodiment has described, as an example, the case where the amount of pupil correction appropriate for the G pixels is set, and thus has described the recessed regions 48*f* formed in the B pixels and the R pixels. In a case where the amount of pupil correction appropriate for the B pixels is set, recessed regions 48*f* are formed in the G pixels and the R pixels. Furthermore, in a case where the amount of pupil correction appropriate for the R pixels is set, recessed regions 48*f* are formed in the G pixels and the B pixels.

Thus, by providing a recessed region 48*f* in a pixel 2*f* having a structure in which a color filter of the same color and one on-chip lens 52 are shared by four pixels (four PDs 42), light can also be more efficiently collected in the PDs 42, and photoelectric conversion efficiency can be improved. Further, by adjusting the shape (the number of valleys) of the recessed regions 48*f* according to the color and the image height, sensitivity can be made uniform

Seventh Embodiment

The pixels 2*a* to 2*c* in the first to third embodiments can also be applied to pixels that detect a phase difference. A phase difference is detected, for example, to perform autofocus (AF).

Figure 25B:
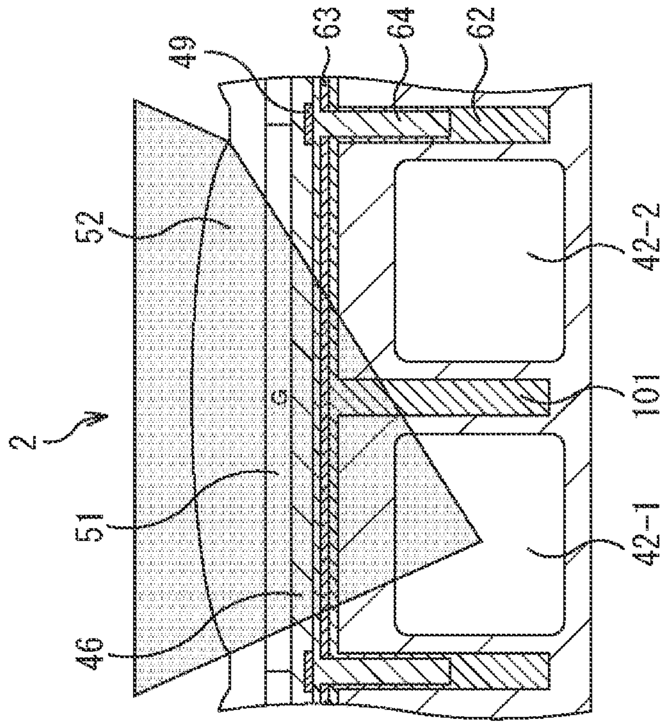
FIGS. 25A and 25B are diagrams for explaining pixels for phase difference detection in a seventh embodiment.
Figure 25A:
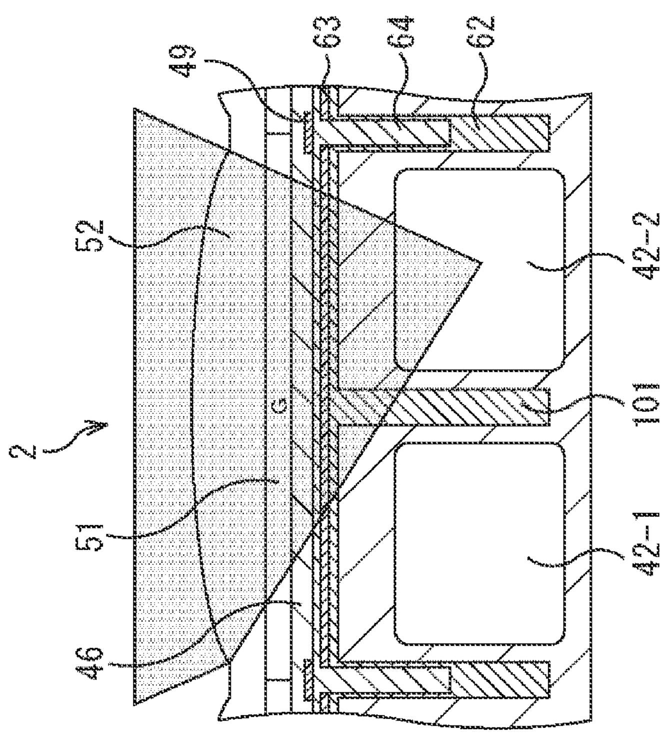

FIGS. 25A and 25B are cross-sectional views of pixels that detect a phase difference, in which one pixel is divided into two PDs, and light is received by each PD. The pixels illustrated in FIGS. 25A and 25B have a pixel structure to which the present technology is not applied.

FIGS. 25A and 25B are pixels 2 having the same structure. In each pixel 2, under one on-chip lens 52, a color filter of one color, a G filter in FIGS. 25A and 25B, is placed, and two PDs 42-1 and 42-2 are placed. An intra-pixel separation portion 101 is formed between the PD 42-1 and the PD 42-2.

When a pixel surrounded by inter-pixel separation portions 54 is considered as one pixel, one pixel includes two PDs 42-1 and 42-2. The intra-pixel separation portion 101 is formed between the PD 42-1 and the PD 42-2. The intra-pixel separation portion 101 is formed by forming a P-type or N-type region by ion implantation, for example. Whether the intra-pixel separation portion 101 is a P-type region or an N-type region is determined by the configuration of the PDs 42.

Referring to FIG. 25A, light from the right direction with respect to the pixel 2 is received by the PD 42-2 placed on the right side in the pixel 2. Referring to FIG. 25B, light from the left direction with respect to the pixel 2 is received by the PD 42-1 placed on the left side in the pixel 2. Thus, by separating the inside of the pixel and providing the PD 42-1 and the PD 42-2, light coming from a left part and light coming from a right part can be separately received.

Figure 26:
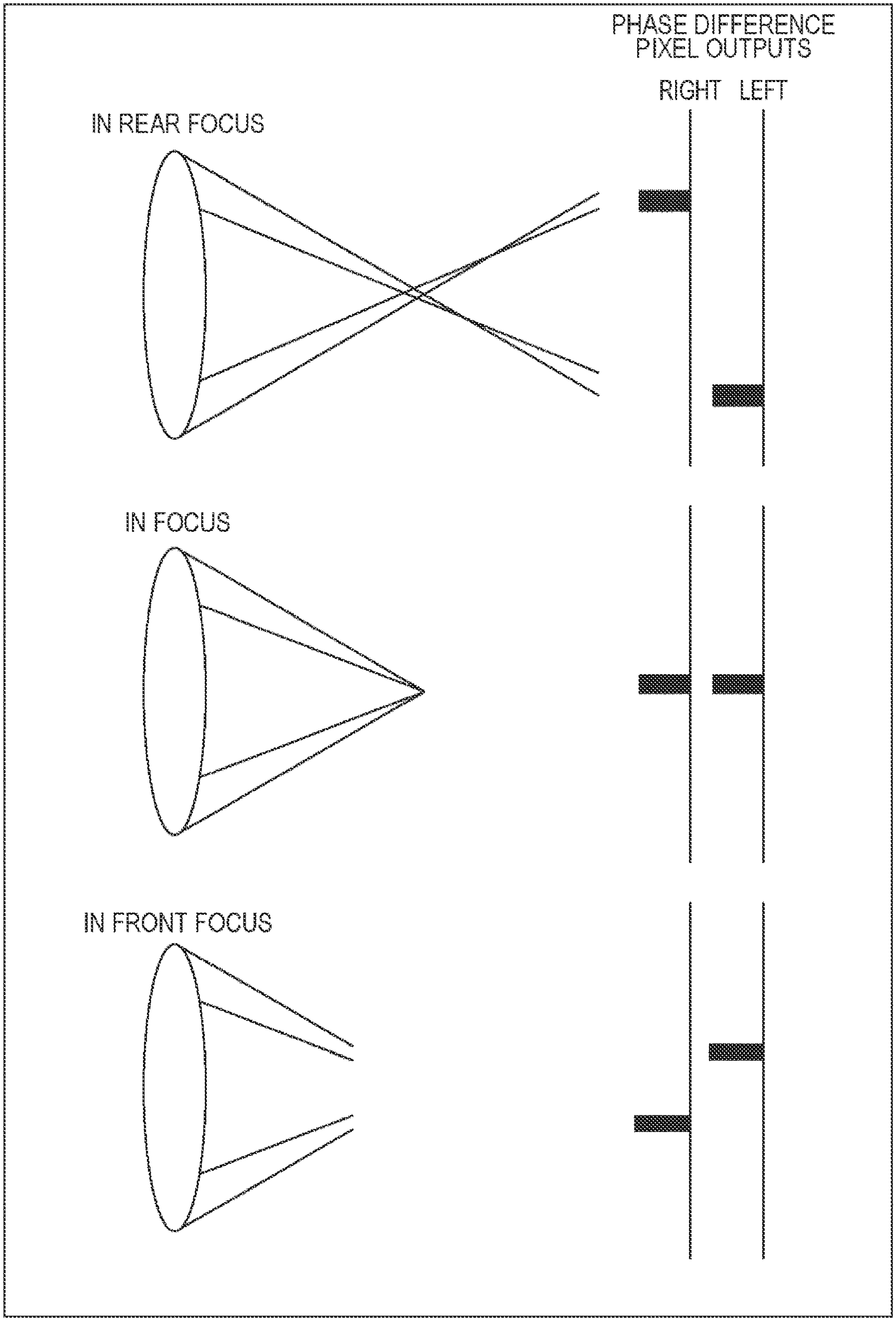
FIG. 26 is a diagram for explaining how to perform autofocus.

The PD 42-1 and the PD 42-2 separately receive light coming from a left part and light coming from a right part, so that a focus position can be detected as illustrated in FIG. 26.

Specifically, in rear focus or in front focus, an output from the PD 42-1 and an output from the PD 42-2 do not match (outputs of paired phase difference pixels do not match). When focus is achieved, an output from the PD 42-1 and an output from the PD 42-2 match (outputs of the paired phase difference pixels match). When rear focus or front focus is determined, a lens group (not illustrated) is moved to a position to achieve focus, allowing the detection of a focal point.

In a case where a focus position is detected by such a phase difference method, a focal position can be detected at a relatively high speed, allowing high-speed autofocus. However, since one pixel is divided into two PDs 42, a decrease in sensitivity can be involved. For example, there may be cases where it is difficult to detect a focal position in a dark place or the like.

Since the formation of recessed regions 48 can improve sensitivity, by forming recessed regions 48 in pixels for detecting a phase difference as illustrated in FIGS. 25A and 25B, decreased sensitivity is complemented and further improved.

Figure 27:
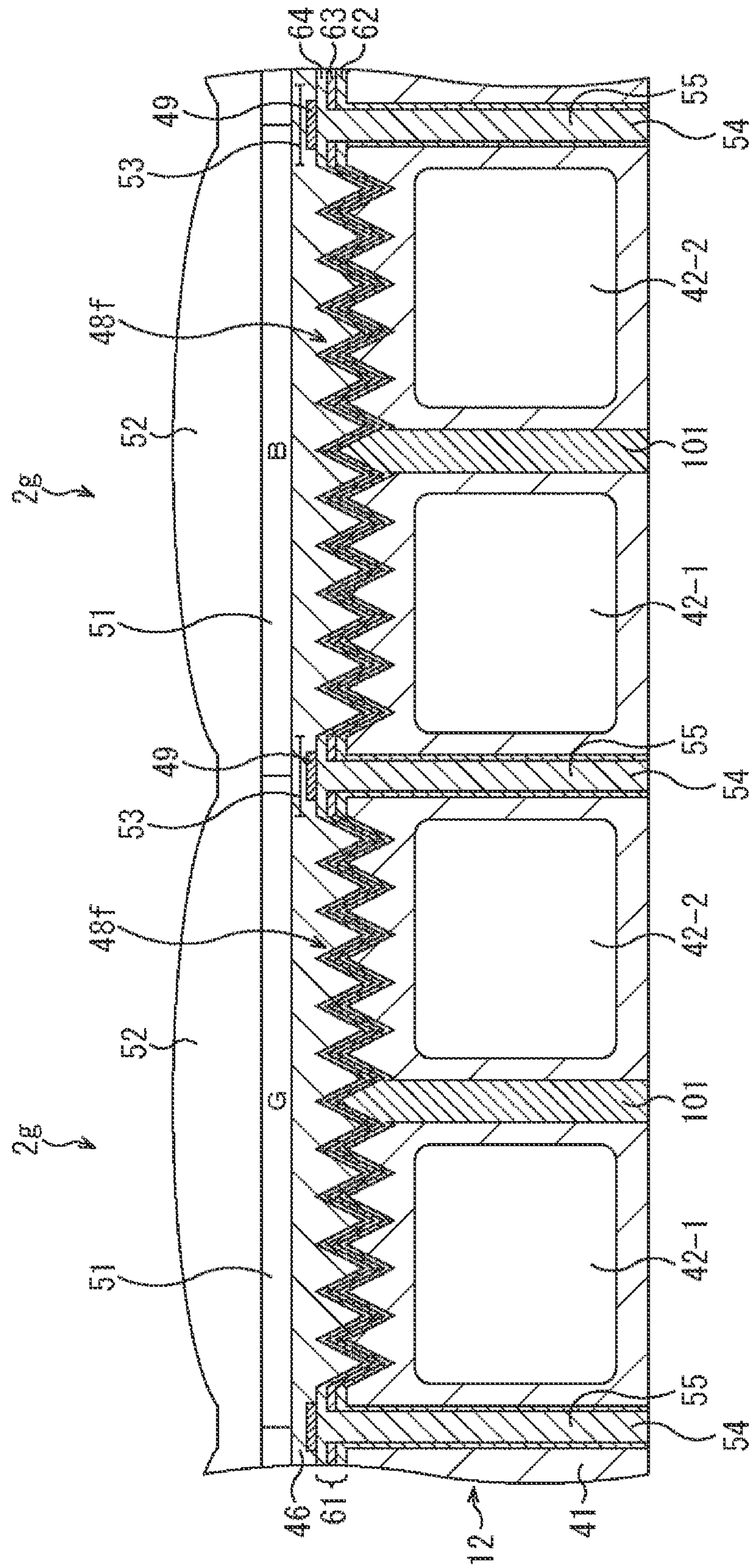
FIG. 27 is a diagram illustrating a cross-sectional configuration example of pixels according to the seventh embodiment.

FIG. 27 is a diagram illustrating a cross-sectional configuration of pixels 2*g* in a seventh embodiment. FIG. 27 illustrates a G pixel on the left side and a B pixel on the right side. In each pixel 2*g*, two PDs 42 are formed under one on-chip lens 52, and an intra-pixel separation portion 101 is formed between the two PDs 42.

Furthermore, inter-pixel separation portions 54 are formed to surround a region including the two PDs 42 and the intra-pixel separation portion 101. In addition, a recessed region 48 is formed over the region including the two PDs 42 and the intra-pixel separation portion 101.

As in the first to sixth embodiments, the formation of the recessed region 48 can improve the sensitivity of the PDs 42. Furthermore, as in the first to sixth embodiments, the formation of the inter-pixel separation portions 54 can prevent light from leaking to the adjacent pixels 2*g* to reduce color mixing. Moreover, the inter-pixel separation portions 54 reflect light, providing the effect of confining the light within the pixel 2*g*.

By the provision of the recessed region 48, incident light is scattered. For example, light incident on the PD 42-1 is scattered and can enter the PD 42-2, decreasing the degree of separation. Therefore, as illustrated in FIG. 28, the recessed region 48 may not be formed on the intra-pixel separation portion 101 to make it flat.

Figure 28:
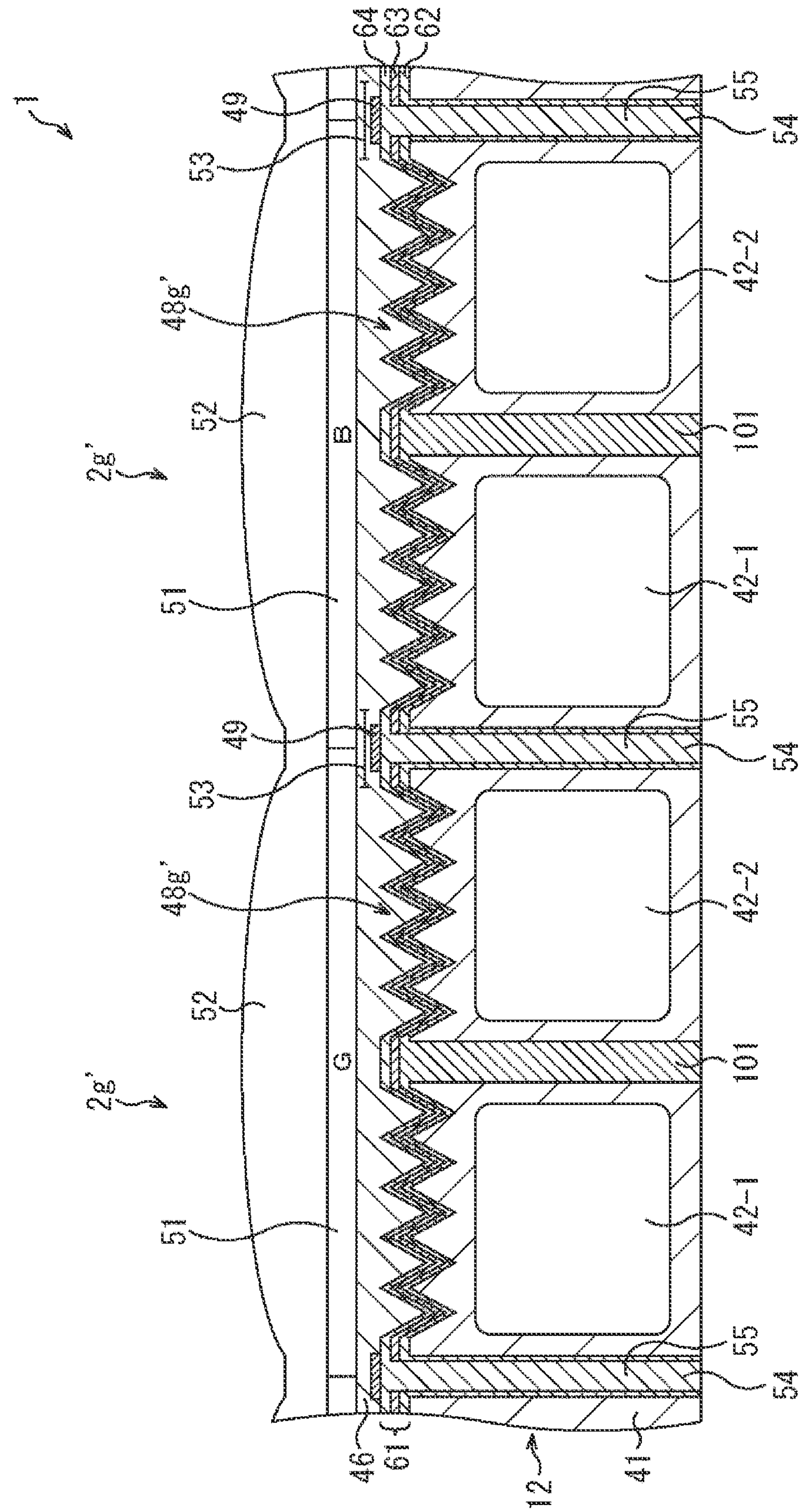
FIG. 28 is a diagram illustrating another cross-sectional configuration example of pixels according to the seventh embodiment.

A recessed region 48*g*' formed in a pixel g' illustrated in FIG. 28 is not formed on the intra-pixel separation portion 101 but is formed in a flat shape. In other words, the recessed region 48*g*' is formed in open regions of the PDs 42, and is not formed in regions other than the open regions.

In this manner, the recessed region 48*g*' may be formed in the open regions of the PDs 42. The degree of separation of the pixel 2*g*' in which the recessed region 48*g*' is formed only in the open regions of the PDs 42 like this is higher than the degree of separation of the pixel 2*g* illustrated in FIG. 27.

Figure 29:
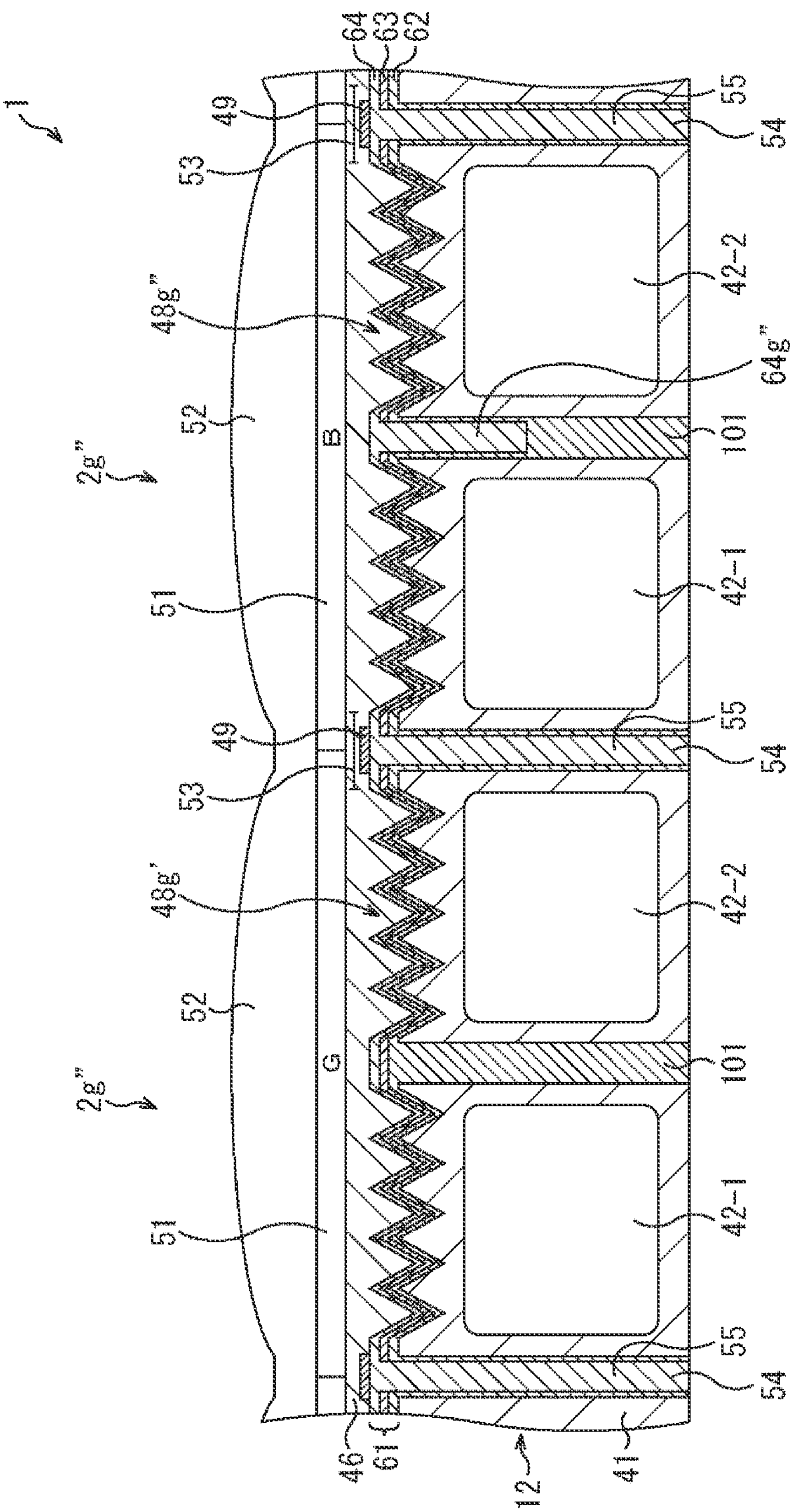
FIG. 29 is a diagram illustrating another cross-sectional configuration example of pixels according to the seventh embodiment.

In order to further enhance the degree of separation, a configuration as illustrated in FIG. 29 may be employed. In a pixel 2*g*" illustrated in FIG. 29, the silicon oxide film 64, which is one of the films constituting a recessed region 48*g*, is formed in the intra-pixel separation portion 101 to enhance the degree of separation.

A G pixel and a B pixel are illustrated in FIG. 29. The G pixel has a configuration similar to that of the pixel 2*g*' illustrated in FIG. 28. The B pixel includes a silicon oxide film 64*g*" formed in the intra-pixel separation portion 101. The silicon oxide film 64 also fills the inter-pixel separation portions 54. The inter-pixel separation portions 54 are provided to prevent light from leaking into adjacent pixels 2*g*.

Thus, by forming the silicon oxide film 64*g*" in the intra-pixel separation portion 101, leakage of light can be prevented between the PD 42-1 and the PD 42-2 placed in the B pixel. Since leakage of light can be prevented between the PD 42-1 and the PD 42-2, the degree of separation can be increased.

FIG. 29 illustrates an example in which the silicon oxide film 64*g*" is formed in the intra-pixel separation portion 101 in the B pixel, and no silicon oxide film 64*g*" is formed in the intra-pixel separation portion 101 in the G pixel. The silicon oxide film 64g" may be formed in pixels corresponding to a color that tends to decrease the degree of separation. In the example illustrated in FIG. 29, since the B pixel tends to be lower in the degree of separation, the silicon oxide film 64g" is formed in the intra-pixel separation portion 101. Since the G pixel does not tend to be lower in the degree of separation than the B pixel, no silicon oxide film 64g" is formed in the intra-pixel separation portion 101 in the illustrated example.

Furthermore, FIG. 29 illustrates an example in which the silicon oxide film 64g" is formed to the middle of the intra-pixel separation portion 101. However, it may be formed to the wiring layer side like the silicon oxide film 64g in the inter-pixel separation portions 54. The degree of separation can be adjusted by the depth of the silicon oxide film 64g" to the middle of the intra-pixel separation portion 101. Specifically, by forming the silicon oxide film 64g" deeper to the middle of the intra-pixel separation portion 101, leakage of light into the adjacent PD 42 can be prevented more to enhance the degree of separation.

Whether or not to form the silicon oxide film 64g" to the middle of the intra-pixel separation portion 101 and how far are set, for example, to ensure a desired degree of separation or more. For example, to ensure a degree of separation of 1.6 or more, the silicon oxide film 64g" is formed in the intra-pixel separation portion 101 in a pixel in which the degree of separation is not 1.6 or more. Furthermore, in formation, the depth to which the silicon oxide film 64g" is formed in the intra-pixel separation portion 101 is set to ensure a degree of separation of 1.6 or more.

In this manner, the silicon oxide film 64g" may be formed to ensure a desired degree of separation, or the silicon oxide film 64g" may be formed in the intra-pixel separation portion 101 in each of the G pixels, B pixels, and R pixels including an R pixel not illustrated.

Further, the shape of the recessed regions 48 may be varied depending on the image height. Here, the description will be continued with the pixels 2g illustrated in FIG. 27 in which the recessed region 48g is formed in each pixel as an example.

Figure 30:
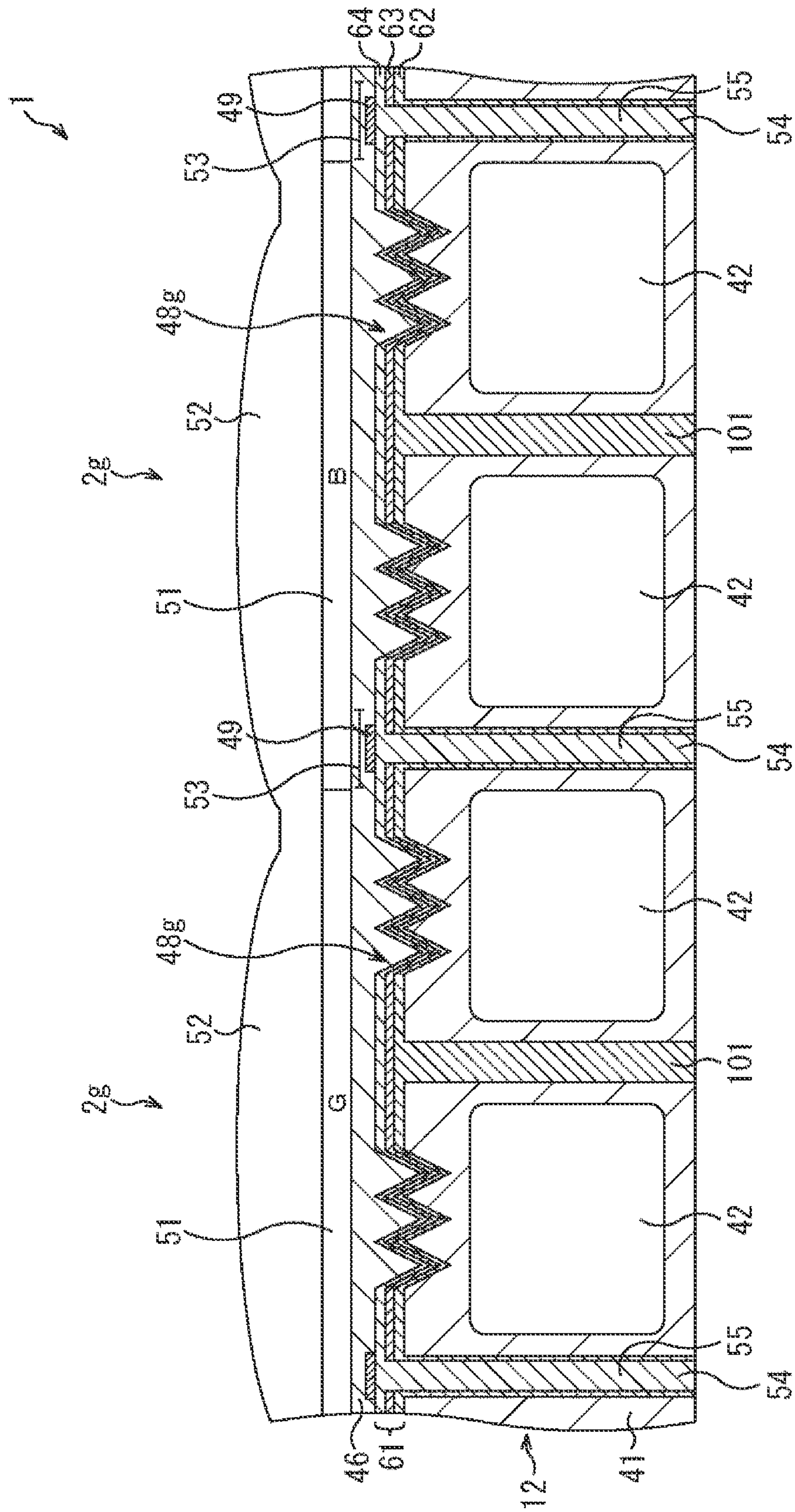
FIG. 30 is a diagram illustrating another cross-sectional configuration example of pixels according to the seventh embodiment.

FIG. 30 is a cross-sectional view of pixels 2g placed on the high image height side. In a case where pixels 2g placed at the image height center are the pixels 2g illustrated in FIG. 27, pixels 2g placed at the high image height may be the pixels 2g illustrated in FIG. 30.

Comparing the pixels 2g illustrated in FIGS. 27 and 30, the number of valleys of the recessed regions 48g in the pixels 2g placed at the image height center illustrated in FIG. 27 is different from the number of valleys of the recessed regions 48g in the pixels 2g placed at the high image height illustrated in FIG. 30. The number of valleys of the recessed region 48g formed above one PD 42 in each pixel 2g placed at the image height center illustrated in FIG. 27 is five, and the number of valleys of the recessed region 48 formed above one PD 42 in each pixel 2g placed at the high image height illustrated in FIG. 30 is three.

In a configuration in which two PDs 42 are provided in one pixel 2g, color mixing between the PDs 42 in the pixel tends to be greater on the high image height side than at the image height center. Increasing the number of valleys of the recessed regions 48g allows light to be scattered more, improving the sensitivity of the PDs 42. However, light scattering can increase color mixing.

As described above, the number of valleys of the recessed regions 48g in the pixels 2g placed on the high image height side may be made smaller than the number of valleys of the recessed regions 48g in the pixels 2g placed at the image height center, to prevent color mixing from increasing on the high image height side.

Although R pixels are not illustrated, the number of valleys of a recessed region 48g in an R pixel placed at the high image height is made smaller than the number of valleys of a recessed region 48g in an R pixel placed at the image height center.

Here, the pixel array 3 is divided into two regions, a region where the number of valleys of the recessed regions 48g is small, and a region where the number of valleys of the recessed regions 48g is large. The number of valleys of the recessed regions 48g may be discrete like this or may be continuous. In a case where the number of valleys of the recessed regions 48g is set continuously, it is gradually decreased with increasing image height.

Such adjustment of the number of valleys of the recessed regions 48f can prevent color mixing.

Figure 31:
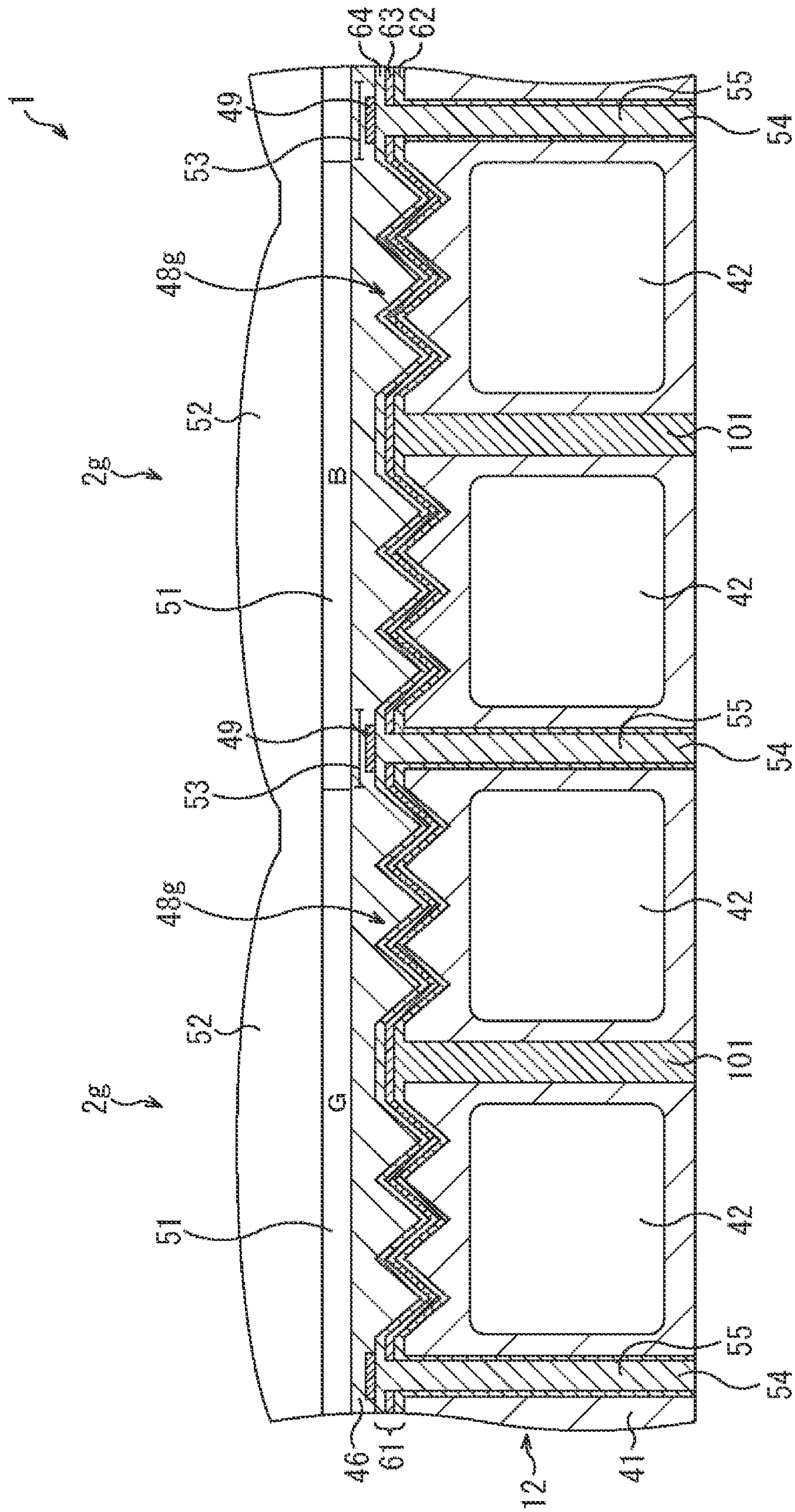
FIG. 31 is a diagram illustrating another cross-sectional configuration example of pixels according to the seventh embodiment.

Furthermore, as illustrated in FIG. 31, a structure in which the size of recesses of recessed regions 48 is changed to prevent color mixing may be used. FIG. 31 is a diagram illustrating another configuration of the pixels 2g placed on the high image height side.

The recessed regions 48g in the pixels 2g illustrated in FIG. 31 are compared with the recessed regions 48g in the pixels 2g illustrated in FIG. 27. Comparing the inclination of a side of one recess (valley) of the recessed regions 48g in the pixels 2g, the inclination of the side of the recess of the recessed regions 48g in the pixels 2g illustrated in FIG. 31 is made gentler than the inclination of the side of the recess of the recessed regions 48g in the pixels 2g illustrated in FIG. 27.

In other words, the recesses of the recessed regions 48g in the pixels 2g illustrated in FIG. 31 are made larger than the recesses of the recessed regions 48g in the pixels 2g illustrated in FIG. 27. By adjusting the size of the recesses, the degree of scattering of light can be reduced or increased. By adjusting the degree of scattering of light, color mixing can be prevented.

Such adjustment of the size of valleys of the recessed regions 48f can prevent color mixing.

Figure 32:
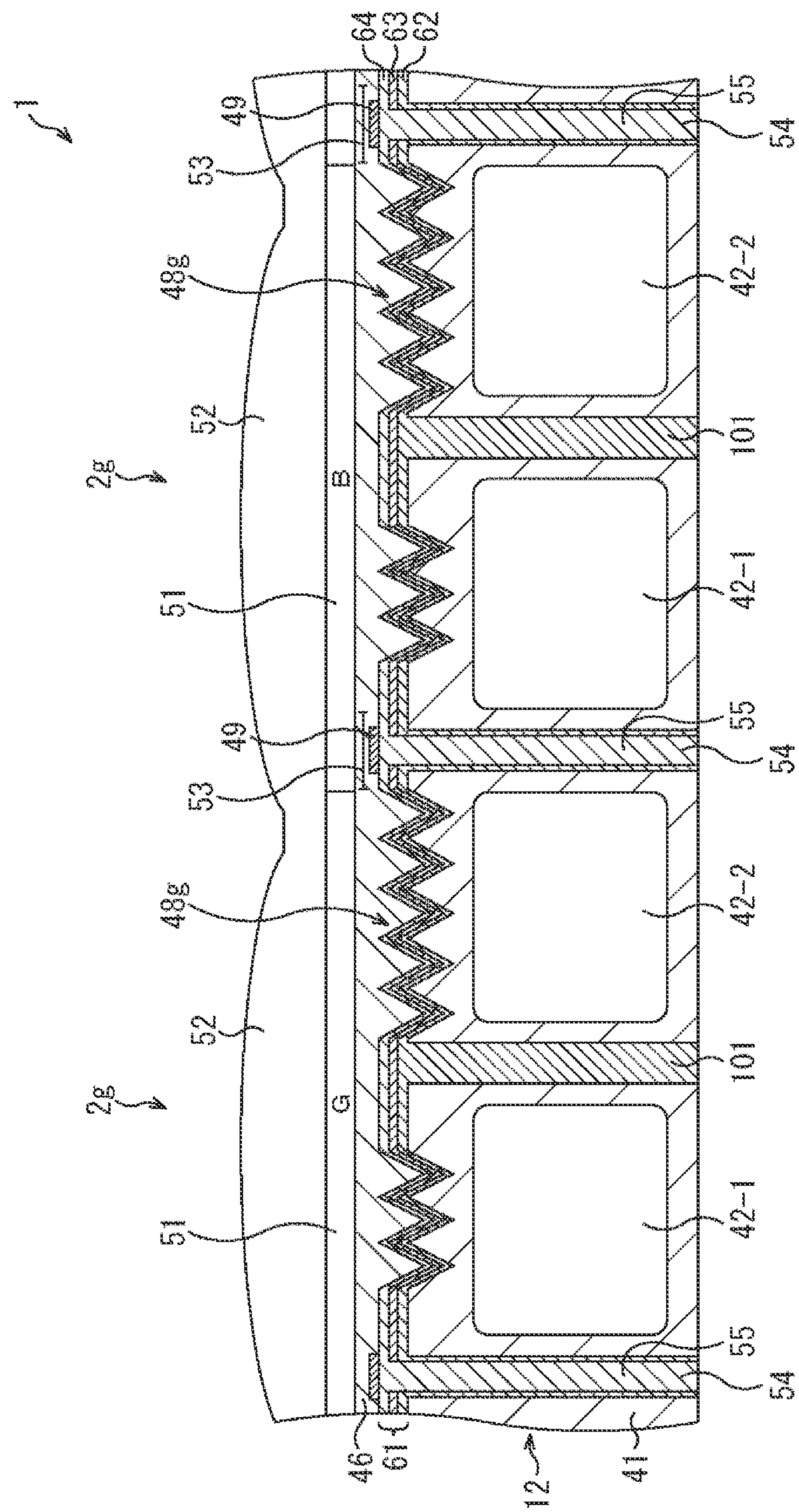
FIG. 32 is a diagram illustrating another cross-sectional configuration example of pixels according to the seventh embodiment.

On the high image height side, a sensitivity difference can occur between the two PDs 42 formed in one pixel 2g. The shape of the recessed regions 48g may be varied within one pixel. For example, as illustrated in FIG. 32, the number of valleys of a recessed region 48g formed above a PD 42-1 in each pixel 2g is made different from the number of valleys of a recessed region 48g formed above a PD 42-2. The number of the valleys of the recessed region 48g formed above the PD 42-1 in each pixel 2g is three, and the number of the valleys of the recessed region 48g formed above the PD 42-2 in each pixel 2g is five.

Comparing the PD 42-1 and the PD 42-2 illustrated in FIG. 32, in a case where the sensitivity of the PD 42-2 is more likely to decrease than that of the PD 42-1, the number of the valleys of the recessed region 48g above the PD 42-2 is made larger than the number of the valleys of the recessed region 48g above the PD 42-1. By forming the recesses like this, even in a case where the sensitivity of the PD 42-2 becomes lower than the sensitivity of the PD 42-1, the sensitivity of the PD 42-2 can be improved to make the sensitivity of the PD 42-1 and the sensitivity of the PD 42-2 match.

Thus, by adjusting the numbers of recesses of recessed regions 48 in one pixel, adjustment may be made to prevent the occurrence of a sensitivity difference between PDs 42 formed in one pixel. Furthermore, here, the case of adjusting the numbers of recesses has been described as an example, but, as described with reference to FIG. 31, the sizes of recesses may be adjusted to prevent the occurrence of a sensitivity difference between PDs 42.

Thus, by providing the recessed regions 48 in pixels each having two PDs therein, light can also be more efficiently collected in the PDs 42, and photoelectric conversion efficiency can be improved. Further, by adjusting the shape (the number of valleys) of recessed regions 48 depending on the color and/or the image height, sensitivity can be made uniform, and color mixing can be reduced.

Eighth Embodiment

The pixels 2*a* to 2*c* in the first to third embodiments can also be applied to pixels that detect a phase difference. A phase difference is detected, for example, to perform autofocus (AF).

Figure 33:
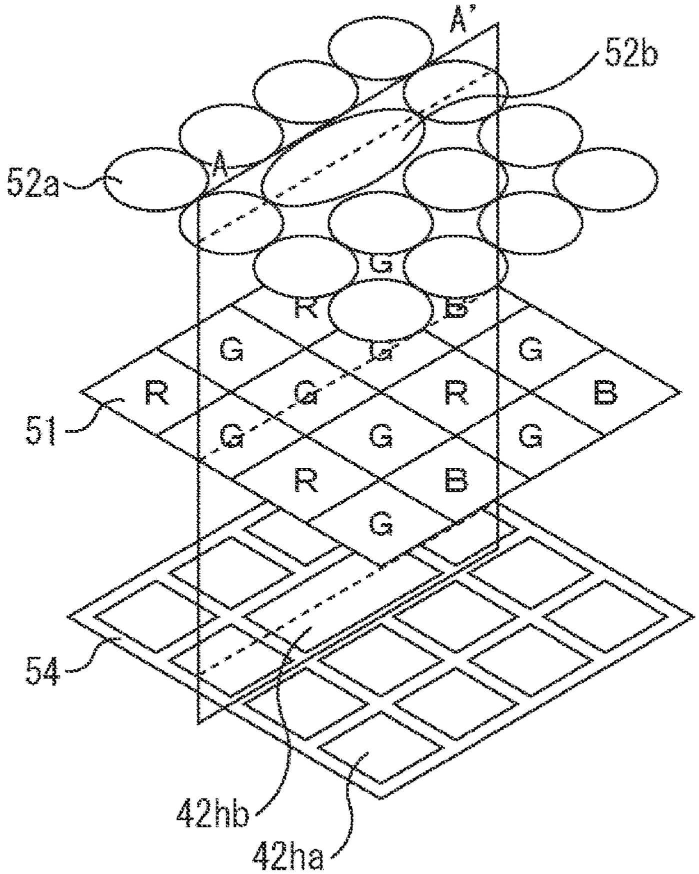
FIG. 33 is a diagram for explaining a pixel arrangement of the pixel array in an eighth embodiment.
Figure 34:
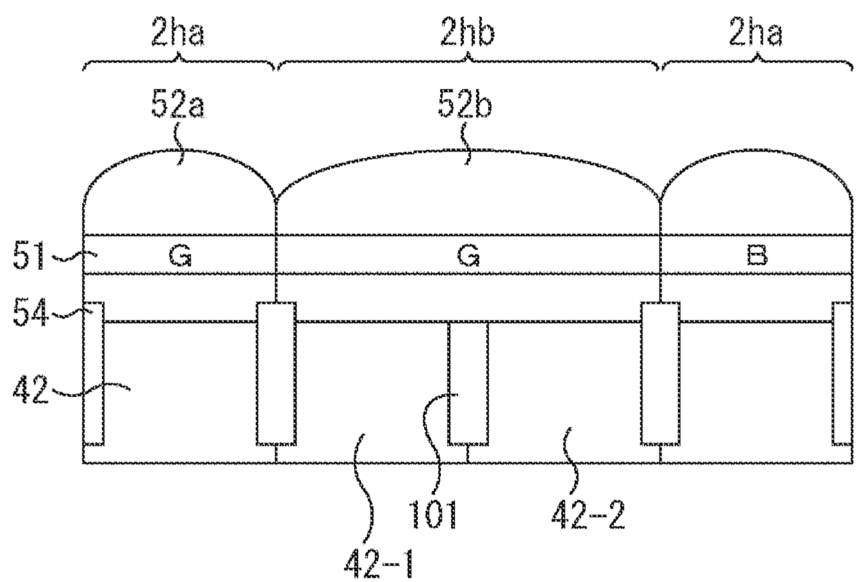
FIG. 34 is a diagram illustrating a cross-sectional configuration example of conventional pixels corresponding to pixels in the eighth embodiment.

With reference to FIGS. 33 and 34, a pixel for detecting a phase difference in which one on-chip lens is placed for two pixels will be described. FIG. 33 is a perspective schematic diagram illustrating a range of sixteen (=4×4) pixels extracted in a solid-state imaging device, of which two pixels constitute a pixel 2*hb* for phase difference detection, and the other fourteen pixels are normal pixels 2*ha*.

FIG. 34 is a cross-sectional view of pixels 2*h* taken along line A-A' illustrated in FIG. 33. FIG. 34 illustrates normal pixels 2*ha* and the pixel 2*hb* for phase difference detection to which the present technology is not applied.

Of the pixels 2*h*, a pixel 2*h* for detecting a phase difference is described as a pixel 2*hb*, and pixels other than the pixel 2*hb* (normal pixels) are described as pixels 2*ha*. The normal pixels 2*ha* may be, for example, pixels having a configuration equivalent to that of the pixels 2*a* to 2*c* in the first to third embodiments.

In the pixel 2*hb* for phase difference detection, under one on-chip lens 52*b*, a color filter of one color, a G filter in FIG. 34, is placed, and two PDs 42-1 and 42-2 are placed. The intra-pixel separation portion 101 is formed between the PD 42-1 and the PD 42-2.

When a pixel located between inter-pixel separation portions 54 is defined as one pixel, one pixel is divided into two PDs 42-1 and 42-2. The intra-pixel separation portion 101 is formed between the PD 42-1 and the PD 42-2. The intra-pixel separation portion 101 is formed by forming a P-type or N-type region by ion implantation, for example.

This configuration of the pixel 2*hb* for phase difference detection is similar to that of the pixels 2 illustrated in FIGS. 25A and 25B. As described with reference to FIGS. 25A and 25B, the pixel 2*hb* for phase difference detection can separately receive light coming from a left part and light coming from a right part.

The PD 42-1 and the PD 42-2 separately receive light coming from a left part and light coming from a right part, so that a focus position can be detected as described with reference to FIG. 26.

Figure 35:
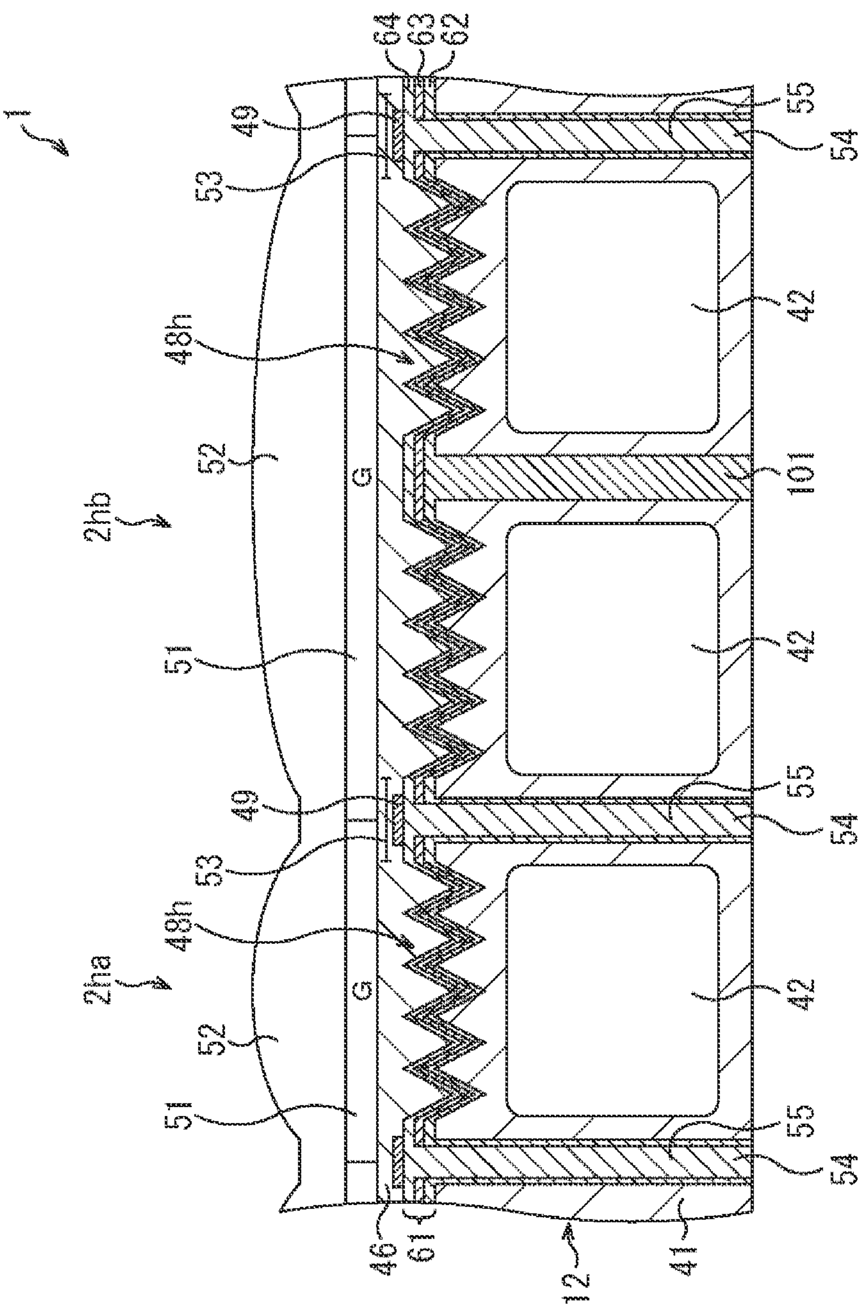
FIG. 35 is a diagram illustrating a cross-sectional configuration example of pixels according to the eighth embodiment.

The formation of recessed regions 48 can improve sensitivity. As illustrated in FIG. 35, by forming recessed regions 48 for the normal pixel 2*ha* and the pixel 2*hb* for phase difference detection, sensitivity can be further improved.

FIG. 35 illustrates a G pixel on the left side and a G pixel on the right side. Like the pixel 2*h* illustrated in FIG. 34, in the pixel 2*hb* for phase difference detection, two PDs 42 are formed under one on-chip lens 52*b*, and an intra-pixel separation portion 101 is formed between the two PDs 42.

Furthermore, inter-pixel separation portions 54 are formed to surround a region including the two PDs 42 and the intra-pixel separation portion 101. In addition, a recessed region 48 is formed over the region including the two PDs 42 and the intra-pixel separation portion 101.

As in the first to seventh embodiments, the formation of the recessed region 48 can improve the sensitivity of the PDs 42. Furthermore, as in the first to seventh embodiments, the formation of the inter-pixel separation portions 54 can prevent light from leaking to the adjacent pixels 2*h* to reduce color mixing. Moreover, the inter-pixel separation portions 54 reflect light, providing the effect of confining the light within the pixel 2*h*.

By the provision of the recessed region 48, incident light is scattered. For example, light incident on the PD 42-1 is scattered and can enter the PD 42-2, decreasing the degree of separation. Therefore, as illustrated in FIG. 35, the recessed region 48 may not be formed on the intra-pixel separation portion 101 to make it flat.

Referring again to FIG. 35, the recessed region 48*h* formed in the pixel 2*hb* is not formed on the intra-pixel separation portion 101 but is formed in a flat shape. In other words, the recessed region 48*h* is formed in open regions of the PDs 42, and is not formed in regions other than the open regions. In this manner, the recessed region 48*h* may be formed in the open regions of the PDs 42.

Figure 36:
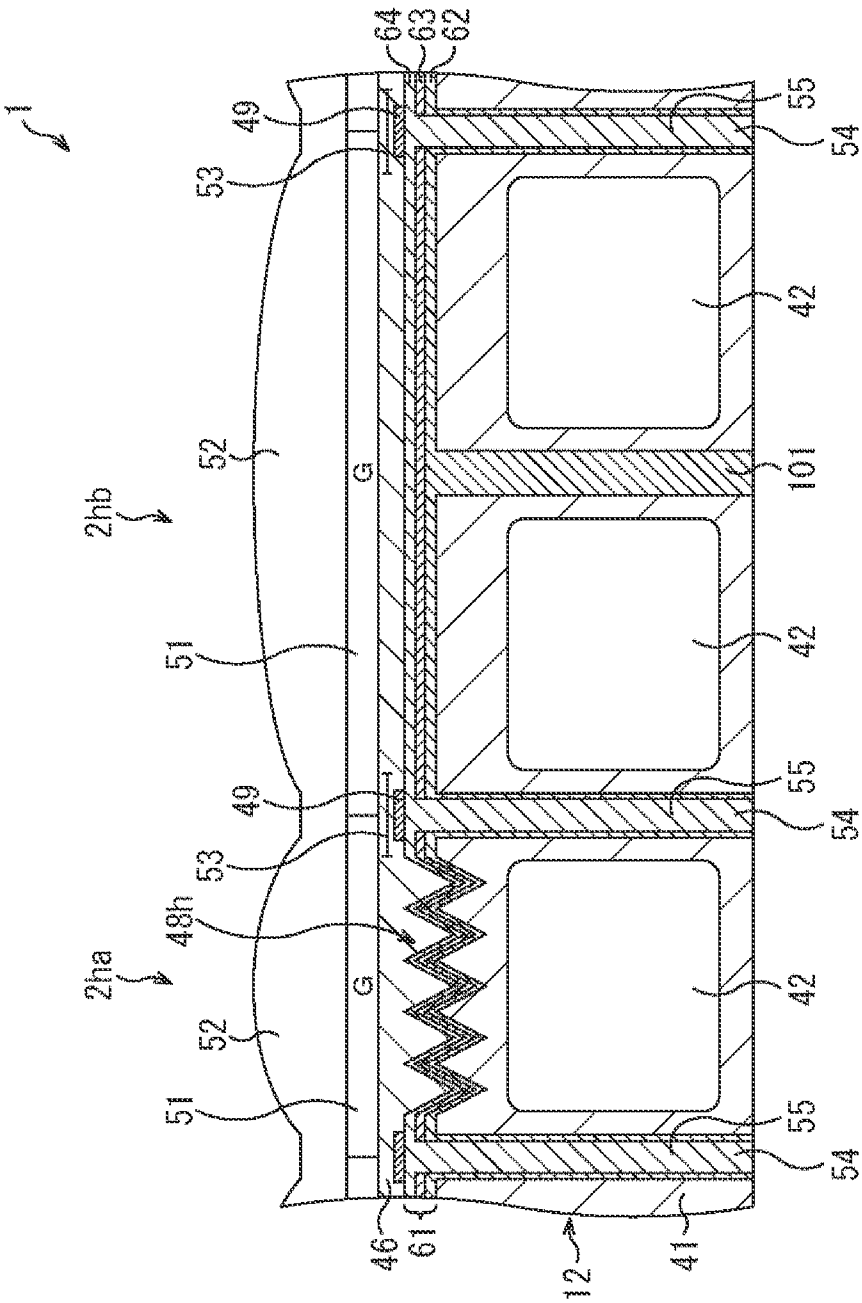
FIG. 36 is a diagram illustrating another cross-sectional configuration example of pixels according to the eighth embodiment.

As described with reference to FIG. 35, the recessed region 48*h* may be formed in each pixel 2*h* arranged in the pixel array 3. Alternatively, as illustrated in FIG. 36, the recessed region 48*h* may be formed in the normal pixel 2*ha*, and no recessed region 48*h* may be formed in the pixel 2*hb* for phase difference detection.

Furthermore, for the pixels 2*h* placed at the image height center, as illustrated in FIG. 35, the recessed regions 48*h* may be formed in both the normal pixel 2*ha* and the pixel 2*hb* for phase difference detection. For the pixels 2*h* placed at the high image height, as illustrated in FIG. 36, the recessed region 48*h* may be formed in the normal pixel 2*ha*, and no recessed region 48*h* may be formed in the pixel 2*hb* for phase difference detection. That is, the recessed region 48*h* may be formed in the pixel 2*hb* for phase difference detection depending on the image height.

Furthermore, the shape of the recessed region 48*h* may be varied (the number of valleys may be varied) depending on the image height. As described with reference to FIG. 11, the pixel array 3 is divided into the three regions. The region A is the image height center of the pixel array 3. The region B is the middle-image-height region of the pixel array 3. The region C is the high-image-height region of the pixel array 3.

Here, the description will be continued with a case as an example where recessed regions 48*h* are formed in the normal pixels 2*ha* regardless of the image height, and the recessed regions 48*h* have the same shape. However, as is the case with the pixel 2*hb* for phase difference detection, the shape of the recessed regions 48*h* may be varied depending on the image height.

In a pixel 2*hb* for phase difference detection placed in the region A, a recessed region 48*h* is formed as illustrated in FIG. 35. Furthermore, the number of recesses of the recessed region 48*h* formed above one PD 42 is five in the example illustrated in FIG. 35.

Figure 37:
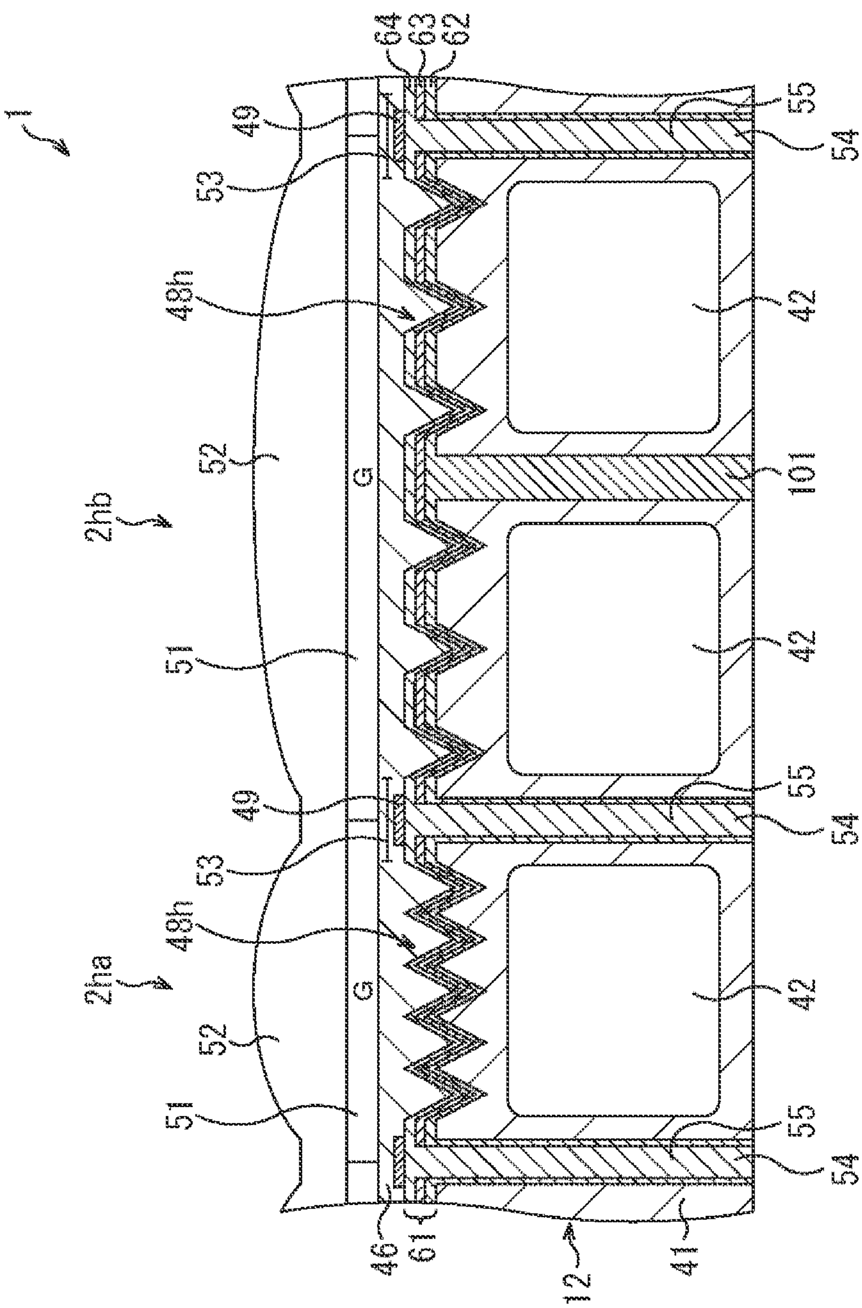
FIG. 37 is a diagram illustrating another cross-sectional configuration example of pixels according to the eighth embodiment.

FIG. 37 is a cross-sectional view of pixels 2*h* placed in the region B (at the medium image height). As illustrated in FIG. 37, a recessed region 48*h* is formed in a pixel 2*hb* for phase difference detection placed in the region B. Furthermore, the number of recesses of the recessed region 48*h* formed above one PD 42 is three in the example illustrated in FIG. 37.

Figure 38:
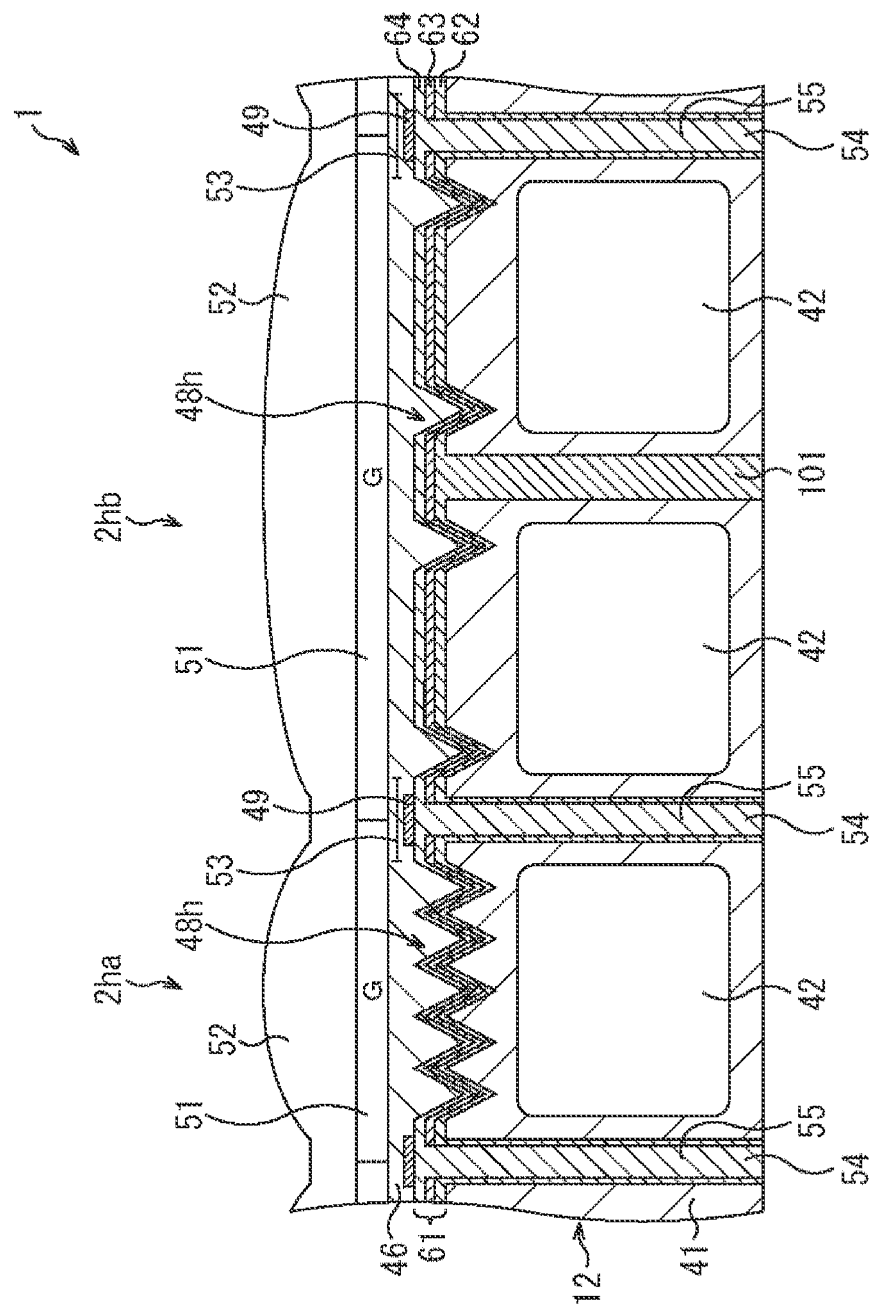
FIG. 38 is a diagram illustrating another cross-sectional configuration example of pixels according to the eighth embodiment.

FIG. 38 is a cross-sectional view of pixels 2*h* placed in the region C (at the high image height). As illustrated in FIG. 38, a recessed region 48*h* is formed in a pixel 2*hb* for phase difference detection placed in the region C. Furthermore, the number of recesses of the recessed region 48*h* formed above one PD 42 is two in the example illustrated in FIG. 38.

Comparing the pixels 2*hb* for phase different detection illustrated in FIGS. 35, 37, and 38 with each other, the number of valleys of the recessed region 48*h* in the pixel 2*hb* for phase difference detection illustrated in FIG. 35, the number of valleys of the recessed region 48*h* in the pixel 2*hb* for phase difference detection illustrated in FIG. 37, and the number of valleys of the recessed region 48*h* in the pixel 2*hb* for phase difference detection illustrated in FIG. 38 are different numbers.

As described above, since color mixing tends to increase with increasing image height, the number of valleys of the recessed regions 48 is made smaller toward the high image height side in order to reduce color mixing at the pixels 2*hb* for phase difference detection placed on the high image height side where color mixing increases.

Here, the pixel array 3 is divided into the three regions. The number of recesses of the recessed regions 48*h* may be discrete, such as five, three, and two, or may be continuous. In a case where the number of valleys of the recessed regions 48*h* is set continuously, it is gradually decreased with increasing image height.

Such adjustment of the number of valleys of the recessed regions 48*h* can reduce color mixing that can occur due to the formation the recessed regions 48*h*. Thus, in the pixel 2*hb* for phase difference detection, the recessed region 48*h* can be formed to prevent a reduction in the degree of separation.

On the high image height side, a sensitivity difference can occur between the two PDs 42 formed in the pixel 2*hb* for phase difference detection. The shape of the recessed region 48*h* may be varied in a pixel for phase difference detection. For example, as illustrated in FIGS. 39A and 39B, the recessed region 48*h* may be formed above one of the PD 42-1 and the PD 42-2 and may not be formed above the other.

Figure 39A:
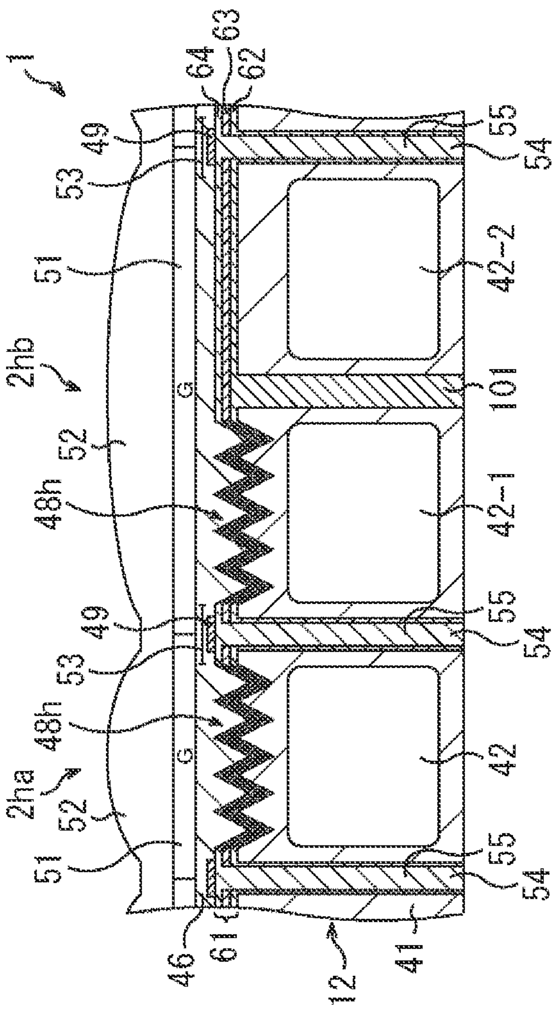
FIGS. 39A and 39B are diagrams illustrating another cross-sectional configuration example of pixels according to the eighth embodiment.

FIG. 39A illustrates a case where the recessed region 48*h* is formed above the PD 42-1 that receives light from the left direction, and no recessed region 48*h* is formed above the PD 42-2 that receives light from the right direction. Comparing the PD 42-1 and the PD 42-2 illustrated in FIG. 39A, in a case where the sensitivity of the PD 42-1 is more likely to decrease than that of the PD 42-2, the recessed region 48*h* is formed above the PD 42-1, and no recessed region 48*h* is formed above the PD 42-2. By forming the recessed region 48*h* like this, even in a case where the sensitivity of the PD 42-1 becomes lower than the sensitivity of the PD 42-2, the sensitivity of the PD 42-1 can be improved to make the sensitivity of the PD 42-1 and the sensitivity of the PD 42-2 match.

Figure 39B:
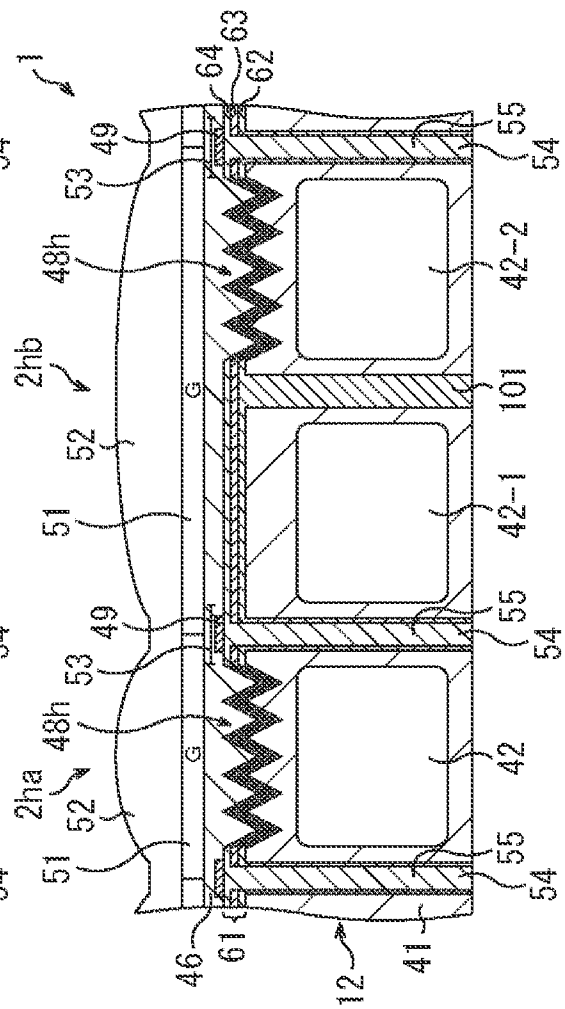

FIG. 39B illustrates a case where no recessed region 48*h* is formed above the PD 42-1 that receives light from the left direction, and the recessed region 48*h* is formed above the PD 42-2 that receives light from the right direction. Comparing the PD 42-1 and the PD 42-2 illustrated in FIG. 39B, in a case where the sensitivity of the PD 42-2 is more likely to decrease than that of the PD 42-1, the recessed region 48*h* is formed above the PD 42-2, and no recessed region 48*h* is formed above the PD 42-1. By forming the recessed region 48*h* like this, even in a case where the sensitivity of the PD 42-2 becomes lower than the sensitivity of the PD 42-1, the sensitivity of the PD 42-2 can be improved to make the sensitivity of the PD 42-1 and the sensitivity of the PD 42-2 match.

By thus adjusting sensitivity by forming or not forming the recessed region 48 within the pixel 2*hb* for phase difference detection, adjustment may be made to prevent the occurrence of a sensitivity difference between the two PDs 42.

Further, the number of recesses of the recessed region 48 may be adjusted depending on the image height. A cross-sectional view of pixels 2*h* illustrated in FIGS. 40A and 40B illustrate an example of a case where a recessed region 48*h* is formed above one of the PD 42-1 and the PD 42-2 in a pixel for phase difference detection and is not formed above the other, and a case where, on the high image height side, the number of recesses of the recessed region 48*h* is changed depending on the image height as described with reference to FIGS. 35, 37, and 38.

Figure 40A:
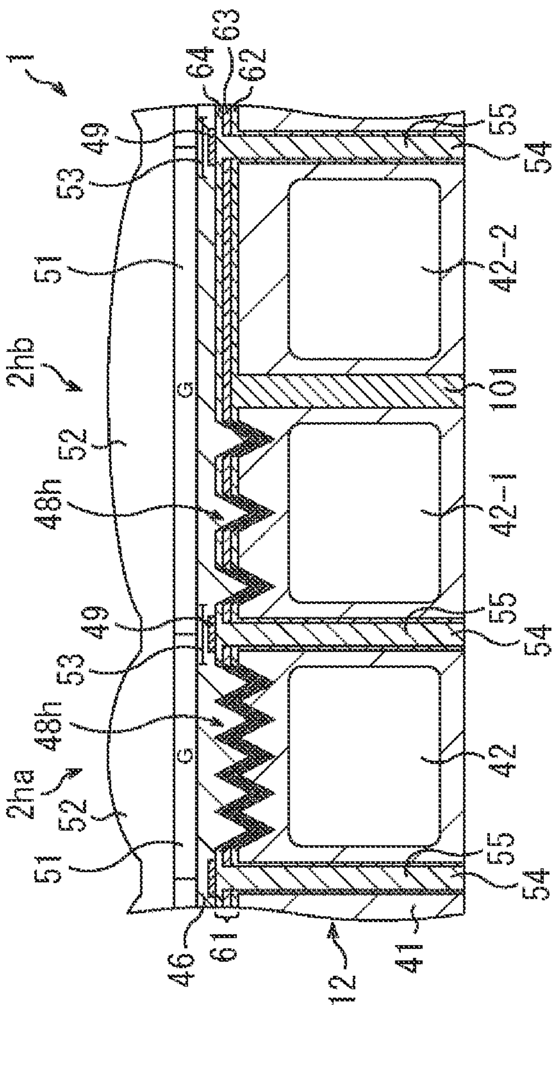
FIGS. 40A and 40B are diagrams illustrating another cross-sectional configuration example of pixels according to the eighth embodiment.

In the pixel 2*hb* for phase difference detection illustrated in FIG. 40A, a recessed region 48*h* is formed above the PD 42-1, and three recesses are formed in the recessed region 48*h*. The pixels 2*h* illustrated in FIG. 40A may be placed on the high image height side, and the pixels 2*h* illustrated in FIG. 39A may be placed on the image height center side.

Figure 40B:
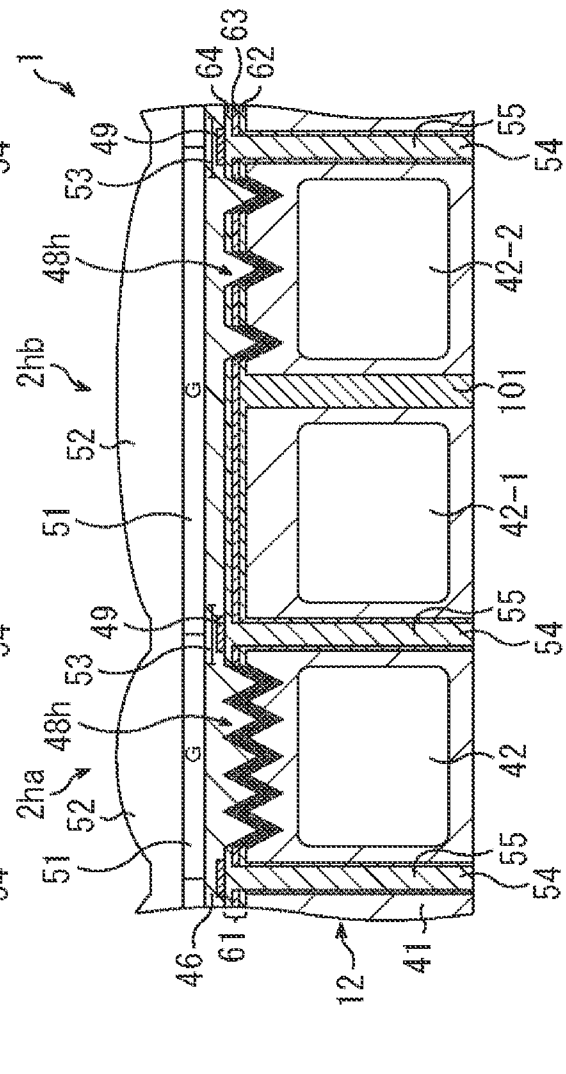

In the pixel 2*hb* for phase difference detection illustrated in FIG. 40B, a recessed region 48*h* is formed above the PD 42-2, and three recesses are formed in the recessed region 48*h*. The pixels 2*h* illustrated in FIG. 40B may be placed on the high image height side, and the pixels 2*h* illustrated in FIG. 39B may be placed on the image height center side.

In this manner, by adjusting sensitivity by forming or not forming the recessed region 48 within the pixel 2*hb* for phase difference detection, and further adjusting the number of recesses depending on the image height, adjustment may be made to prevent the occurrence of a sensitivity difference between the two PDs 42.

Thus, by providing the recessed region 48 in a pixel having two PDs under one on-chip lens as a pixel for phase difference detection, light can also be more efficiently collected in the PDs 42, and photoelectric conversion efficiency can be improved. Further, by adjusting the shape (the number of valleys) of the recessed region 48 depending on the image height, sensitivity can be made uniform, and color mixing can be reduced.

Ninth Embodiment

As a ninth embodiment, another configuration of the pixels 2*h* in the eighth embodiment will be described.

Figure 41:
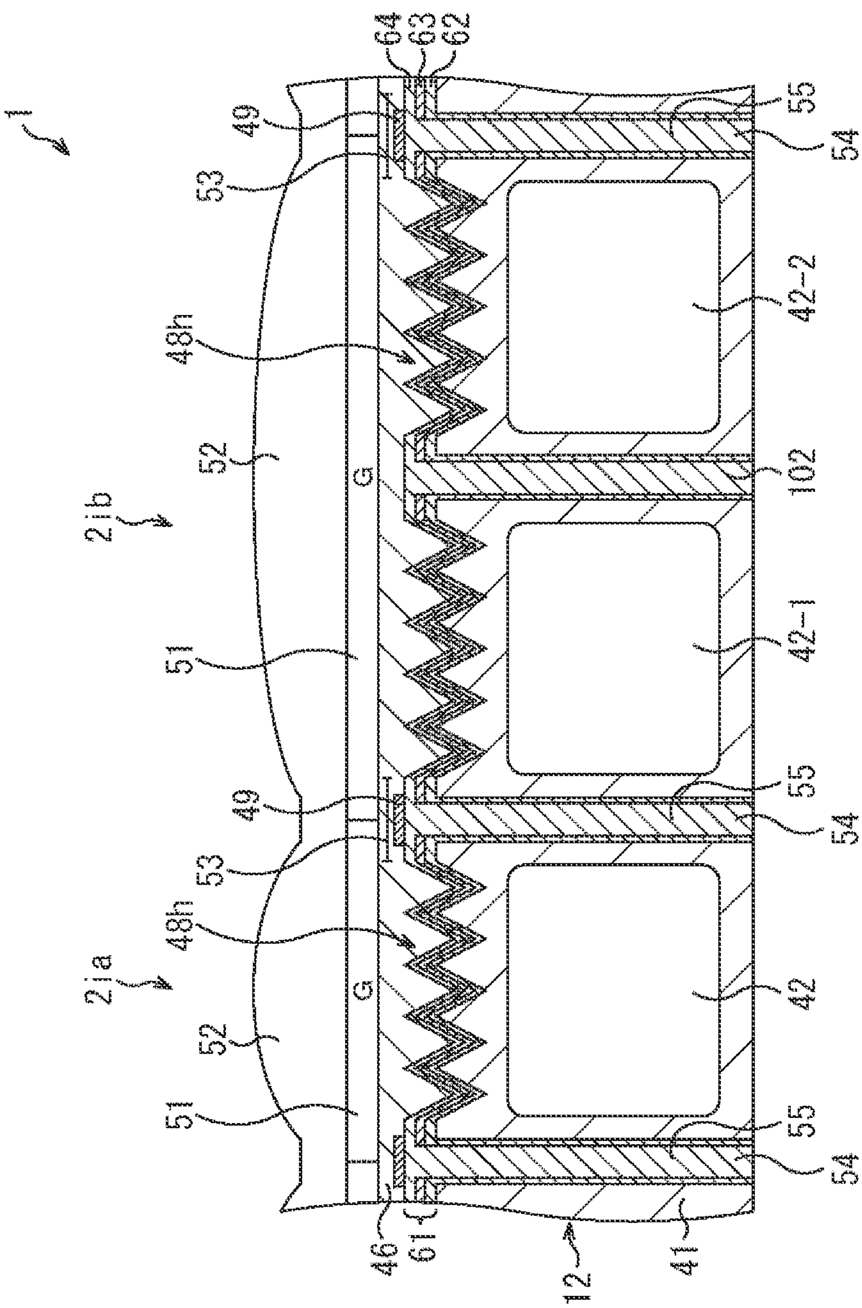
FIG. 41 is a diagram illustrating a cross-sectional configuration example of pixels according to a ninth embodiment.

FIG. 41 illustrates a cross-sectional configuration example of pixels 2*i* in the ninth embodiment. The pixels 2*h* illustrated in FIG. 35 are compared with the pixels 2*i* illustrated in FIG. 41. The pixel 2*hb* for phase difference detection illustrated in FIG. 35 includes the two PDs 42. The two PDs 42 are separated by the intra-pixel separation portion 101 formed in the P-type (or N-type) semiconductor region by ion implantation or the like. The pixels 2*i* illustrated in FIG. 41 are different in that the intra-pixel separation portion 101 has a configuration similar to that of the inter-pixel separation portions 54.

For the pixels 2*i* illustrated in FIG. 41, in a pixel 2*ib* for phase difference detection, one on-chip lens 52*ib* is also formed over two PDs 42. Furthermore, the pixel 2*ib* for phase difference detection includes a PD 42-1 and a PD 42-2. An intra-pixel separation portion 102 is formed therebetween. The intra-pixel separation portion 102 has a configuration similar to that of the inter-pixel separation portions 54.

By thus separating the PD 42-1 and the PD 42-2 by the intra-pixel separation portion 102, light leakage between the PD 42-1 and the PD 42-2 can be prevented, and color mixing can be reduced.

The basic configuration of the pixels 2*i* illustrated in FIG. 41 is similar to that of the pixels 2*h* described as the eighth embodiment. Thus, what is described as the eighth embodiment can also be applied to the pixels 2*i* in the ninth embodiment as appropriate.

For example, the pixels 2*i* illustrated in FIG. 41 can be applied to all the pixels 2 arranged in the pixel array 3. That is, recessed regions 48 may be formed in all of the normal pixels 2*ia* and the pixels 2*ib* for phase difference detection arranged in the pixel array 3.

Furthermore, as described with reference to FIGS. 35 and 36, recessed regions 48 may be formed depending on the image height. For example, for the pixels placed at the image height center, as described with reference to FIG. 35, recessed regions 48 may be formed in both the normal pixel 2*ia* and the pixel 2*ib* for phase difference detection. For the pixels placed at the high image height, as described with reference to FIG. 36, a recessed region 48 may be formed in the normal pixel 2*ia*, and no recessed region 48 may be formed in the pixel 2*ib* for phase difference detection.

Further, as described with reference to FIGS. 35, 37, and 38, the number of recesses of the recessed regions 48 may be varied depending on the image height. Furthermore, as described with reference to FIGS. 39A and 39B, a recessed region 48 may be formed above one of the PD 42-1 and the PD 42-2, and may not be formed above the other. Moreover, as described with reference to FIGS. 40A and 40B, a recessed region 48 may be formed above one of the PD 42-1 and the PD 42-2, and may not be formed above the other, and the number of recesses of the recessed region 48 may be varied depending on the image height.

For the pixels 2*i* in the ninth embodiment, an on-chip lens 52*b* covering two pixels is formed for the pixel 2*ib* for phase difference detection, whereas an on-chip lens 52*a* covering one pixel is formed for the normal pixel 2*ia*. Referring again to FIG. 33, the on-chip lens 52*b* on the pixel for phase difference detection is formed in an elliptical shape, whereas the on-chip lenses 52*a* on the normal pixels are formed in a circular shape.

Furthermore, it is preferable that the on-chip lenses 52*a* formed around the on-chip lens 52*b* on the pixel for phase difference detection and the on-chip lenses 52*a* around which the on-chip lenses 52*a* on the normal pixels are formed have the same shape, but may not necessarily have the same shape.

The on-chip lenses 52*a* formed around the on-chip lens 52*b* on the pixel for phase difference detection may have a difference in shape as compared with the on-chip lenses 52 on the other pixels. Due to such a difference in shape, light collection cannot be performed properly, and light can leak into adjacent pixels.

Figure 42:
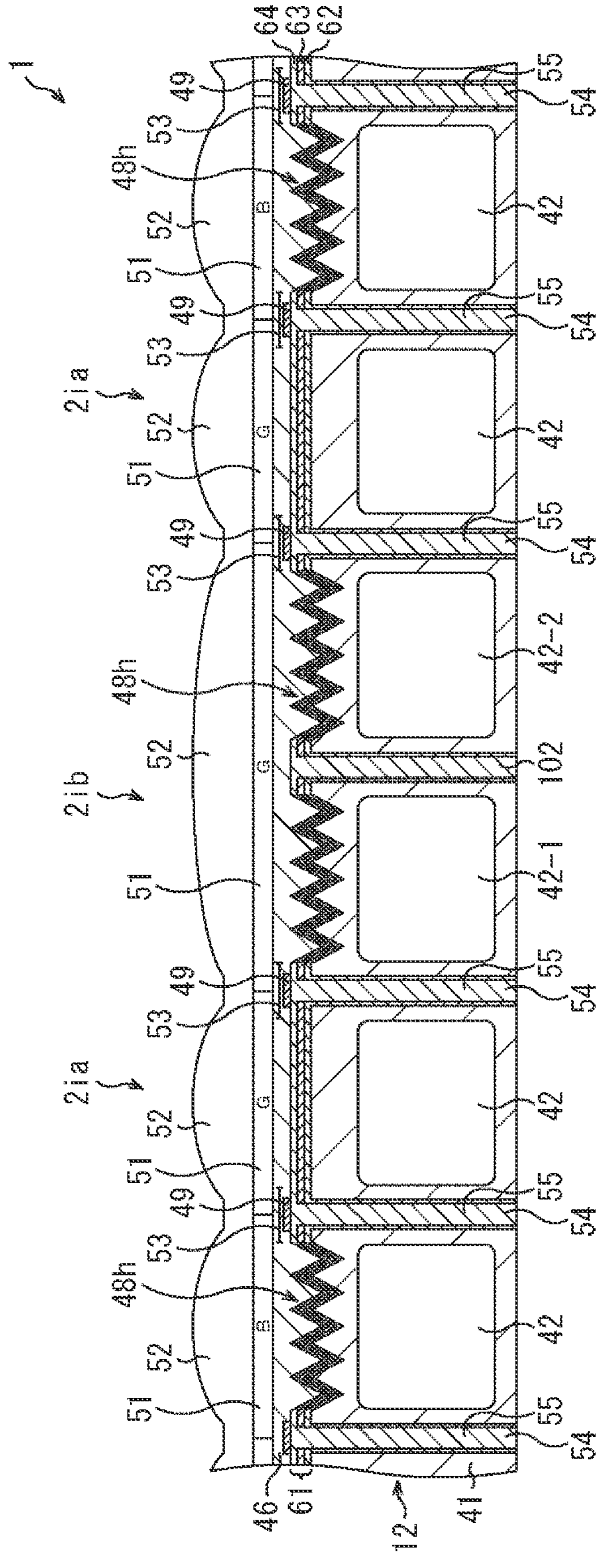
FIG. 42 is a diagram illustrating another cross-sectional configuration example of pixels according to the ninth embodiment.

As illustrated in FIG. 42, no recessed regions 48*i* may be formed in the normal pixels 2*ia* placed around the pixel 2*ib* for phase difference detection. FIG. 42 illustrates five pixels including the pixel 2*ib* for phase difference detection among the pixels arranged in the pixel array 3.

A recessed region 48*i* is formed in the pixel 2*ib* for phase difference detection. No recessed regions 48*i* are formed in the normal pixels 2*ia* adjacent to the pixel 2*ib* for phase difference detection. Furthermore, recessed regions 48*i* are formed in normal pixels 2*ia* adjacent to the normal pixels 2*ia* in which no recessed regions 48*i* are formed.

Thus, the recessed regions 48*i* may be formed except in the normal pixels 2*ia* adjacent to the pixel 2*ib* for phase difference detection, and no recessed regions 48*i* may be formed in the normal pixels 2*ia* adjacent to the pixel 2*ib* for phase difference detection. Such a configuration can also be applied to the pixels 2*h* in the eighth embodiment.

FIG. 42 illustrates the configuration in which no recessed regions 48*i* are formed in the normal pixels 2*ia* adjacent to the pixel 2*ib* for phase difference detection. However, a recessed region 48*i* may be formed or may not be formed depending on the light incident direction.

Figure 43:
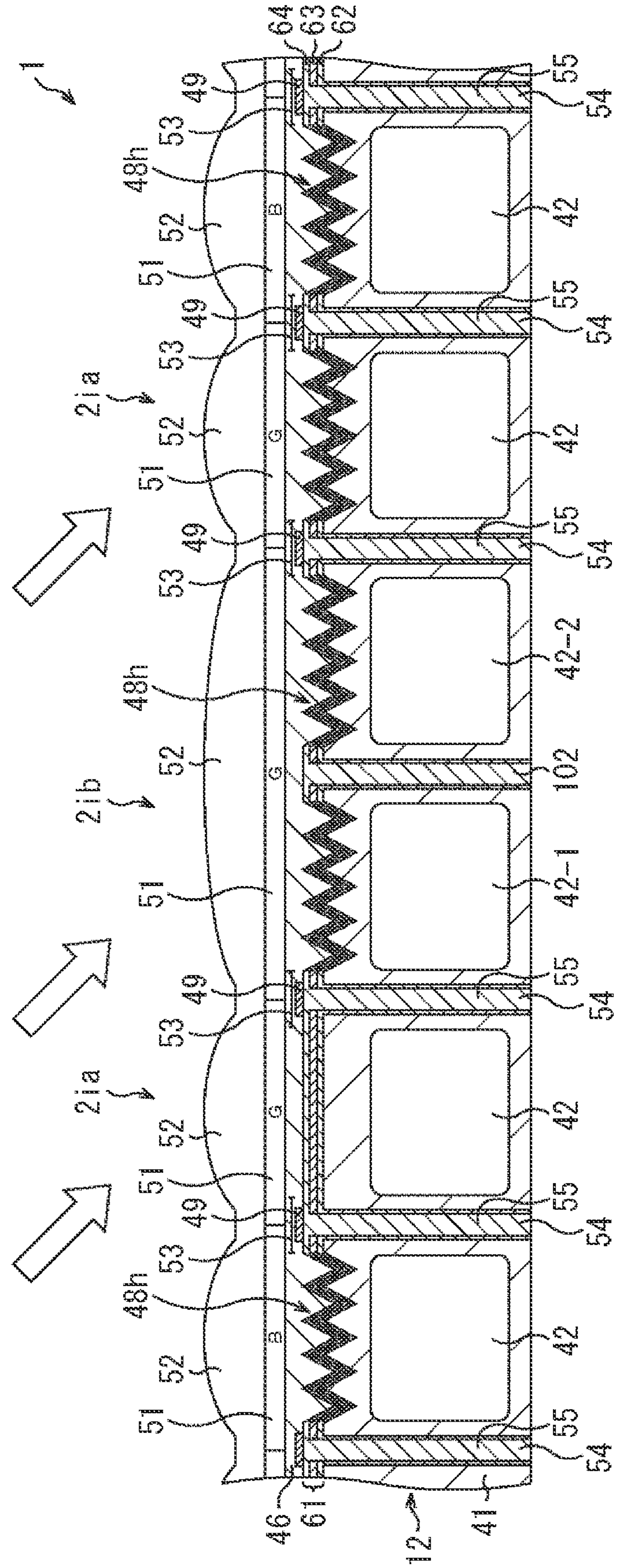
FIG. 43 is a diagram illustrating another cross-sectional configuration example of pixels according to the ninth embodiment.

For example, as illustrated in FIG. 43, for pixels 2*i* placed at positions where light enters from the left side in the figure, no recessed region 48*i* is formed in the normal pixel 2*ia* placed on the left side of the pixel 2*ib* for phase difference detection, but a recessed region 48*i* is formed in the normal pixel 2*ia* placed on the right side.

In this case, since light enters from the left side, it is considered to be likely to be affected by the pixel located on the left side. Therefore, no recessed region 48*i* is formed in the normal pixel 2*ia* placed on the left side of the pixel 2*ib* for phase difference detection, to prevent color mixing.

In this manner, the presence or absence of a recessed region 48*i* may be set depending on the direction of color mixing. In addition, the direction of color mixing may depend on the image height, and thus the presence or absence of a recessed region 48*i* may be set depending on the image height.

Tenth Embodiment

The pixels 2*a* to 2*c* in the first to third embodiments can also be applied to pixels that detect a phase difference. A phase difference is detected, for example, to perform autofocus (AF).

Figure 44:
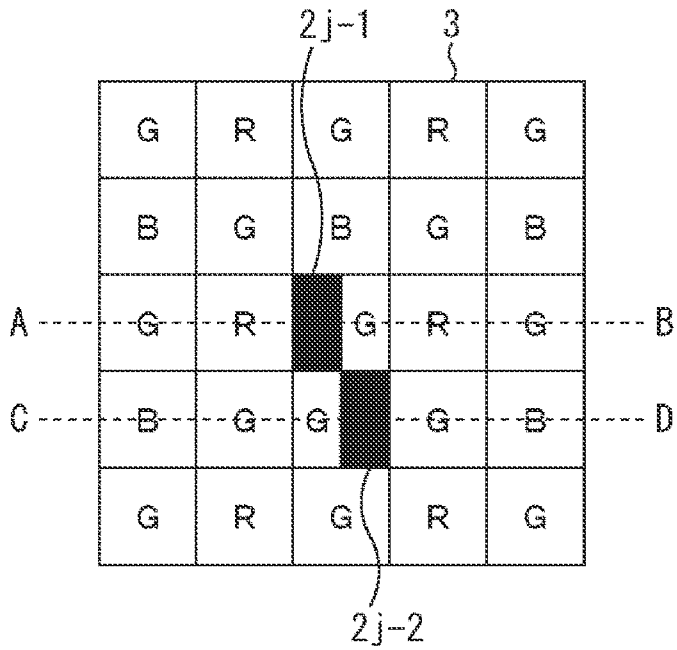
FIG. 44 is a diagram for explaining a pixel arrangement of the pixel array in a tenth embodiment.
Figure 45:
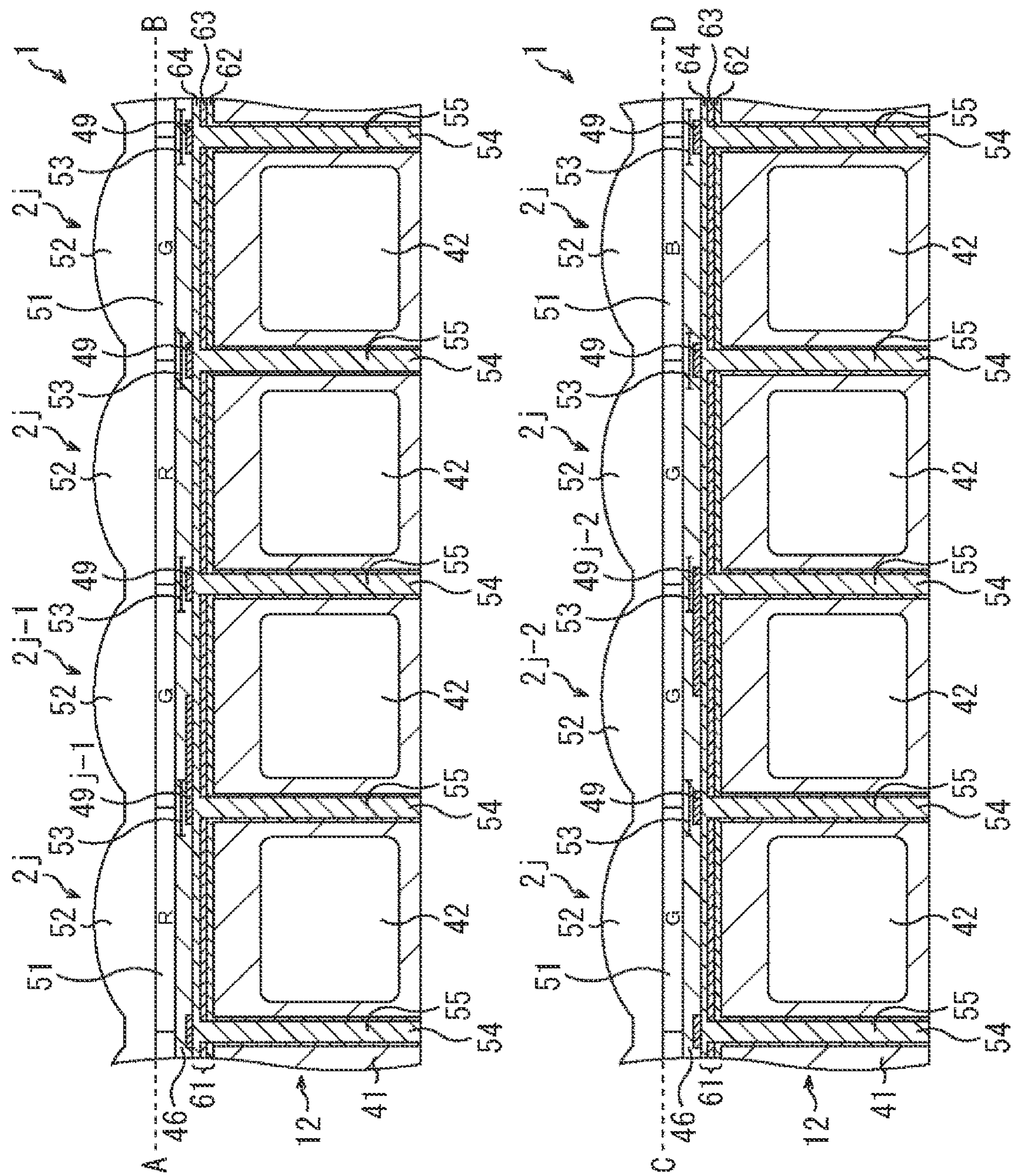
FIG. 45 is a diagram illustrating a cross-sectional configuration example of pixels according to the tenth embodiment.

Referring to FIGS. 44 and 45, pixels for detecting a phase difference to which the present technology can be applied will be additionally described. As illustrated in FIG. 44, a predetermined number of pixels in the pixel array 3 are allocated to pixels for phase difference detection. A plurality of phase difference detection pixels is provided at predetermined positions in the pixel array 3.

In FIG. 44, a phase difference detection pixel 2*j*-1 and a phase difference detection pixel 2*j*-2 are used as a pair of pixels for phase difference detection. In the pixel array 3, phase difference detection pixels 2*j* and imaging pixels 2*j* are arranged.

The phase difference detection pixels 2*j* are pixels used for detecting a focal point by a phase difference method. The imaging pixels 2*j* are pixels different from the phase difference detection pixels 2*j* and are pixels used for imaging.

An upper diagram in FIG. 45 illustrates a cross-sectional configuration example of pixels 2*j* along line A-B in FIG. 44. A lower diagram in FIG. 45 illustrates a cross-sectional configuration example of pixels 2*j* along line C-D in FIG. 44. The pixels 2*j* illustrated in FIG. 45 are pixels to which the present technology is not applied.

Referring to the upper diagram in FIG. 45, the phase difference detection pixel 2*j*-1 is surrounded by inter-pixel separation portions 54. Furthermore, a light-shielding film 49 is formed on the inter-pixel separation portions 54. A light-shielding film 49*j*-1 formed on the left side in the figure of the phase difference detection pixel 2*j*-1 is formed to a central portion of the phase difference detection pixel 2*j*-1. The light-shielding film 49-1 covers almost the left half of the PD 42. Thus, the phase difference detection pixel 2*j*-1 is opened on the right side and light-shielded on the left side.

Referring to the lower diagram in FIG. 45, the phase difference detection pixel 2*j*-2 is also surrounded by inter-pixel separation portions 54 like the phase difference detection pixel 2*j*-1. Furthermore, the light-shielding film 49 is formed on the inter-pixel separation portions 54. A light-shielding film 49*j*-2 formed on the right side in the figure of the phase difference detection pixel 2*j*-2 is formed to a central portion of the phase difference detection pixel 2*j*-2. The light-shielding film 49-2 covers almost the right half of the PD 42. Thus, the phase difference detection pixel 2*j*-2 is opened on the left side and light-shielded on the right side.

The phase difference detection pixel 2*j*-1 and the phase difference detection pixel 2*j*-2 are configured to be able to separately receive light coming from a left part and light coming from a right part. The phase difference detection pixel 2*j*-1 and the phase difference detection pixel 2*j*-2 separately receive light coming from a left part and light coming from a right part, so that a focus position can be detected as described with reference to FIG. 26.

The phase difference detection pixels 2*j*, which are half light-shielded, have a lower sensitivity than the imaging pixels 2*j* that are not light-shielded. Therefore, by forming recessed regions 48 in the phase difference detection pixels 2*j*, the sensitivity of the phase difference detection pixels 2*j* is improved.

Figure 46:
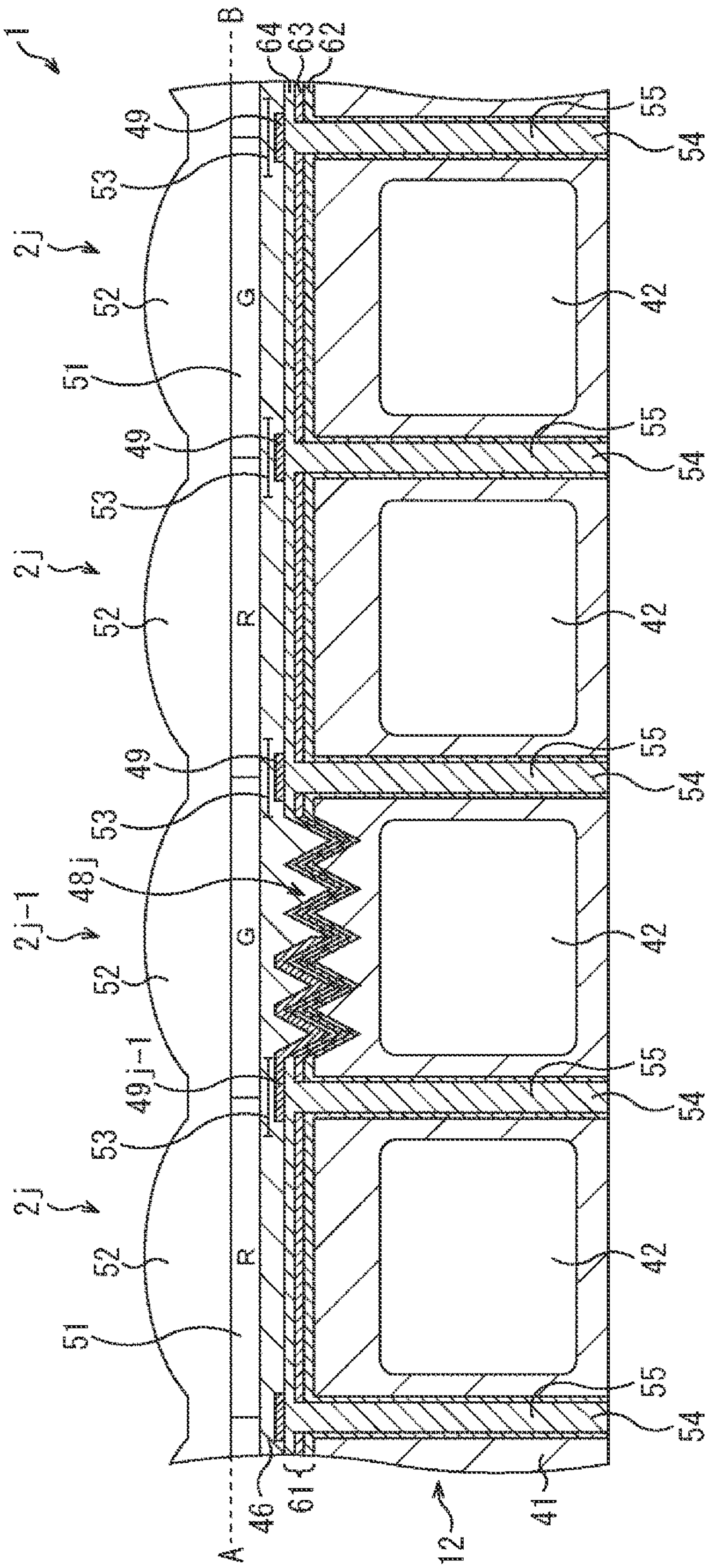
FIG. 46 is a diagram illustrating another cross-sectional configuration example of pixels according to the tenth embodiment.

FIG. 46 is a diagram illustrating a cross-sectional configuration example of pixels 2*j* in a tenth embodiment to which the present technology is applied. In the following description, the phase difference detection pixel 2*j*-1 will be described as an example. The phase difference detection pixel 2*j*-2 paired therewith has a similar configuration.

Furthermore, here, the description will be continued with a case where the phase difference detection pixels 2*j* are G pixels as an example. However, the phase difference detection pixels 2*j* may be R pixels or B pixels. Furthermore, in a case where white pixels (W pixels) are placed, the W pixels may be used as the phase difference detection pixels 2*j*.

In the phase difference detection pixel 2*j*-1 illustrated in FIG. 46, a recessed region 48*j* is formed. A light-shielding film 49*j*-1 is formed on the recessed region 48*j*. In the example illustrated in FIG. 46, the light-shielding film 49*j*-1 is formed in a shape in conformance with recesses and protrusions of the recessed region 48*j*.

Figure 47:
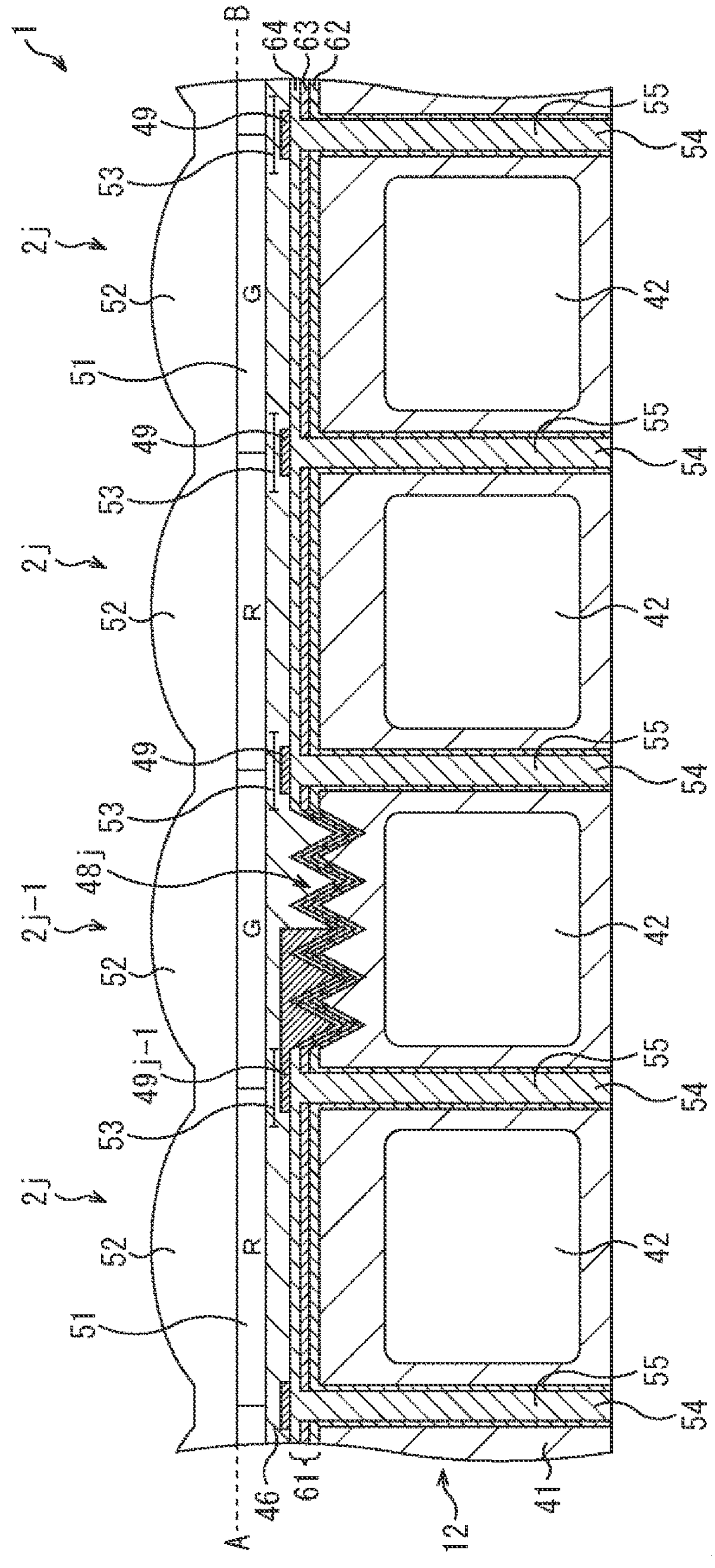
FIG. 47 is a diagram illustrating another cross-sectional configuration example of pixels according to the tenth embodiment.

In a phase difference detection pixel 2*j*-1 illustrated in FIG. 47, as in the phase difference detection pixel 2*j*-1 illustrated in FIG. 46, a light-shielding film 49*j*-1 is formed on a recessed region 48*j*, but the top surface (light incidence plane side) of the light-shielding film 49*j*-1 is made flat.

The light incidence plane side of the light-shielding film 49*j*-1 illustrated in FIG. 46 has recesses and protrusions, whereas the light incidence plane side of the light-shielding film 49*j*-1 illustrated in FIG. 47 is made flat. The light incidence plane side of the light-shielding film 49*j*-1 made flat reduces reflection-caused characteristic loss.

Figure 48:
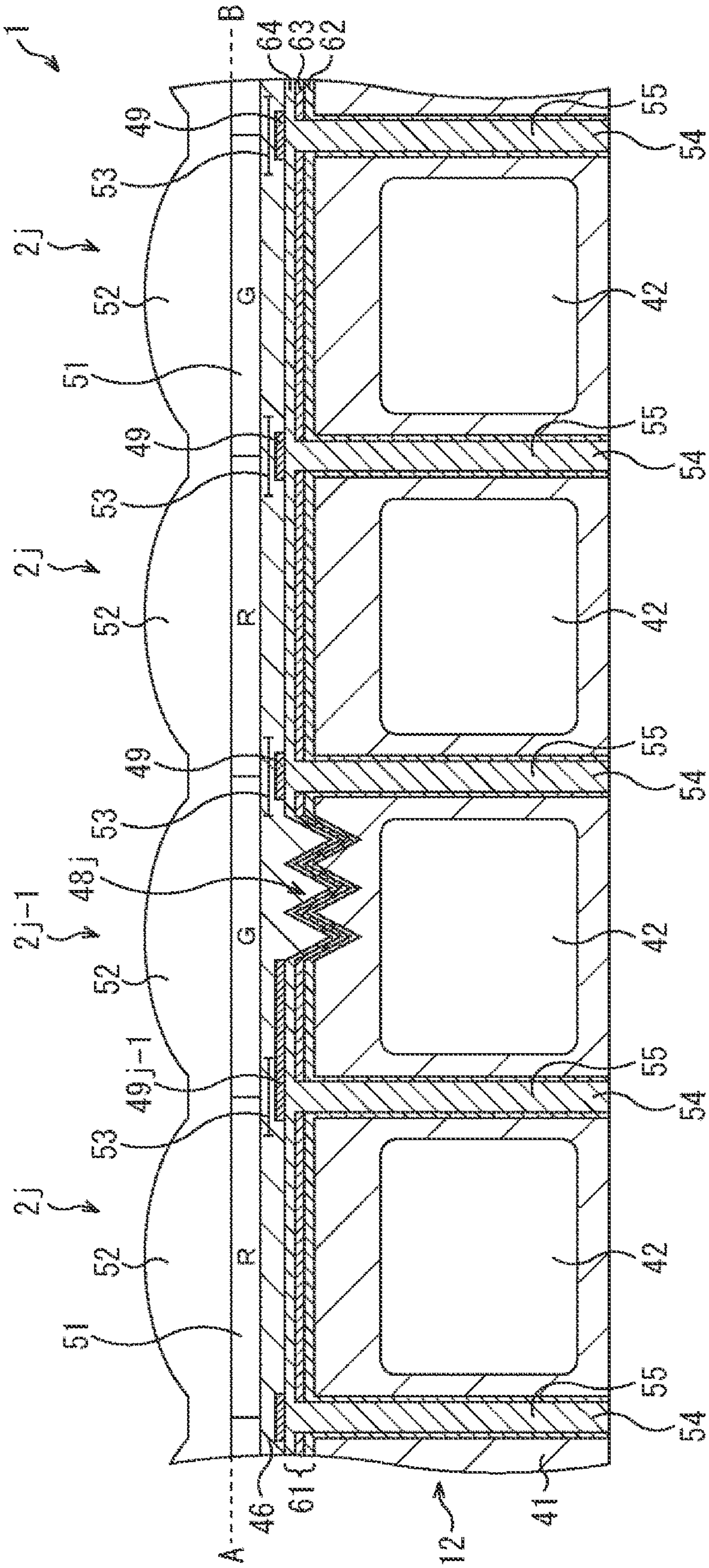
FIG. 48 is a diagram illustrating another cross-sectional configuration example of pixels according to the tenth embodiment.

In a phase difference detection pixel 2*j*-1 illustrated in FIG. 48, a recessed region 48*j* is formed only in an open portion. In other words, no recessed region 48*j* is formed under a light-shielding film 49*j*-1. Both the top surface and the bottom surface of the light-shielding film 49*j*-1 illustrated in FIG. 48 are made flat.

The configurations illustrated in FIGS. 46 and 47 can produce space in valley portions of the recessed region 48 that are not filled with a material forming the light-shielding film 49*j*-1 without gaps. However, the configuration illustrated in FIG. 48, in which both the top surface and the bottom surface of the light-shielding film 49*j*-1 are made flat, can reduce the possibility of producing space.

Further, the shape of the recessed region 48*j* may be varied (the number of valleys may be varied) depending on the image height. As described with reference to FIG. 11, the pixel array 3 is divided into the three regions. The region A is the image height center of the pixel array 3. The region B is the middle-image-height region of the pixel array 3. The region C is the high-image-height region of the pixel array 3.

The pixels 2*j* placed in the region A (at the image height center) have a structure in which no recessed region 48*j* is formed in the phase difference detection pixel 2*j*-1 as illustrated in FIG. 45.

Figure 49:
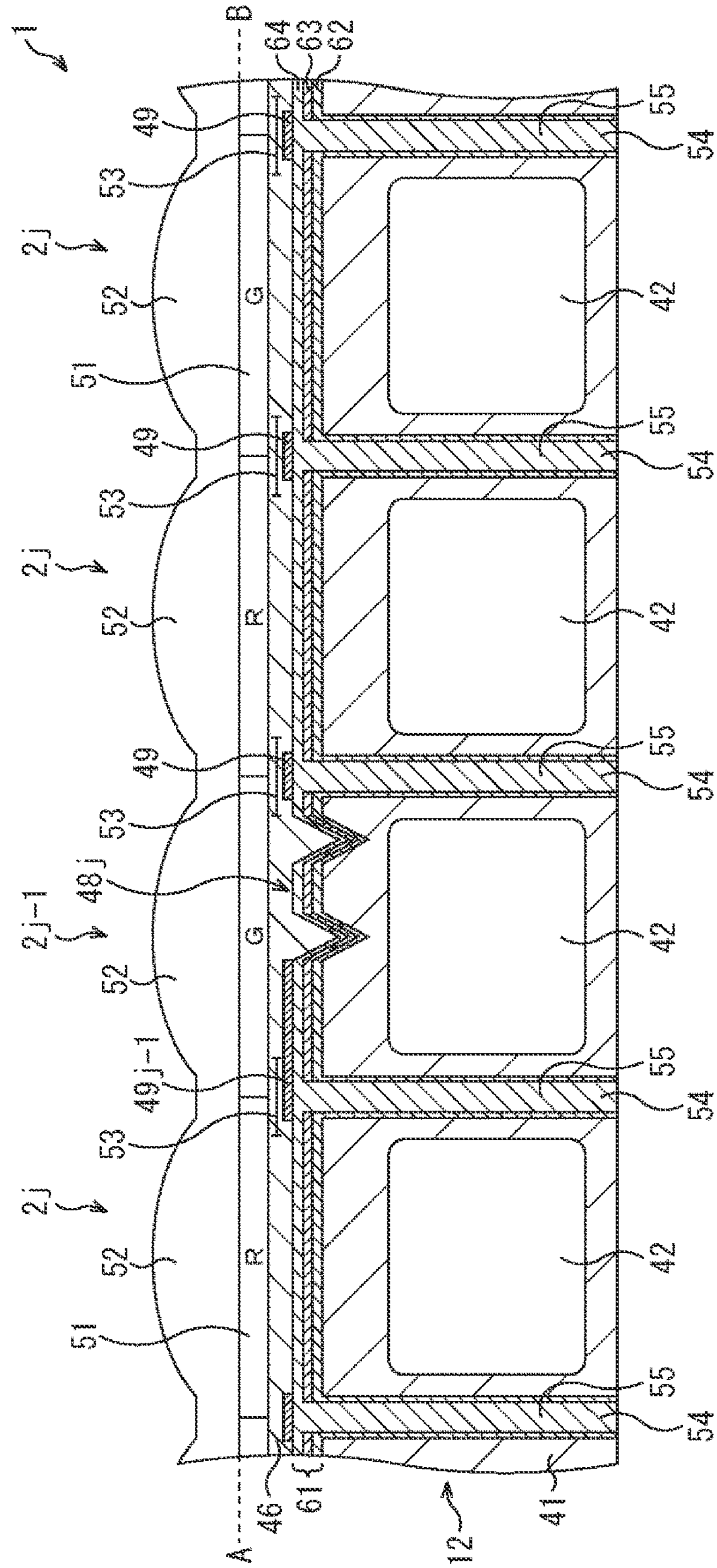
FIG. 49 is a diagram illustrating another cross-sectional configuration example of pixels according to the tenth embodiment.

FIG. 49 is a cross-sectional view of pixels 2*j* placed in the region B (at the medium image height). As illustrated in FIG. 49, a recessed region 48*j* is formed in an open portion of a phase difference detection pixel 2*j*-1 placed in the region B. Furthermore, the number of valleys of the recessed region 48*j* formed is two.

Figure 50:
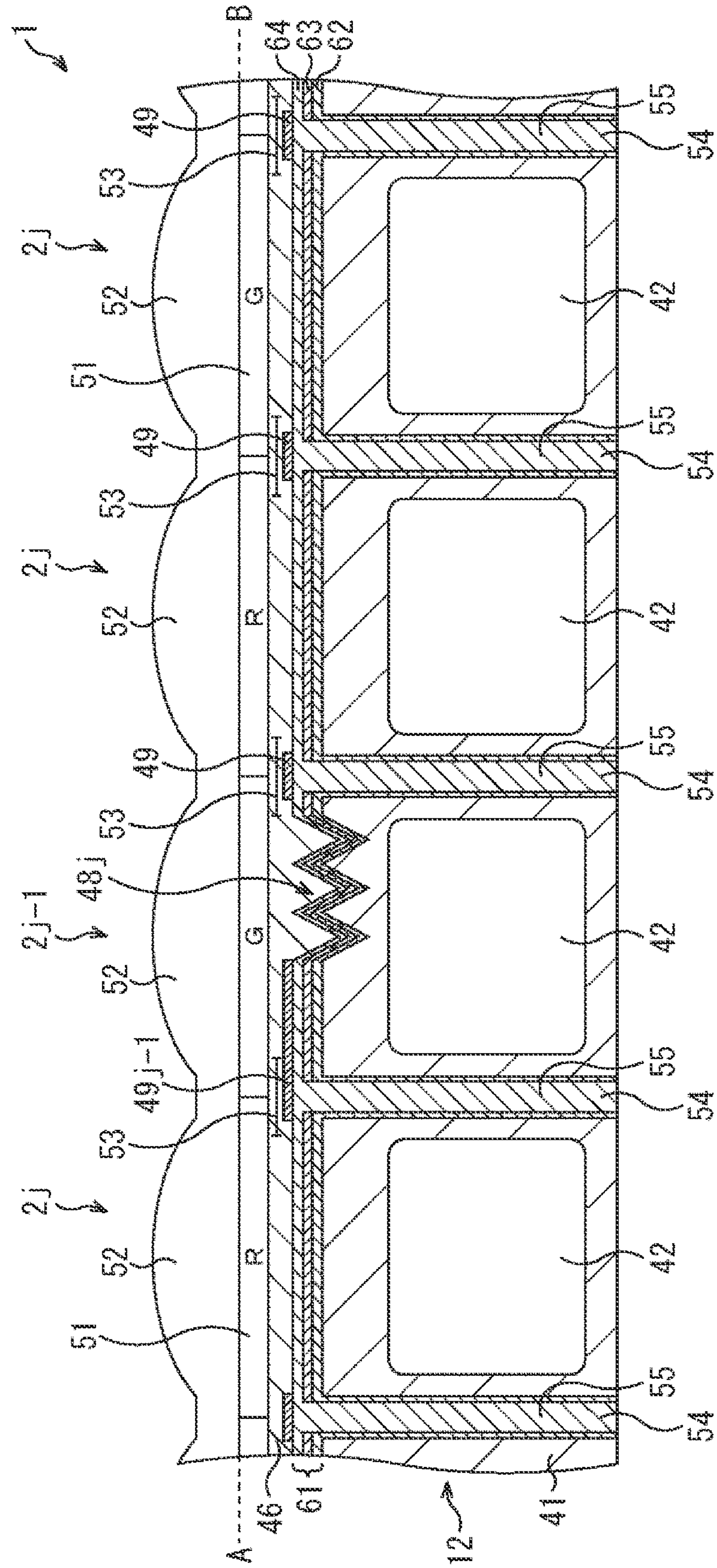
FIG. 50 is a diagram illustrating another cross-sectional configuration example of pixels according to the tenth embodiment.

FIG. 50 is a cross-sectional view of pixels 2*j* placed in the region C (at the high image height). As illustrated in FIG. 50, a recessed region 48*j* is formed in an open portion of a phase difference detection pixel 2*j*-1 placed in the region C. Furthermore, the number of valleys of the recessed region 48*j* formed is three.

Comparing the phase difference detection pixels 2*j*-1 illustrated in FIGS. 49 and 50, the number of the valleys of the recessed region 48*j* in the phase difference detection pixel 2*j*-1 placed in the region B illustrated in FIG. 49 is different from the number of the valleys of the recessed region 48*j* in the phase difference detection pixel 2*j* placed in the region C illustrated in FIG. 50. The number of the valleys of the recessed region 48*j* in the phase difference detection pixel 2*j* placed in the region B illustrated in FIG. 49 is two. The number of the valleys of the recessed region 48*j* in the phase difference detection pixel 2*j* placed in the region C illustrated in FIG. 50 is three.

In general, sensitivity tends to decrease with increasing image height. Therefore, to increase the sensitivity of the phase difference detection pixels 2*j* placed on the high image height side where sensitivity becomes lower, the number of valleys of the recessed regions 48 is made larger than that of the phase difference detection pixels 2*j* located at places other than those at the high image height.

Further, a recessed region 48*j* may be formed in one of the phase difference detection pixel 2*j*-1 and the phase difference detection pixel 2*j*-2 placed on the high image height side, and may not be formed in the other. On the high image height side, a difference can occur between the sensitivity of the phase difference detection pixel 2*j*-1 and the sensitivity of the phase difference detection pixel 2*j*-2.

Figure 51:
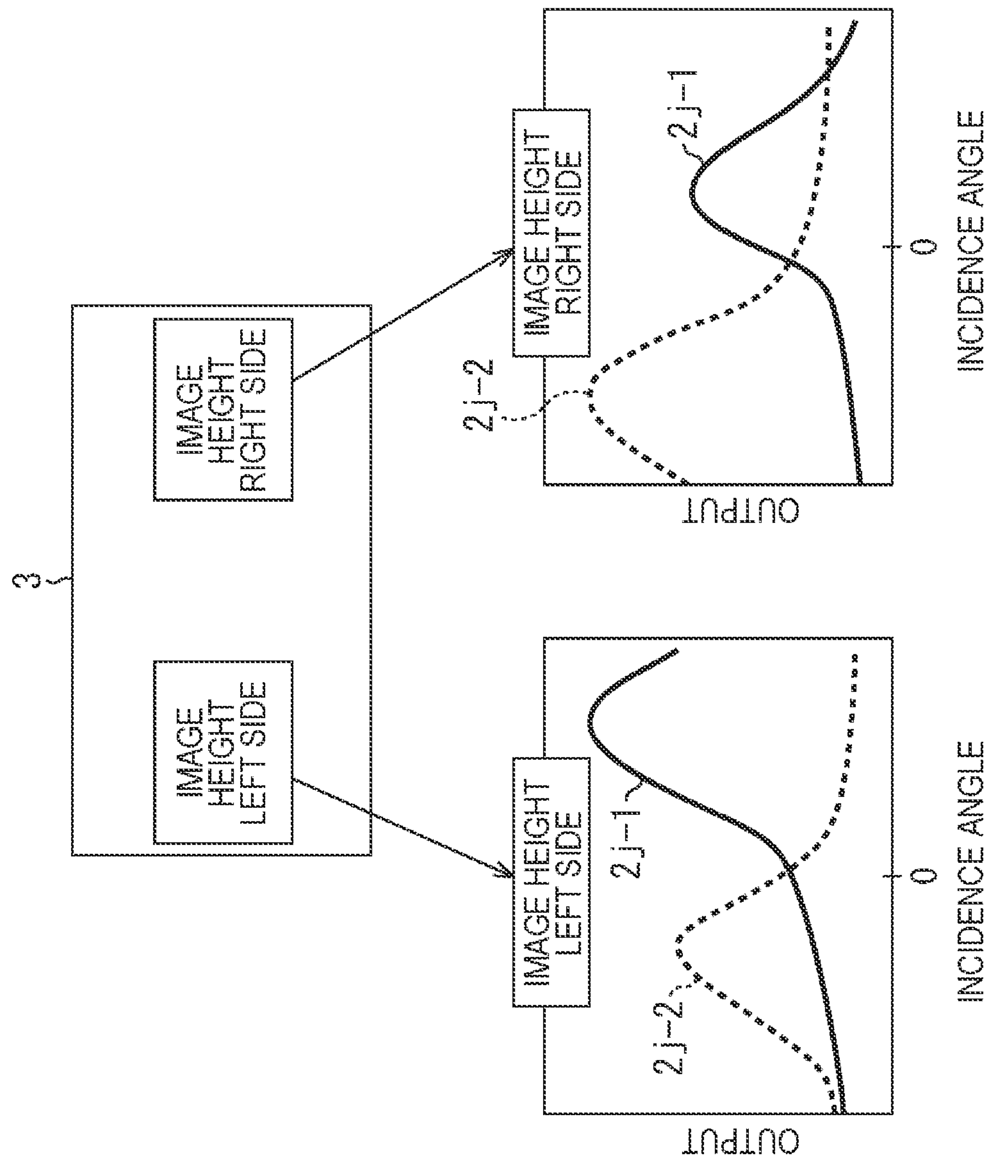
FIG. 51 is a diagram for explaining difference in sensitivity depending on image height.

As illustrated in FIG. 51, the pixel array 3 is divided into the image height left side and the image height right side. A diagram of the relationship between the incidence angle and the output of the phase difference detection pixel 2*j*-1 and the phase difference detection pixel 2*j*-2 placed on the image height left side is illustrated on the left side of the figure. A diagram of the relationship between the incidence angle and the output of the phase difference detection pixel 2*j*-1 and the phase difference detection pixel 2*j*-2 placed on the image height right side is illustrated on the right side of the figure.

In the diagrams, the horizontal axis represents the light incidence angle, and the vertical axis the pixel output value depending on incident light. Furthermore, in the diagrams, a graph indicated by a solid line represents output from the phase difference detection pixel 2*j*-1 whose left side is light-shielded, and a graph indicated by a dotted line represents output from the phase difference detection pixel 2*j*-2 whose right side is light-shielded.

The graphs illustrated in FIG. 51 show that each phase difference detection pixel 2*j* has a maximum value at an incidence angle other than zero degrees. That is, each phase difference detection pixel depends on the light incidence angle, and has a maximum value when light enters at a predetermined angle. Furthermore, the phase difference detection pixel 2*j*-1 efficiently receives light incident from the right side and obtains the maximum value, but does not receive light incident from the left side and has a small output value. Likewise, the phase difference detection pixel 2*j*-2 efficiently receives light incident from the left side and obtains the maximum value, but does not receive light incident from the right side and has a small output value.

Furthermore, referring to the graphs on the image height left side, the phase difference detection pixel 2*j*-1 and the phase difference detection pixel 2*j*-2 placed on the image height left side have different sensitivities, and the phase difference detection pixel 2*j*-1 has a higher sensitivity than the phase difference detection pixel 2*j*-2. Likewise, referring to the graphs on the image height right side, the phase difference detection pixel 2*j*-1 and the phase difference detection pixel 2*j*-2 placed on the image height right side have different sensitivities, and the phase difference detection pixel 2*j*-2 has a higher sensitivity than the phase difference detection pixel 2*j*-1.

When the phase difference detection pixel 2*j*-1 and the phase difference detection pixel 2*j*-2 function as a pair of phase difference detection pixels, it is preferable that such a sensitivity difference be small. Therefore, a recessed region 48*j* is formed in one with a lower sensitivity to improve the sensitivity.

Figure 52:
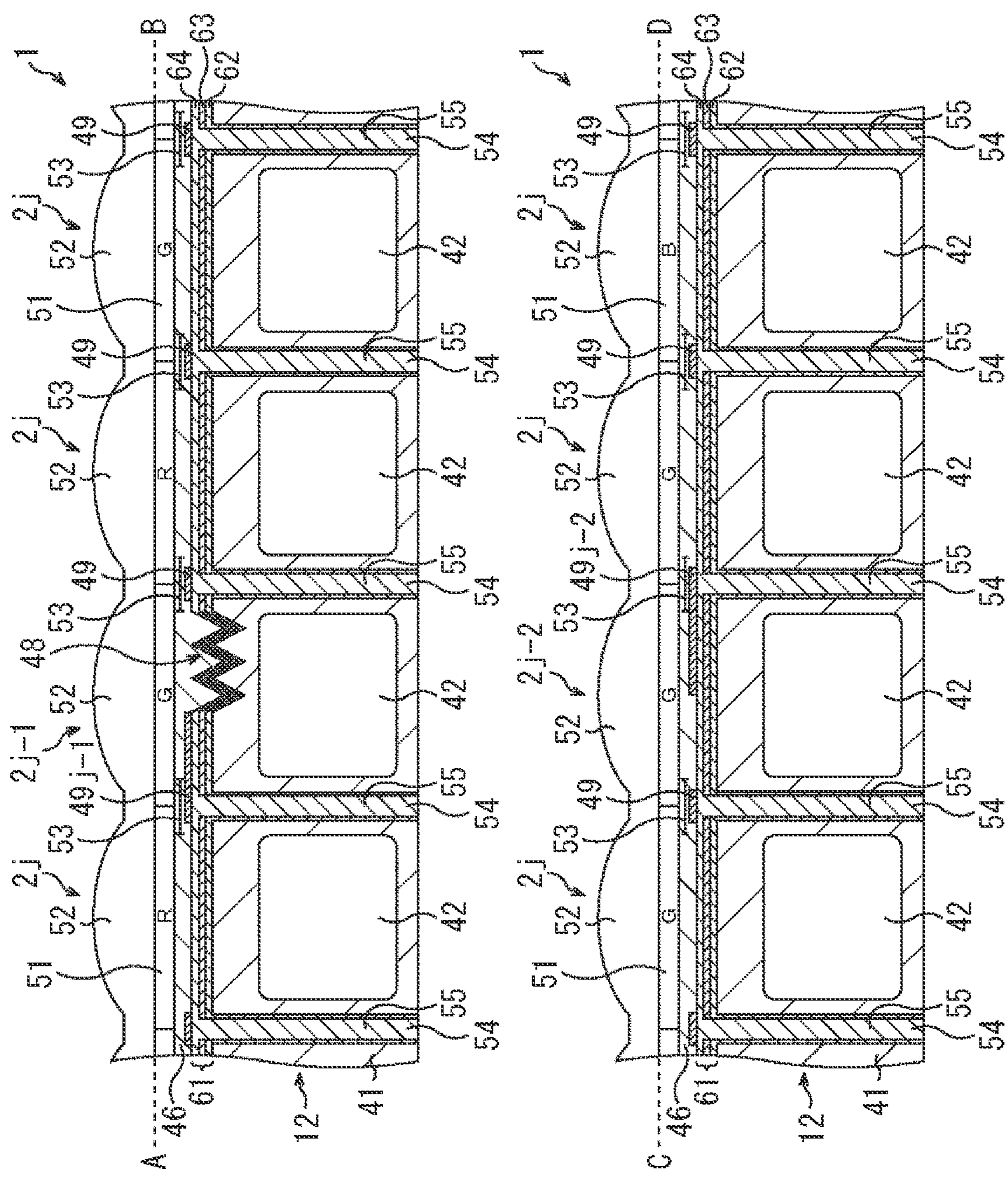
FIG. 52 is a diagram illustrating another cross-sectional configuration example of pixels according to the tenth embodiment.

FIG. 52 illustrates a structure of the phase difference detection pixels 2*j* placed on the image height right side. On the image height right side, as in the graphs illustrated on the right side of FIG. 51, the sensitivity of the phase difference detection pixel 2*j*-2 tends to be higher than the sensitivity of the phase difference detection pixel 2*j*-1. Therefore, as illustrated in FIG. 52, no recessed region 48*j* is formed in the phase difference detection pixel 2*j*-2, and a recessed region 48*j* is formed in the phase difference detection pixel 2*j*-1.

Figure 53:
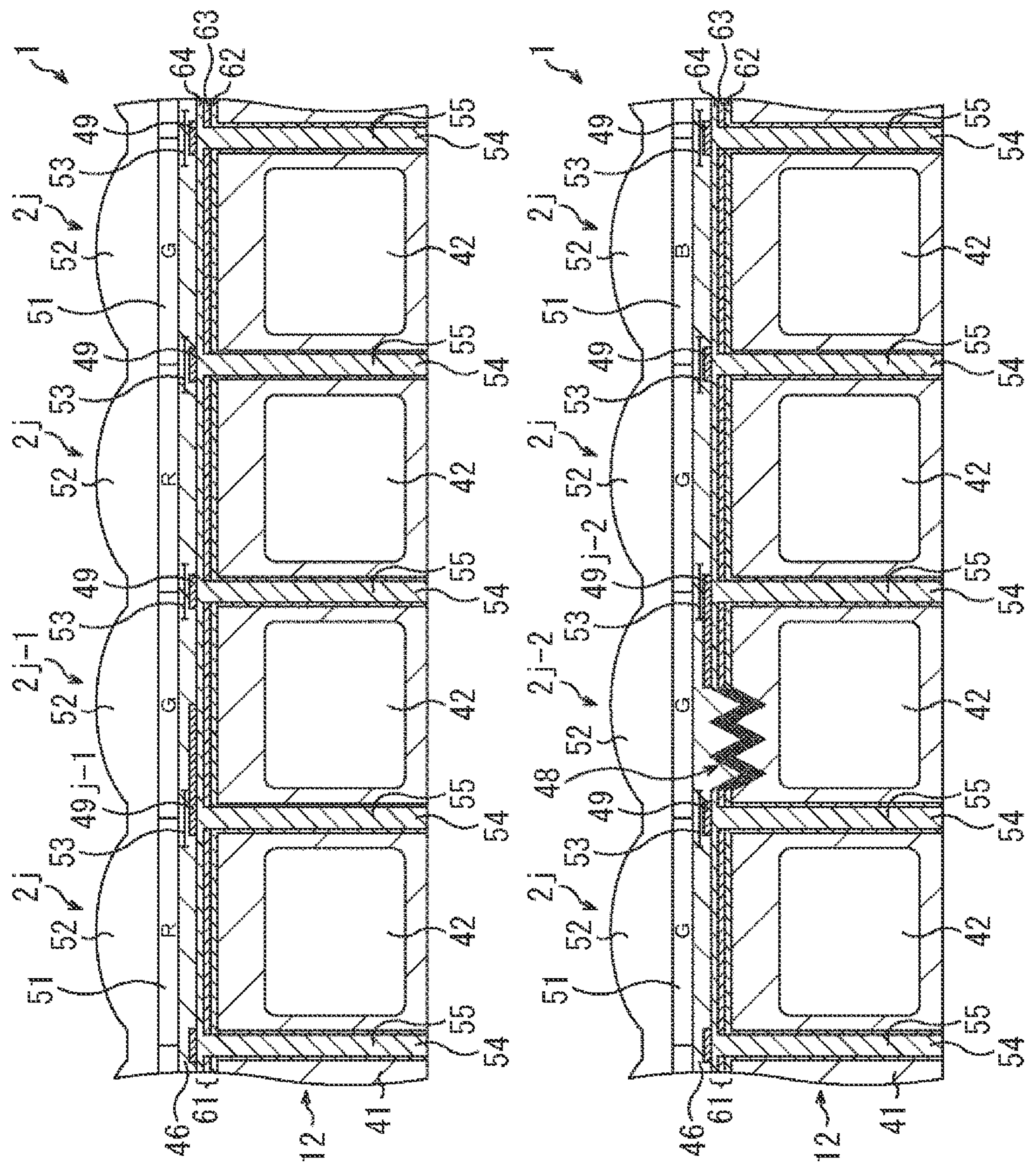
FIG. 53 is a diagram illustrating another cross-sectional configuration example of pixels according to the tenth embodiment.

FIG. 53 illustrates a structure of the phase difference detection pixels 2*j* placed on the image height left side. On the image height left side, as in the graphs illustrated on the left side of FIG. 51, the sensitivity of the phase difference detection pixel 2*j*-1 tends to be higher than the sensitivity of the phase difference detection pixel 2*j*-2. Therefore, as illustrated in FIG. 53, no recessed region 48*j* is formed in the phase difference detection pixel 2*j*-1, and a recessed region 48*j* is formed in the phase difference detection pixel 2*j*-2.

In this manner, the recessed region 48*j* may be formed only in the phase difference detection pixel 2*j* on the lower-sensitivity side of the phase difference detection pixels 2*j*, to adjust it to prevent the occurrence of a sensitivity difference between the pixels constituting the pair of phase difference detection pixels 2*j*.

In the description with reference to FIGS. 44 to 53, the case where the recessed regions 48*j* are formed in the phase difference detection pixels 2*j* has been described as an example, but recessed regions 48*j* may be formed in the imaging pixels 2*j* as well as in the phase difference detection pixels 2*j* arranged in the pixel array 3.

In a case where the recessed regions 48*j* are also formed in the imaging pixels 2*j*, the sensitivity of the imaging pixels 2*j* is also improved. The improved sensitivity of the imaging pixels 2*j* adjacent to the phase difference detection pixels 2*j* can increase color mixing into the phase difference detection pixels 2*j*.

Figure 54:
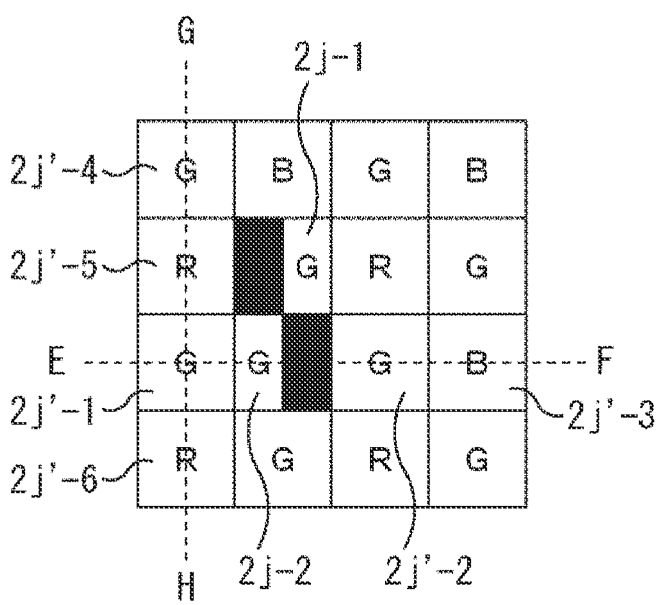
FIG. 54 is a diagram for explaining the pixel arrangement of the pixel array in the tenth embodiment.
Figure 55:
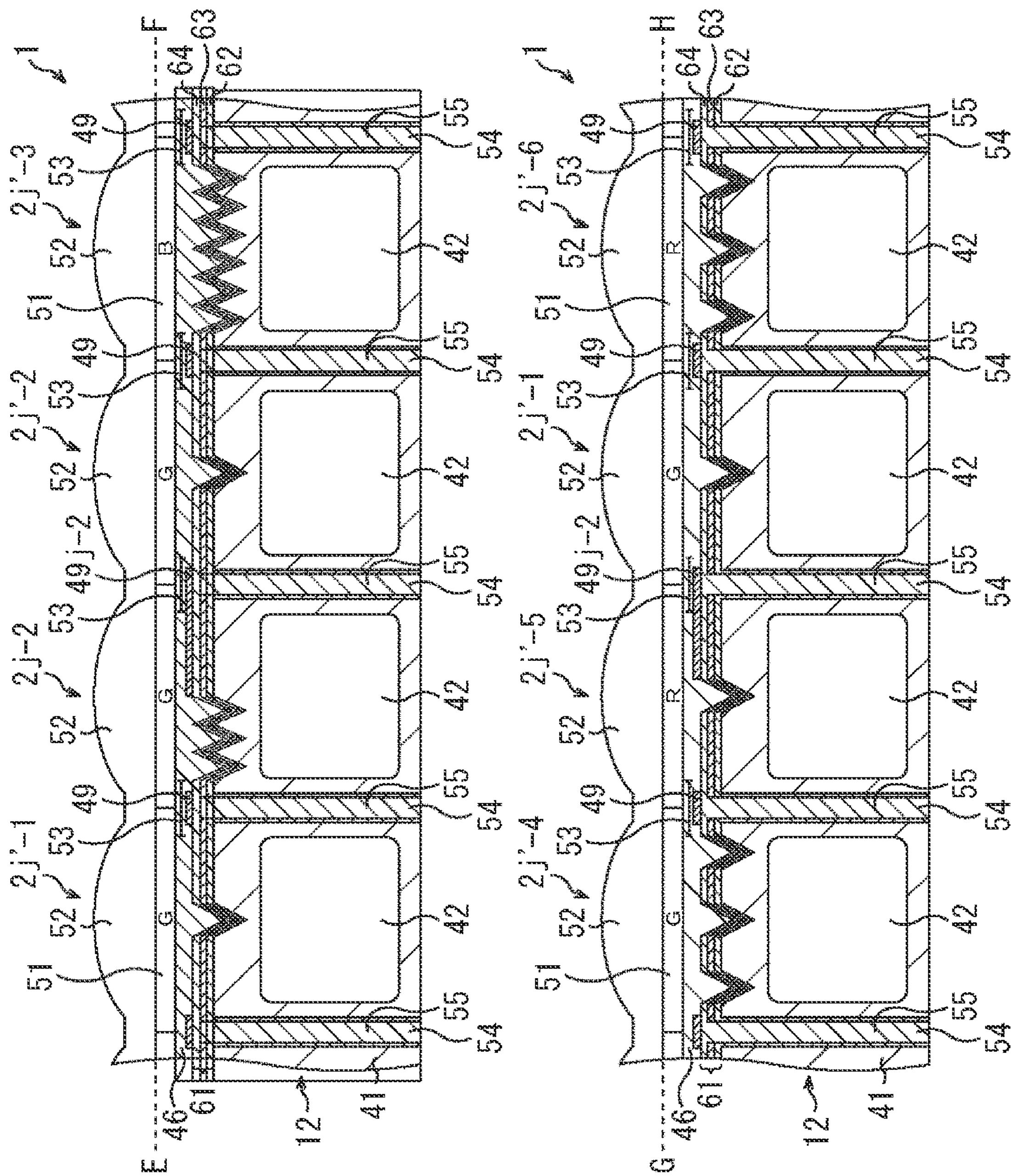
FIG. 55 is a diagram illustrating another cross-sectional configuration example of pixels according to the tenth embodiment.

With reference to FIGS. 54 and 55, a case where recessed regions 48*j* are also formed in the imaging pixels 2*j* will be additionally described. As illustrated in FIG. 54, a predetermined number of pixels in the pixel array 3 are allocated to phase difference detection pixels. In FIG. 54, a phase difference detection pixel 2*j*-1 and a phase difference detection pixel 2*j*-2 are used as a pair of pixels for phase difference detection. Recessed regions 48*j* are formed in the phase difference detection pixel 2*j*-1 and the phase difference detection pixel 2*j*-2 as described above.

In the pixel array 3, the imaging pixels 2*j* are placed around the phase difference detection pixels 2*j*. An upper diagram in FIG. 55 illustrates a cross-sectional configuration example of pixels 2*j* along line E-F in FIG. 54. A lower diagram in FIG. 55 illustrates a cross-sectional configuration example of pixels 2*j* along line G-H in FIG. 54.

Referring to the upper diagram in FIG. 55, a recessed region 48*j* is formed in the phase difference detection pixel 2*j*-2. Recessed regions 48*j*, each with one recess, are also formed in an imaging pixel 2*j*'-1 and an imaging pixel 2*j*'-2 located on the left side of the phase difference detection pixel 2*j*-2. Furthermore, a recessed region 48*j* with six recesses is formed in an imaging pixel 2*j*'-3 located on the right side of the imaging pixel 2*j*'-2.

Thus, the number of the recesses of the recessed regions 48*j* in the imaging pixel 2*j*'-1 and the imaging pixel 2*j*'-2 adjacent to the phase difference detection pixel 2*j*-2 is smaller than the number of the recesses of the recessed region 48*j* in the imaging pixel 2*j*'-3 not adjacent to the phase difference detection pixel 2*j*-2.

Referring to the lower diagram in FIG. 55, the imaging pixel 2*j*'-1 is adjacent to the phase difference detection pixel 2*j*-2, and thus the number of recesses of the recessed region 48*j* in the imaging pixel 2*j*'-1 is one. Furthermore, an imaging pixel 2*j*'-5 is adjacent to the phase difference detection pixel 2*j*-1, and thus the number of recesses of a recessed region 48*j* in the imaging pixel 2*j*'-5 is one.

An imaging pixel 2*j*'-4 is adjacent to the phase difference detection pixel 2*j*-1 in an oblique direction, and thus the number of recesses of a recessed region 48*j* in the imaging pixel 2*j*'-4 is three. An imaging pixel 2*j*'-6 is adjacent to the phase difference detection pixel 2*j*-2 in an oblique direction, and thus the number of recesses of a recessed region 48*j* in the imaging pixel 2*j*'-6 is three.

Thus, the number of the recesses of the recessed region 48*j* in the imaging pixel 2*j*'-4 adjacent to the phase difference detection pixel 2*j*-1 in the oblique direction is smaller than the number of the recesses of the recessed region 48*j* in the imaging pixels 2*j*' (for example, the imaging pixel 2*j*'-3 illustrated in the upper diagram of FIG. 55) not adjacent to the phase difference detection pixel 2*j*-1, and is larger than the number of the recesses of the recessed region 48*j* in the imaging pixel 2*j*'-5 adjacent to the phase difference detection pixel 2*j*-1.

Likewise, the number of the recesses of the recessed region 48*j* in the imaging pixel 2*j*'-6 adjacent to the phase difference detection pixel 2*j*-2 in the oblique direction is smaller than the number of the recesses of the recessed region 48*j* in the imaging pixel 2*j*'-3 not adjacent to the phase difference detection pixel 2*j*-2, and is larger than the number of the recesses of the recessed region 48*j* in the imaging pixel 2*j*'-1 adjacent to the phase difference detection pixel 2*j*-2.

In the structure illustrated in FIG. 55, the number of recesses of the recessed region 48 in each pixel adjacent to the phase difference detection pixel 2*j* in the up, down, left, or right direction is the smallest, and the number of recesses of the recessed region 48 in each pixel adjacent to the phase difference detection pixel 2*j* in the oblique direction is the next smallest.

The number of recesses of the recessed region 48 in each pixel adjacent to the phase difference detection pixel 2*j* in the up, down, left, or right direction may be the same as the number of recesses of the recessed region 48 in each pixel adjacent to the phase difference detection pixel 2*j* in the oblique direction.

Furthermore, no recessed region 48 may be formed in each pixel adjacent to the phase difference detection pixel 2*j* in the up, down, left, or right direction and each pixel adjacent to the phase difference detection pixel 2*j* in the oblique direction.

The tenth embodiment may be combined with the fourth to ninth embodiments. The fourth to ninth embodiments can be applied to a system in which light from a left part and light from a right part are separately received by two PDs 42. By light-shielding one of the two PDs 42 and not light-shielding the other, it can be treated the same as the phase difference detection pixel 2*j* in the tenth embodiment.

Figure 56:
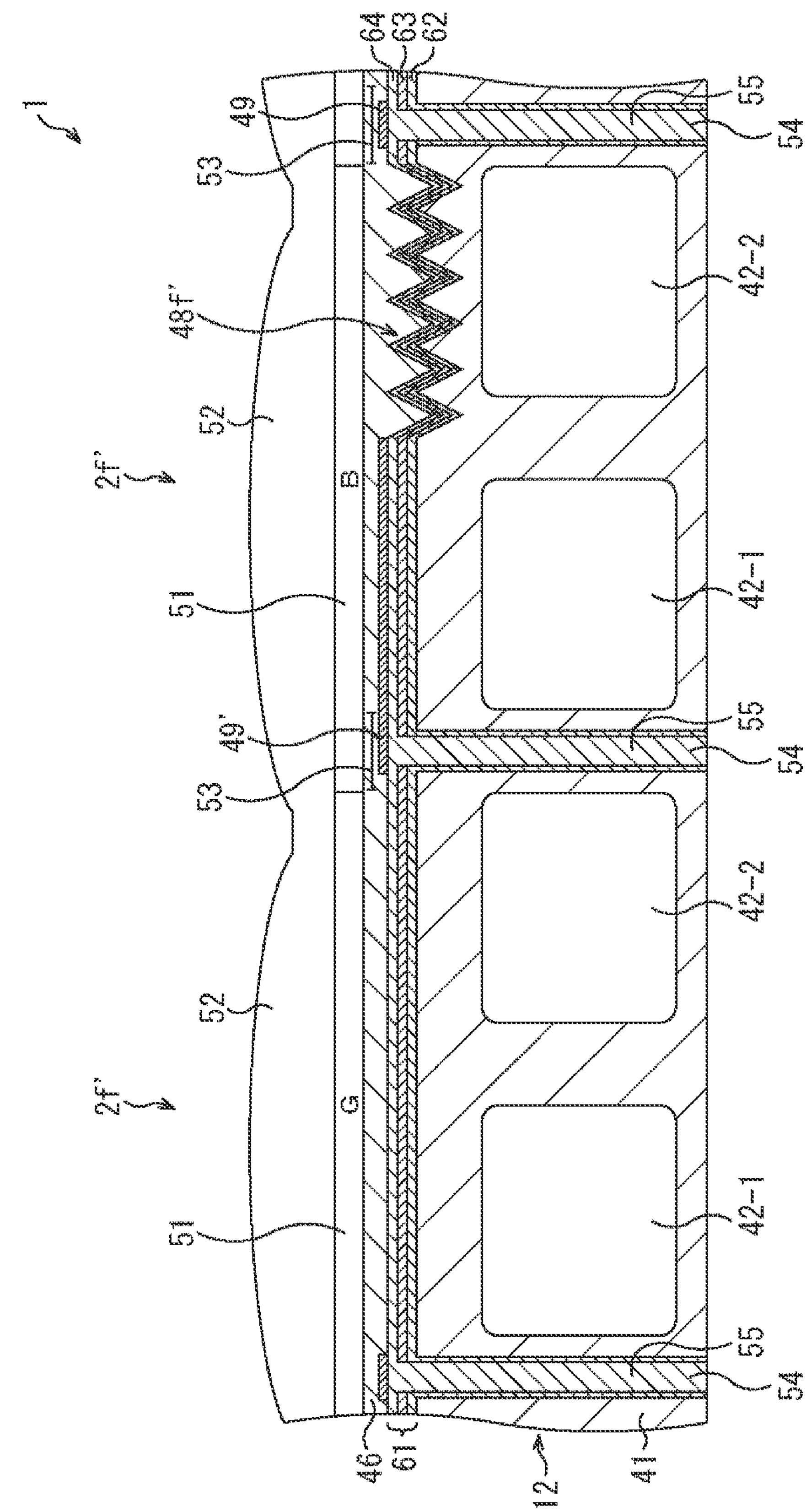
FIG. 56 is a diagram illustrating another cross-sectional configuration example of pixels according to the tenth embodiment.

For example, FIG. 56 illustrates a case where the pixels 2*f* in the sixth embodiment illustrated in FIG. 17 are combined with those in the tenth embodiment. In a cross-sectional structure example illustrated in FIG. 56, a B pixel illustrated on the right side in the figure is a phase difference detection pixel 2*f*'. A light-shielding film 49' in the phase difference detection pixel 2*f*' is formed to a position to cover almost the left half of a PD 42-1 formed in the B pixel.

That is, in the B pixel illustrated in FIG. 56, the PD 42-1 is light-shielded, and a PD 42-2 is opened. This structure is similar to the structure of the phase difference detection pixel 2*j*-1 illustrated in FIG. 48, for example, and is a structure in which the left side is light-shielded. Thus, the B pixel whose left side is light-shielded may be used as a phase difference detection pixel.

In the example illustrated in FIG. 56, no recessed region 48 is formed in a G pixel adjacent to the B pixel functioning as a phase difference detection pixel, but it may be formed.

The tenth embodiment can thus be combined with the embodiments in FIGS. 4, 5, 6A, 6B, 7, 8, and 9. In addition, what is described as the tenth embodiment, for example, an embodiment in which the number of recesses of the recessed regions 48 is varied depending on the image height can be applied to the combined embodiment.

<Example of Application to Electronic Apparatus>

The technology of the present disclosure is not limited to application to a solid-state imaging apparatus. Specifically, the technology of the present disclosure is applicable to all electronic apparatuses using a solid-state imaging apparatus for an image capturing unit (photoelectric conversion part), such as imaging apparatuses including digital still cameras and video cameras, portable terminal devices having an imaging function, and copying machines using a solid-state imaging apparatus for an image reading unit. The solid-state imaging apparatus may be formed as one chip, or may be in a modular form having an imaging function in which an imaging unit and a signal processing unit or an optical system are packaged together.

Figure 57:
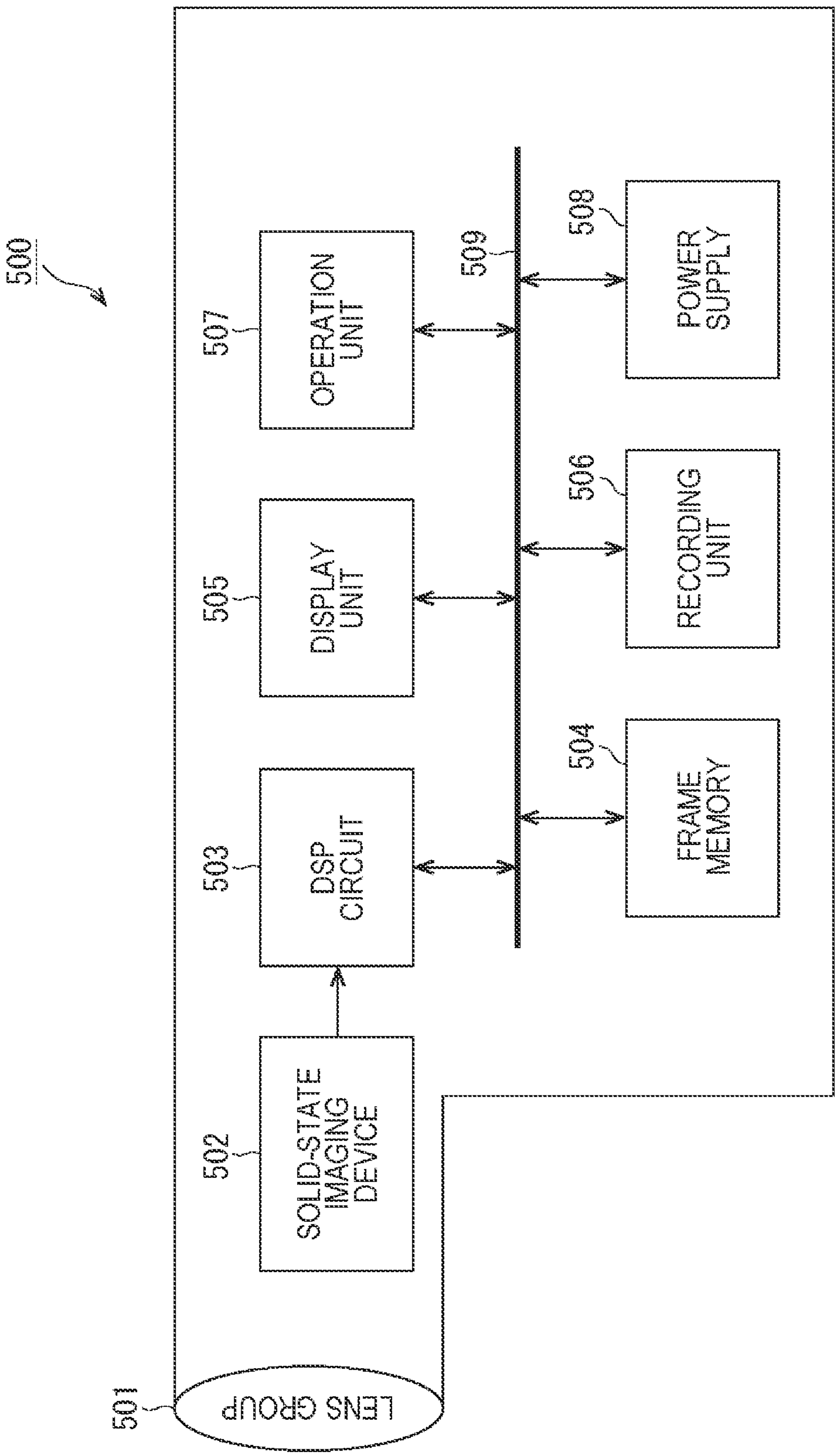
FIG. 57 is a block diagram illustrating a configuration example of an imaging apparatus as an electronic apparatus according to the present disclosure.

FIG. 57 is a block diagram illustrating a configuration example of an imaging apparatus as an electronic apparatus according to the present disclosure.

An imaging apparatus 500 in FIG. 57 includes an optical unit 501 including a lens group or the like, a solid-state imaging apparatus (imaging device) 502 in which the configuration of the solid-state imaging apparatus 1 in FIG. 1 is used, and a digital signal processor (DSP) circuit 503 that is a camera signal processing circuit. Furthermore, the imaging apparatus 500 also includes a frame memory 504, a display unit 505, a recording unit 506, an operation unit 507, and a power supply 508. The DSP circuit 503, the frame memory 504, the display unit 505, the recording unit 506, the operation unit 507, and the power supply 508 are mutually connected via a bus line 509.

The optical unit 501 captures incident light (image light) from a subject, forming an image on an imaging surface of the solid-state imaging apparatus 502. The solid-state imaging apparatus 502 converts the amount of incident light formed as the image on the imaging surface by the optical unit 501 into an electric signal pixel by pixel and outputs the electric signal as a pixel signal. As the solid-state imaging apparatus 502, the solid-state imaging apparatus 1 in FIG. 1, that is, a solid-state imaging apparatus that improves sensitivity while preventing worsening of color mixing can be used.

The display unit 505 includes, for example, a panel display device such as a liquid crystal panel or an organic electroluminescent (EL) panel, and displays moving images or still images captured by the solid-state imaging apparatus 502. The recording unit 506 records a moving image or a still image captured by the solid-state imaging apparatus 502 on a recording medium such as a hard disk or a semiconductor memory.

The operation unit 507 issues operation commands on various functions of the imaging apparatus 500 under user operation. The power supply 508 appropriately supplies various power supplies to be operation power supplies for the DSP circuit 503, the frame memory 504, the display unit 505, the recording unit 506, and the operation unit 507, to them to be supplied with.

As described above, using the above-described solid-state imaging apparatus 1 as the solid-state imaging apparatus 502 can improve sensitivity while preventing worsening of color mixing. Therefore, the imaging apparatus 500 such as a video camera or a digital still camera, or further a camera module for a mobile device such as a portable phone can also improve the quality of captured images.

Note that embodiments of the present disclosure are not limited to the above-described embodiments, and various changes may be made without departing from the scope of the present disclosure.

In the above-described examples, the solid-state imaging apparatus that uses electrons as signal charges with the first conductivity type as P-type and the second conductivity type as N-type has been described. The present disclosure is also applicable to a solid-state imaging apparatus that uses holes as signal charges. That is, with the first conductivity type as N-type and the second conductivity type as P-type, each semiconductor region described above can be formed by a semiconductor region of the opposite conductivity type.

Furthermore, the technology of the present disclosure is not limited to the application to a solid-state imaging apparatus that detects the distribution of the amount of incident light of visible light and captures it as an image, and can be applied to a solid-state imaging apparatus that captures the distribution of the amount of incident infrared rays, X-rays, particles, or the like as an image, and, in a broad sense, to all solid-state imaging apparatuses (physical quantity distribution detection devices) such as a fingerprint detection sensor which detect the distribution of another physical quantity such as pressure or capacitance and capture it as an image.

<Example of Application to Endoscopic Surgery System>

The technology according to the present disclosure (the present technology) can be applied to various products. For example, the technology according to the present disclosure may be applied to an endoscopic surgery system.

Figure 58:
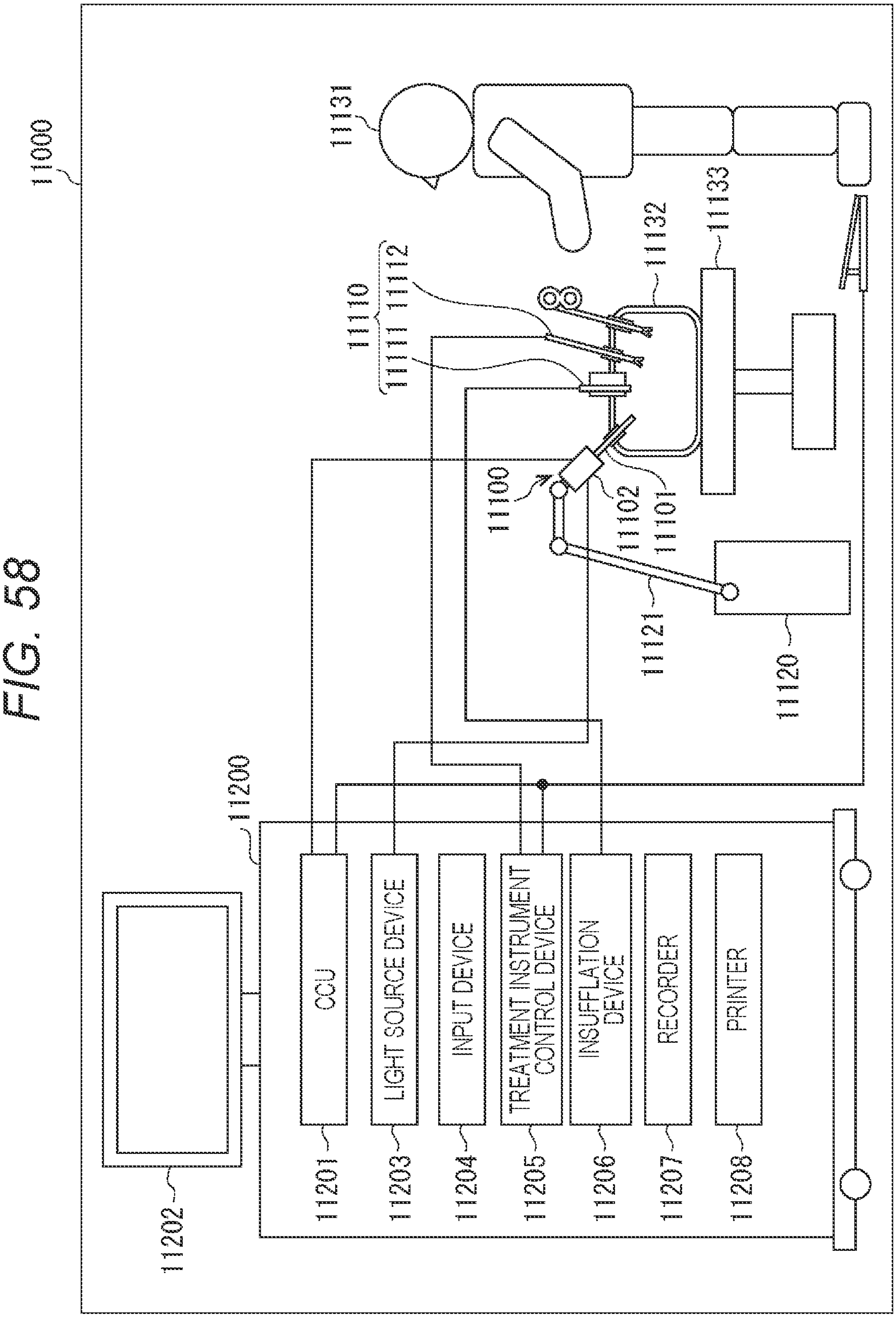
FIG. 58 is a diagram illustrating an example of a schematic configuration of an endoscopic surgery system.

FIG. 58 is a diagram illustrating an example of a schematic configuration of an endoscopic surgery system to which the technology according to the present disclosure (the present technology) can be applied.

FIG. 58 illustrates a state in which an operator (doctor) 11131 is performing an operation on a patient 11132 on a patient bed 11133, using an endoscopic surgery system 11000. As illustrated in the figure, the endoscopic surgery system 11000 includes an endoscope 11100, other surgical instruments 11110 including an insufflation tube 11111 and an energy treatment instrument 11112, a support arm device 11120 that supports the endoscope 11100, and a cart 11200 on which various devices for endoscopic surgery are mounted.

The endoscope 11100 includes a lens tube 11101 with a region of a predetermined length from the distal end inserted into the body cavity of the patient 11132, and a camera head 11102 connected to the proximal end of the lens tube 11101. In the illustrated example, the endoscope 11100 formed as a so-called rigid scope having a rigid lens tube 11101 is illustrated, but the endoscope 11100 may be formed as a so-called flexible scope having a flexible lens tube.

An opening in which an objective lens is fitted is provided at the distal end of the lens tube 11101. A light source device 11203 is connected to the endoscope 11100. Light generated by the light source device 11203 is guided to the distal end of the lens tube 11101 through a light guide extended inside the lens tube 11101, and is emitted through the objective lens toward an object to be observed in the body cavity of the patient 11132. Note that the endoscope 11100 may be a forward-viewing endoscope, an oblique-viewing endoscope, or a side-viewing endoscope.

An optical system and an imaging device are provided inside the camera head 11102. Light reflected from the object being observed (observation light) is concentrated onto the imaging device by the optical system. The observation light is photoelectrically converted by the imaging device, and an electric signal corresponding to the observation light, that is, an image signal corresponding to an observation image is generated. The image signal is transmitted to a camera control unit (CCU) 11201 as RAW data.

The CCU 11201 includes a central processing unit (CPU), a graphics processing unit (GPU), or the like, and performs centralized control on the operations of the endoscope 11100 and a display device 11202. Moreover, the CCU 11201 receives an image signal from the camera head 11102, and performs various types of image processing such as development processing (demosaicing) on the image signal for displaying an image based on the image signal.

The display device 11202 displays an image based on an image signal subjected to image processing by the CCU 11201 under the control of the CCU 11201.

The light source device 11203 includes a light source such as a light-emitting diode (LED), and supplies irradiation light when a surgical site or the like is imaged to the endoscope 11100.

An input device 11204 is an input interface for the endoscopic surgery system 11000. The user can input various types of information and input instructions to the endoscopic surgery system 11000 via the input device 11204. For example, the user inputs an instruction to change conditions of imaging by the endoscope 11100 (the type of irradiation light, magnification, focal length, etc.) and the like.

A treatment instrument control device 11205 controls the drive of the energy treatment instrument 11112 for tissue ablation, incision, blood vessel sealing, or the like. An insufflation device 11206 feeds gas into the body cavity of the patient 11132 through the insufflation tube 11111 to inflate the body cavity for the purpose of providing a field of view by the endoscope 11100 and providing the operator's workspace. A recorder 11207 is a device that can record various types of information associated with surgery. A printer 11208 is a device that can print various types of information associated with surgery in various forms including text, an image, and a graph.

Note that the light source device 11203 that supplies irradiation light when a surgical site is imaged to the endoscope 11100 may include a white light source including LEDs, laser light sources, or a combination of them, for example. In a case where a white light source includes a combination of RGB laser light sources, the output intensity and output timing of each color (each wavelength) can be controlled with high accuracy. Thus, the light source device 11203 can adjust the white balance of captured images. Furthermore, in this case, by irradiating an object to be observed with laser light from each of the RGB laser light sources in a time-division manner, and controlling the drive of the imaging device of the camera head 11102 in synchronization with the irradiation timing, images corresponding one-to-one to RGB can also be imaged in a time-division manner. According to this method, color images can be obtained without providing color filters at the imaging device.

Furthermore, the drive of the light source device 11203 may be controlled so as to change the intensity of output light every predetermined time. By controlling the drive of the imaging device of the camera head 11102 in synchronization with the timing of change of the intensity of light and acquiring images in a time-division manner, and combining the images, a high dynamic range image without so-called underexposure and overexposure can be generated.

Furthermore, the light source device 11203 may be configured to be able to supply light in a predetermined wavelength band suitable for special light observation. In special light observation, for example, so-called narrow band imaging is performed in which predetermined tissue such as a blood vessel in a superficial portion of a mucous membrane is imaged with high contrast by irradiating it with light in a narrower band than irradiation light at the time of normal observation (that is, white light), utilizing the wavelength dependence of light absorption in body tissue. Alternatively, in special light observation, fluorescence observation may be performed in which an image is obtained by fluorescence generated by irradiation with excitation light. Fluorescence observation allows observation of fluorescence from body tissue by irradiating the body tissue with excitation light (autofluorescence observation), acquisition of a fluorescence image by locally injecting a reagent such as indocyanine green (ICG) into body tissue and irradiating the body tissue with excitation light corresponding to the fluorescence wavelength of the reagent, and the like. The light source device 11203 can be configured to be able to supply narrowband light and/or excitation light suitable for such special light observation.

Figure 59:
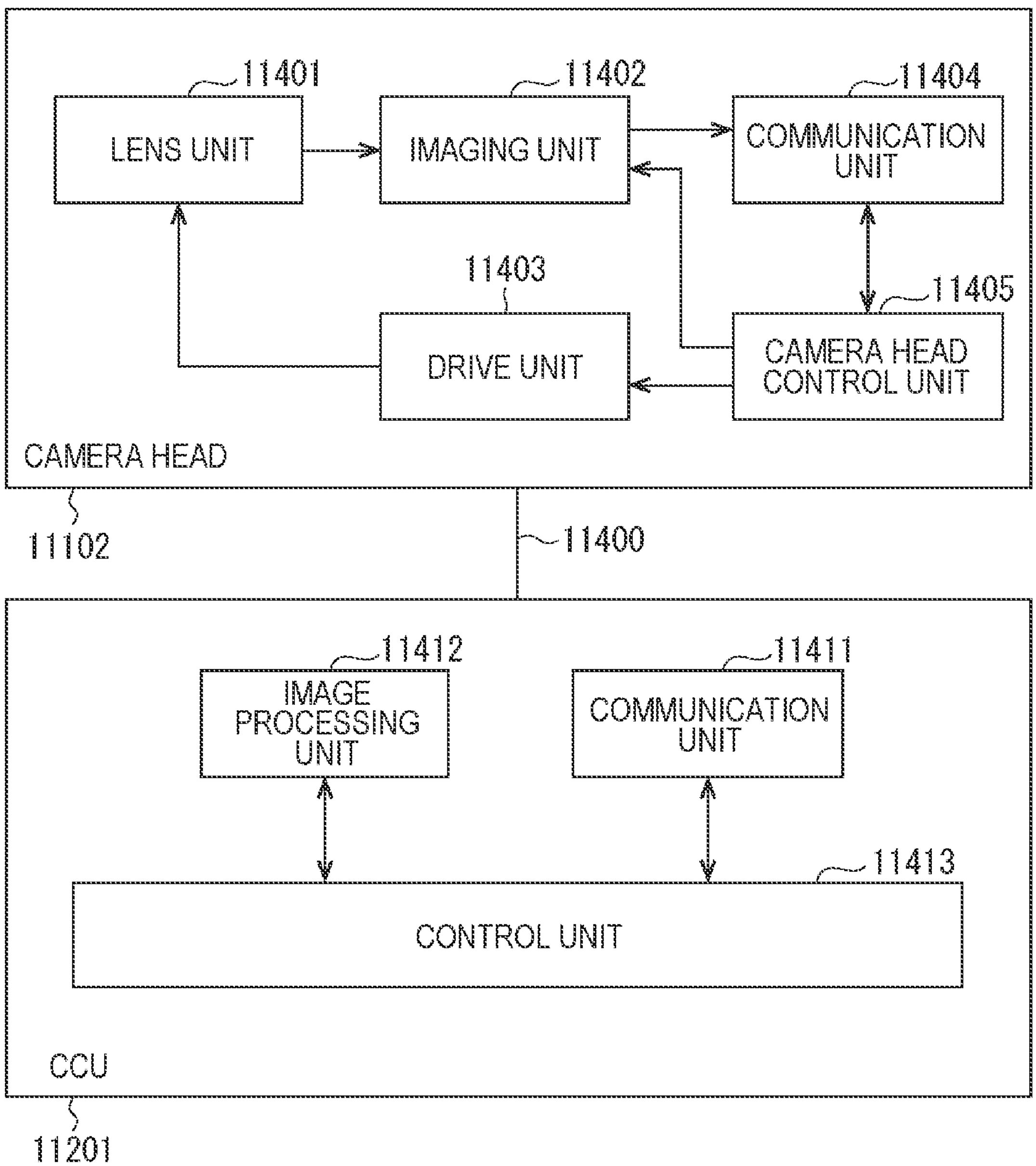
FIG. 59 is a block diagram illustrating an example of a functional configuration of a camera head and a CCU.

FIG. 59 is a block diagram illustrating an example of a functional configuration of the camera head 11102 and the CCU 11201 illustrated in FIG. 58.

The camera head 11102 includes a lens unit 11401, an imaging unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are communicably connected to each other by a transmission cable 11400.

The lens unit 11401 is an optical system provided at a portion connected to the lens tube 11101. Observation light taken in from the distal end of the lens tube 11101 is guided to the camera head 11102 and enters the lens unit 11401. The lens unit 11401 includes a combination of a plurality of lenses including a zoom lens and a focus lens.

The imaging unit 11402 may include a single imaging device (be of a so-called single plate type), or may include a plurality of imaging devices (be of a so-called multi-plate type). In a case where the imaging unit 11402 is of the multi-plate type, for example, image signals corresponding one-to-one to RGB may be generated by imaging devices, and they may be combined to obtain a color image. Alternatively, the imaging unit 11402 may include a pair of imaging devices for acquiring right-eye and left-eye image signals corresponding to a 3D (dimensional) display, individually. By performing 3D display, the operator 11131 can more accurately grasp the depth of living tissue at a surgical site. Note that in a case where the imaging unit 11402 is of the multi-plate type, a plurality of lens units 11401 may be provided for the corresponding imaging devices.

Furthermore, the imaging unit 11402 may not necessarily be provided in the camera head 11102. For example, the imaging unit 11402 may be provided inside the lens tube 11101 directly behind the objective lens.

The drive unit 11403 includes an actuator, and moves the zoom lens and the focus lens of the lens unit 11401 by a predetermined distance along the optical axis under the control of the camera head control unit 11405. With this, the magnification and focus of an image captured by the imaging unit 11402 can be adjusted as appropriate.

The communication unit 11404 includes a communication device for transmitting and receiving various types of information to and from the CCU 11201. The communication unit 11404 transmits an image signal obtained from the imaging unit 11402 as RAW data to the CCU 11201 via the transmission cable 11400.

Furthermore, the communication unit 11404 receives a control signal for controlling the drive of the camera head 11102 from the CCU 11201, and provides the control signal to the camera head control unit 11405. The control signal includes, for example, information regarding imaging conditions such as information specifying the frame rate of captured images, information specifying the exposure value at the time of imaging, and/or information specifying the magnification and focus of captured images.

Note that the imaging conditions such as the frame rate, the exposure value, the magnification, and the focus described above may be appropriately specified by the user, or may be automatically set by the control unit 11413 of the CCU 11201 on the basis of an acquired image signal. In the latter case, so-called an auto exposure (AE) function, an auto focus (AF) function, and an auto white balance (AWB) function are mounted on the endoscope 11100.

The camera head control unit 11405 controls the drive of the camera head 11102 on the basis of a control signal from the CCU 11201 received via the communication unit 11404.

The communication unit 11411 includes a communication device for transmitting and receiving various types of information to and from the camera head 11102. The communication unit 11411 receives an image signal transmitted from the camera head 11102 via the transmission cable 11400.

Furthermore, the communication unit 11411 transmits a control signal for controlling the drive of the camera head 11102 to the camera head 11102. The image signal and the control signal can be transmitted by electrical communication, optical communication, or the like.

The image processing unit 11412 performs various types of image processing on an image signal that is RAW data transmitted from the camera head 11102.

The control unit 11413 performs various types of control for imaging of a surgical site or the like by the endoscope 11100 and display of a captured image obtained by imaging of a surgical site or the like. For example, the control unit 11413 generates a control signal for controlling the drive of the camera head 11102.

Furthermore, the control unit 11413 causes the display device 11202 to display a captured image showing a surgical site or the like, on the basis of an image signal subjected to image processing by the image processing unit 11412. At this time, the control unit 11413 may recognize various objects in the captured image using various image recognition techniques. For example, by detecting the shape of the edge, the color, or the like of an object included in a captured image, the control unit 11413 can recognize a surgical instrument such as forceps, a specific living body part, bleeding, mist when the energy treatment instrument 11112 is used, and so on. When causing the display device 11202 to display a captured image, the control unit 11413 may superimpose various types of surgery support information on an image of the surgical site for display, using the recognition results. By the surgery support information being superimposed and displayed, and presented to the operator 11131, the load of the operator 11131 can be reduced, and the operator 11131 can reliably proceed with the surgery.

The transmission cable 11400 that connects the camera head 11102 and the CCU 11201 is an electric signal cable for electric signal communication, an optical fiber for optical communication, or a composite cable for them.

Here, in the illustrated example, communication is performed by wire using the transmission cable 11400, but communication between the camera head 11102 and the CCU 11201 may be performed by radio.

<Example of Application to Mobile Object>

The technology according to the present disclosure (the present technology) can be applied to various products. For example, the technology according to the present disclosure may be implemented as an apparatus mounted on any type of mobile object such as an automobile, an electric vehicle, a hybrid electric vehicle, a motorcycle, a bicycle, personal mobility, an airplane, a drone, a ship, or a robot.

Figure 60:
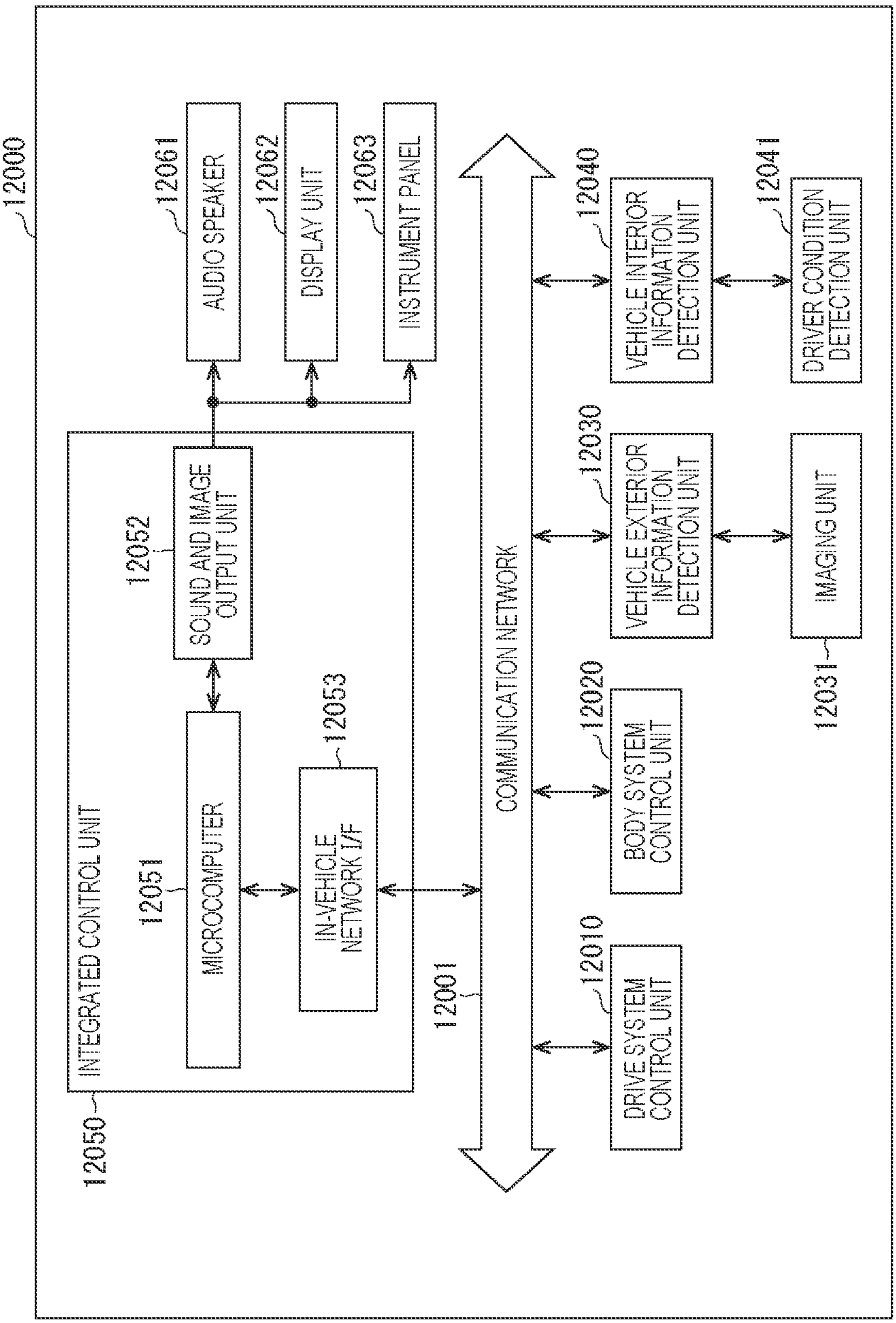
FIG. 60 is a block diagram illustrating an example of a schematic configuration of a vehicle control system.

FIG. 60 is a block diagram illustrating a schematic configuration example of a vehicle control system that is an example of a mobile object control system to which the technology according to the present disclosure can be applied.

A vehicle control system 12000 includes a plurality of electronic control units connected via a communication network 12001. In the example illustrated in FIG. 60, the vehicle control system 12000 includes a drive system control unit 12010, a body system control unit 12020, a vehicle exterior information detection unit 12030, a vehicle interior information detection unit 12040, and an integrated control unit 12050. Furthermore, as a functional configuration of the integrated control unit 12050, a microcomputer 12051, a sound and image output unit 12052, and an in-vehicle network interface (I/F) 12053 are illustrated.

The drive system control unit 12010 controls the operation of apparatuses related to the drive system of the vehicle, according to various programs. For example, the drive system control unit 12010 functions as a control device for a driving force generation apparatus for generating a driving force of the vehicle such as an internal combustion engine or a drive motor, a driving force transmission mechanism for transmitting the driving force to wheels, a steering mechanism for adjusting the steering angle of the vehicle, a braking device for generating a vehicle braking force, etc.

The body system control unit 12020 controls the operation of various apparatuses mounted on the vehicle body, according to various programs. For example, the body system control unit 12020 functions as a control device for a keyless entry system, a smart key system, power window devices, or various lamps including headlamps, back lamps, brake lamps, indicators, and fog lamps. In this case, the body system control unit 12020 can receive the input of radio waves transmitted from a portable device that substitutes for a key or signals from various switches. The body system control unit 12020 receives the input of these radio waves or signals, and controls door lock devices, the power window devices, the lamps, etc. of the vehicle.

The vehicle exterior information detection unit 12030 detects information regarding the exterior of the vehicle equipped with the vehicle control system 12000. For example, an imaging unit 12031 is connected to the vehicle exterior information detection unit 12030. The vehicle exterior information detection unit 12030 causes the imaging unit 12031 to capture an image outside the vehicle and receives the captured image. The vehicle exterior information detection unit 12030 may perform object detection processing or distance detection processing on a person, a vehicle, an obstacle, a sign, characters on a road surface, or the like, on the basis of the received image.

The imaging unit 12031 is an optical sensor that receives light and outputs an electric signal corresponding to the amount of the received light. The imaging unit 12031 may output an electric signal as an image, or may output it as distance measurement information. Furthermore, light received by the imaging unit 12031 may be visible light, or may be invisible light such as infrared rays.

The vehicle interior information detection unit 12040 detects information of the vehicle interior. For example, a driver condition detection unit 12041 that detects a driver's conditions is connected to the vehicle interior information detection unit 12040. The driver condition detection unit 12041 includes, for example, a camera that images the driver. The vehicle interior information detection unit 12040 may calculate the degree of fatigue or the degree of concentration of the driver, or may determine whether the driver is dozing, on the basis of detected information input from the driver condition detection unit 12041.

The microcomputer 12051 can calculate a control target value for the driving force generation apparatus, the steering mechanism, or the braking device on the basis of vehicle interior or exterior information acquired by the vehicle exterior information detection unit 12030 or the vehicle interior information detection unit 12040, and output a control command to the drive system control unit 12010. For example, the microcomputer 12051 can perform cooperative control for the purpose of implementing the functions of an advanced driver assistance system (ADAS) including vehicle collision avoidance or impact mitigation, following driving based on inter-vehicle distance, vehicle speed-maintaining driving, vehicle collision warning, vehicle lane departure warning, and so on.

Furthermore, the microcomputer 12051 can perform cooperative control for the purpose of automatic driving for autonomous travelling without a driver's operation, by controlling the driving force generation apparatus, the steering mechanism, the braking device, or others, on the basis of information around the vehicle acquired by the vehicle exterior information detection unit 12030 or the vehicle interior information detection unit 12040.

Moreover, the microcomputer 12051 can output a control command to the body system control unit 12030 on the basis of vehicle exterior information acquired by the vehicle exterior information detection unit 12030. For example, the microcomputer 12051 can perform cooperative control for the purpose of preventing glare by controlling the headlamps according to the position of a preceding vehicle or an oncoming vehicle detected by the vehicle exterior information detection unit 12030, switching high beam to low beam, or the like.

The sound/image output unit 12052 transmits an output signal of at least one of a sound or an image to an output device that can visually or auditorily notify a vehicle occupant or the outside of the vehicle of information. In the example of FIG. 60, as the output device, an audio speaker 12061, a display unit 12062, and an instrument panel 12063 are illustrated. The display unit 12062 may include at least one of an on-board display or a head-up display, for example.

Figure 61:
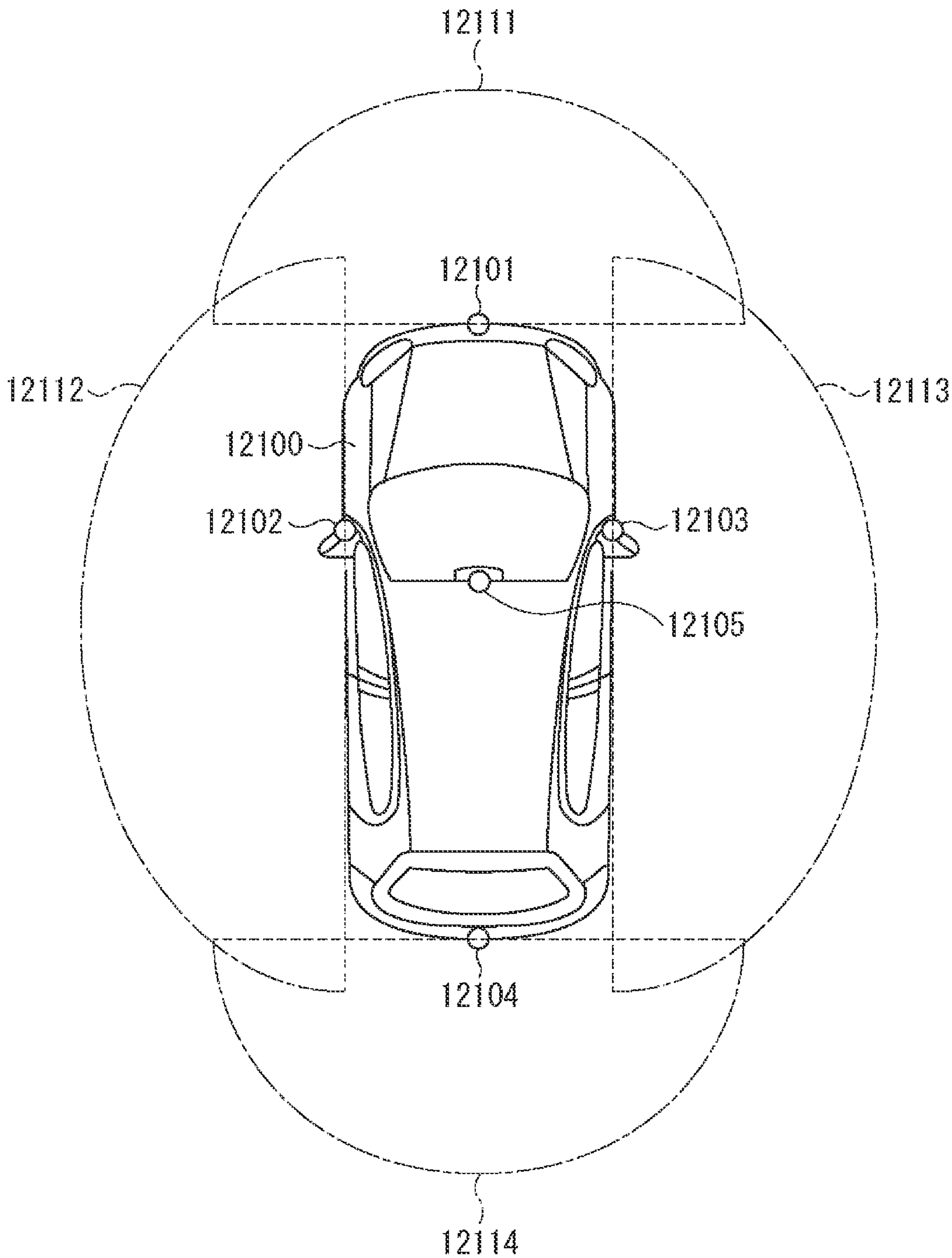
FIG. 61 is an explanatory diagram illustrating an example of installation positions of a vehicle exterior information detection unit and imaging units.

FIG. 61 is a diagram illustrating an example of the installation position of the imaging unit 12031.

In FIG. 61, as the imaging unit 12031, imaging units 12101, 12102, 12103, 12104, and 12105 are included.

The imaging units 12101, 12102, 12103, 12104, and 12105 are provided, for example, at positions such as the front nose, the side mirrors, the rear bumper or the back door, and an upper portion of the windshield in the vehicle compartment of the vehicle 12100. The imaging unit 12101 provided at the front nose and the imaging unit 12105 provided at the upper portion of the windshield in the vehicle compartment mainly acquire images of the front of the vehicle 12100. The imaging units 12102 and 12103 provided at the side mirrors mainly acquire images of the sides of the vehicle 12100. The imaging unit 12104 provided at the rear bumper or the back door mainly acquires images of the rear of the vehicle 12100. The imaging unit 12105 provided at the upper portion of the windshield in the vehicle interior is mainly used to detect preceding vehicles, pedestrians, obstacles, traffic lights, traffic signs, lanes, etc.

Note that FIG. 61 illustrates an example of imaging ranges of the imaging units 12101 to 12104. An imaging range 12111 indicates the imaging range of the imaging unit 12101 provided at the front nose, imaging ranges 12112 and 12113 indicate the imaging ranges of the imaging units 12102 and 12103 provided at the side mirrors, respectively, and an imaging range 12114 indicates the imaging range of the imaging unit 12104 provided at the rear bumper or the back door. For example, by superimposing image data captured by the imaging units 12101 to 12104 on each other, an overhead image of the vehicle 12100 viewed from above is obtained.

At least one of the imaging units 12101 to 12104 may have a function of acquiring distance information. For example, at least one of the imaging units 12101 to 12104 may be a stereo camera including a plurality of imaging devices, or may be an imaging device including pixels for phase difference detection.

For example, the microcomputer 12051 can determine distances to three-dimensional objects in the imaging ranges 12111 to 12114, and temporal changes in the distances (relative speeds to the vehicle 12100), on the basis of distance information obtained from the imaging units 12101 to 12104, thereby extracting, as a preceding vehicle, especially the nearest three-dimensional object located on the traveling path of the vehicle 12100 which is a three-dimensional object traveling at a predetermined speed (e.g., 0 km/h or higher) in almost the same direction as the vehicle 12100. Furthermore, the microcomputer 12051 can perform automatic brake control (including following stop control), automatic acceleration control (including following start control), and the like, setting an inter-vehicle distance to be provided in advance in front of a preceding vehicle. Thus, cooperative control for the purpose of autonomous driving for autonomous traveling without a driver's operation or the like can be performed.

For example, the microcomputer 12051 can extract three-dimensional object data regarding three-dimensional objects, classifying them into a two-wheel vehicle, an ordinary vehicle, a large vehicle, a pedestrian, and another three-dimensional object such as a power pole, on the basis of distance information obtained from the imaging units 12101 to 12104, for use in automatic avoidance of obstacles. For example, for obstacles around the vehicle 12100, the microcomputer 12051 distinguishes between obstacles that can be visually identified by the driver of the vehicle 12100 and obstacles that are difficult to visually identify. Then, the microcomputer 12051 determines a collision risk indicating the degree of danger of collision with each obstacle. In a situation where the collision risk is equal to or higher than a set value and there is a possibility of collision, the microcomputer 12051 can perform driving assistance for collision avoidance by outputting a warning to the driver via the audio speaker 12061 or the display unit 12062, or performing forced deceleration or avoidance steering via the drive system control unit 12010.

At least one of the imaging units 12101 to 12104 may be an infrared camera that detects infrared rays. For example, the microcomputer 12051 can recognize a pedestrian by determining whether or not a pedestrian is present in captured images of the imaging units 12101 to 12104. The recognition of a pedestrian is performed, for example, by a procedure of extracting feature points in captured images of the imaging units 12101 to 12104 as infrared cameras, and a procedure of performing pattern matching on a series of feature points indicating the outline of an object to determine whether or not the object is a pedestrian. When the microcomputer 12051 determines that a pedestrian is present in captured images of the imaging units 12101 to 12104 and recognizes the pedestrian, the sound/image output unit 12052 controls the display unit 12062 to superimpose and display a rectangular outline for enhancement on the recognized pedestrian. Alternatively, the sound/image output unit 12052 may control the display unit 12062 so as to display an icon or the like indicating the pedestrian at a desired position.

In the present description, a system represents a whole apparatus including a plurality of devices.

Note that the effects described in the present description are merely examples and nonlimiting, and other effects may be included.

Note that embodiments of the present technology are not limited to the above-described embodiments, and various changes may be made without departing from the scope of the present technology.

Note that the present technology can also have the following configurations.

(1)

A solid-state imaging apparatus including:

a substrate;

a plurality of photoelectric conversion regions provided in the substrate;

a color filter provided on an upper side of the photoelectric conversion regions;

a trench provided through the substrate and provided between the photoelectric conversion regions; and a recessed region including a plurality of recesses provided on a light-receiving surface side of the substrate above the photoelectric conversion regions, in which the color filter over adjacent two of the photoelectric conversion regions is of the same color.

(2)

The solid-state imaging apparatus according to (1) above, in which the number of the recesses of the recessed region is larger at a high image height than at an image height center.

(3)

The solid-state imaging apparatus according to (1) or (2) above, in which the recessed region is formed above one of the adjacent two of the photoelectric conversion regions.

(4)

The solid-state imaging apparatus according to any one of (1) to (3) above, in which the recessed region is formed above the photoelectric conversion regions over which the color filter of a second color is placed adjacent to the photoelectric conversion regions over which the color filter of a first color is placed.

(5)

A solid-state imaging apparatus including:

a substrate;

a plurality of photoelectric conversion regions provided in the substrate;

a color filter provided on an upper side of the photoelectric conversion regions;

an on-chip lens provided on an upper side of the color filter;

a trench provided through the substrate, the trench surrounding four of the photoelectric conversion regions; and a recessed region including a plurality of recesses provided on a light-receiving surface side of the substrate above the photoelectric conversion regions, in which the color filter over the four of the photoelectric conversion regions is of the same color, and the on-chip lens is provided over the four of the photoelectric conversion regions.

(6)

The solid-state imaging apparatus according to (5) above, in which the number of the recesses of the recessed region is larger at a high image height than at an image height center.

(7)

The solid-state imaging apparatus according to (5) or (6) above, in which the recessed region is formed above at least one of the four of the photoelectric conversion regions.

(8)

The solid-state imaging apparatus according to any one of (5) to (7) above, in which the number of the recesses of the recessed region varies depending on a color of the color filter.

(9)

A solid-state imaging apparatus including:

a substrate;

a plurality of photoelectric conversion regions provided in the substrate;

a color filter provided on an upper side of the photoelectric conversion regions;

an on-chip lens provided on an upper side of the color filter;

a trench provided through the substrate, the trench surrounding adjacent two of the photoelectric conversion regions; and a recessed region including a plurality of recesses provided on a light-receiving surface side of the substrate above the photoelectric conversion regions, in which the color filter over the two of the photoelectric conversion regions is of the same color, and the on-chip lens is provided over the two of the photoelectric conversion regions.

(10)

The solid-state imaging apparatus according to (9) above, in which the number of the recesses of the recessed region is smaller at a high image height than at an image height center.

(11)

The solid-state imaging apparatus according to (9) or (10) above, in which the size of the recesses of the recessed region is larger at a high image height than at an image height center.

(12)

The solid-state imaging apparatus according to any one of (9) to (11) above, in which the recessed region is formed above at least one of the two of the photoelectric conversion regions.

(13)

The solid-state imaging apparatus according to any one of (9) to (12) above, in which a P-type or N-type region is provided between the two of the photoelectric conversion regions.

(14)

The solid-state imaging apparatus according to any one of (9) to (13) above, in which a trench is provided between the two of the photoelectric conversion regions.

(15)

The solid-state imaging apparatus according to any one of (9) to (14) above, in which the recessed region is not formed in a second pixel at which the on-chip lens is provided over one of the photoelectric conversion regions, the second pixel being adjacent to a first pixel at which the on-chip lens is provided over the two of the photoelectric conversion regions.

(16)

The solid-state imaging apparatus according to (15) above, in which the recessed region is not formed in the second pixel located in a light incident direction.

(17)

A solid-state imaging apparatus including:

a substrate;

a plurality of photoelectric conversion regions provided in the substrate;

a color filter provided on an upper side of the photoelectric conversion regions;

a trench provided through the substrate and provided between the photoelectric conversion regions;

a metal film covering almost a half region of the photoelectric conversion regions on an upper side of the photoelectric conversion regions; and a recessed region including a plurality of recesses provided on a light-receiving surface side of the substrate above the photoelectric conversion regions.

(18)

The solid-state imaging apparatus according to (17) above, in which the number of the recesses of the recessed region is larger at a high image height than at an image height center.

(19)

The solid-state imaging apparatus according to (17) or (18) above, in which the recessed region is provided only in either a first pixel in which the metal film covers a left half of the photoelectric conversion regions or a second pixel in which the metal film covers a right half of the photoelectric conversion regions, depending on arrangement positions in a pixel array.

(20)

The solid-state imaging apparatus according to any one of (17) to (19) above, in which the number of the recesses of the recessed region above the adjacent photoelectric conversion regions where the photoelectric conversion regions are not covered by the metal film is smaller than the number of the recesses of the recessed region provided above another photoelectric conversion region.

REFERENCE SIGNS LIST

1 Solid-state imaging apparatus
2 Pixel
3 Pixel array
4 Vertical drive circuit
5 Column signal processing circuit
6 Horizontal drive circuit
7 Output circuit
8 Control circuit
9 Vertical signal line
10 Pixel drive wire
11 Horizontal signal line
12 Semiconductor substrate
13 Input-output terminal
41 Semiconductor region
42 Semiconductor region
46 Transparent insulating film
48 Recessed region
49 Light-shielding film
51 Color filter layer
52 On-chip lens
53 Flat portion
54 Inter-pixel separation portion
55 Insulator
56 Light-shielding object
61 Antireflection film
62 Hafnium oxide film

63 Aluminum oxide film
64 Silicon oxide film
101 Intra-pixel separation portion
102 Intra-pixel separation portion

The invention claimed is:

1. A solid-state imaging apparatus comprising:
a substrate;
a plurality of photoelectric conversion regions provided in the substrate;
a color filter provided on an upper side of the photoelectric conversion regions;
a trench provided through the substrate and provided between the photoelectric conversion regions; and
a recessed region including a plurality of recesses provided on a light-receiving surface side of the substrate above the photoelectric conversion regions,
wherein the color filter over adjacent two of the photoelectric conversion regions is of the same color.

2. The solid-state imaging apparatus according to claim 1, wherein
the number of the recesses of the recessed region is larger at a high image height than at an image height center.

3. The solid-state imaging apparatus according to claim 1, wherein
the recessed region is formed above one of the adjacent two of the photoelectric conversion regions.

4. The solid-state imaging apparatus according to claim 1, wherein
the recessed region is formed above the photoelectric conversion regions over which the color filter of a second color is placed adjacent to the photoelectric conversion regions over which the color filter of a first color is placed.

5. A solid-state imaging apparatus comprising:
a substrate;
a plurality of photoelectric conversion regions provided in the substrate;
a color filter provided on an upper side of the photoelectric conversion regions;
an on-chip lens provided on an upper side of the color filter;
a trench provided through the substrate, the trench surrounding four of the photoelectric conversion regions; and
a recessed region including a plurality of recesses provided on a light-receiving surface side of the substrate above the photoelectric conversion regions,
wherein the color filter over the four of the photoelectric conversion regions is of the same color, and
the on-chip lens is provided over the four of the photoelectric conversion regions.

6. The solid-state imaging apparatus according to claim 5, wherein
the number of the recesses of the recessed region is larger at a high image height than at an image height center.

7. The solid-state imaging apparatus according to claim 5, wherein
the recessed region is formed above at least one of the four of the photoelectric conversion regions.

8. The solid-state imaging apparatus according to claim 5, wherein
the number of the recesses of the recessed region varies depending on a color of the color filter.

9. A solid-state imaging apparatus comprising:
a substrate;
a plurality of photoelectric conversion regions provided in the substrate;

a color filter provided on an upper side of the photoelectric conversion regions;
an on-chip lens provided on an upper side of the color filter;
a trench provided through the substrate, the trench surrounding adjacent two of the photoelectric conversion regions; and
a recessed region including a plurality of recesses provided on a light-receiving surface side of the substrate above the photoelectric conversion regions,
wherein the color filter over the two of the photoelectric conversion regions is of the same color, and
the on-chip lens is provided over the two of the photoelectric conversion regions.

10. The solid-state imaging apparatus according to claim 9, wherein
the number of the recesses of the recessed region is smaller at a high image height than at an image height center.

11. The solid-state imaging apparatus according to claim 9, wherein
the size of the recesses of the recessed region is larger at a high image height than at an image height center.

12. The solid-state imaging apparatus according to claim 9, wherein
the recessed region is formed above at least one of the two of the photoelectric conversion regions.

13. The solid-state imaging apparatus according to claim 9, wherein
a P-type or N-type region is provided between the two of the photoelectric conversion regions.

14. The solid-state imaging apparatus according to claim 9, wherein
a trench is provided between the two of the photoelectric conversion regions.

15. The solid-state imaging apparatus according to claim 9, wherein
the recessed region is not formed in a second pixel at which the on-chip lens is provided over one of the photoelectric conversion regions, the second pixel being adjacent to a first pixel at which the on-chip lens is provided over the two of the photoelectric conversion regions.

16. The solid-state imaging apparatus according to claim 15, wherein
the recessed region is not formed in the second pixel located in a light incident direction.

17. A solid-state imaging apparatus comprising:
a substrate;
a plurality of photoelectric conversion regions provided in the substrate;
a color filter provided on an upper side of the photoelectric conversion regions;
a trench provided through the substrate and provided between the photoelectric conversion regions;
a metal film covering almost a half region of the photoelectric conversion regions on an upper side of the photoelectric conversion regions; and
a recessed region including a plurality of recesses provided on a light-receiving surface side of the substrate above the photoelectric conversion regions.

18. The solid-state imaging apparatus according to claim 17, wherein
the number of the recesses of the recessed region is larger at a high image height than at an image height center.

19. The solid-state imaging apparatus according to claim 17, wherein the recessed region is provided only in either a first pixel in which the metal film covers a left half of the photoelectric conversion regions or a second pixel in which the metal film covers a right half of the photoelectric conversion regions, depending on arrangement positions in a pixel array.

20. The solid-state imaging apparatus according to claim 17, wherein the number of the recesses of the recessed region above the adjacent photoelectric conversion regions where the photoelectric conversion regions are not covered by the metal film is smaller than the number of the recesses of the recessed region provided above another photoelectric conversion region.

* * * * *